United States Patent [19]

Stowers et al.

[11] Patent Number: 5,633,597
[45] Date of Patent: May 27, 1997

[54] MICRO INTERFACE TECHNOLOGY SYSTEM UTILIZING SLIDE ENGAGEMENT MECHANISM

[75] Inventors: Jeffrey P. Stowers, Stanton; Paul D. Blackard, Waynesborok; Randall C. Garman, Waynesboro, all of Va.

[73] Assignee: Virginia Panel Corporation, Waynesboro, Va.

[21] Appl. No.: 344,575

[22] Filed: Nov. 18, 1994

Related U.S. Application Data

[63] Continuation-in-part of Ser. No. 848,894, Mar. 10, 1992, Pat. No. 5,227,718, which is a continuation-in-part of Ser. No. 49,395, Apr. 21, 1993, Pat. No. 5,420,514, and a continuation-in-part of Ser. No. 320,514, Nov. 10, 1994, Pat. No. 5,576,631.

[51] Int. Cl.$^6$ ..................................................... G01R 31/02
[52] U.S. Cl. ........................................... 324/761; 324/755
[58] Field of Search ............................ 324/72.5, 750, 324/754, 755, 761, 765; 439/55, 68, 482, 259, 342; 248/206.1, 206.2, 222.1, 231.4

[56] References Cited

U.S. PATENT DOCUMENTS

| | | | |
|---|---|---|---|
| 4,329,005 | 5/1982 | Braginetz et al. | 439/51 |
| 4,560,216 | 12/1985 | Egawa | 324/755 |
| 4,644,269 | 2/1987 | Golder et al. | 324/755 |
| 4,922,191 | 5/1990 | Conover | 324/755 |
| 5,037,321 | 8/1991 | Uratsuji et al. | 439/259 |
| 5,086,269 | 2/1992 | Nobi | 324/760 |
| 5,103,378 | 4/1992 | Stowers et al. | 439/64 |
| 5,123,850 | 6/1992 | Elder et al. | 439/67 |
| 5,167,515 | 12/1992 | Matsuoka et al. | 439/342 |
| 5,176,525 | 1/1993 | Nierescher et al. | 324/755 |
| 5,192,221 | 3/1993 | Matsuoka et al. | 439/342 |
| 5,227,718 | 7/1993 | Stowers et al. | 324/72.5 |
| 5,302,891 | 4/1994 | Wood et al. | 324/765 |
| 5,311,120 | 5/1994 | Bartholomew | 324/754 |
| 5,414,372 | 5/1995 | Levy | 324/765 |
| 5,419,711 | 5/1995 | Noro et al. | 439/259 |

Primary Examiner—Vinh P. Nguyen
Attorney, Agent, or Firm—Lowe, Price, LeBlanc & Becker

[57] ABSTRACT

A connection interface system positions and electrically connects a testing device to a device under test. The testing device exercises and tests the device under test. The connection interface system includes a receiver module electrically connected to the device under test and including receiver electrical connectors. The receiver module includes a top frame and a bottom frame, movable with respect to the top frame and operatively connected thereto. The bottom frame includes at least one receiver module having at least one receiver electrical connector. The receiver module further includes an engagement mechanism movably connected to the bottom frame and to the top frame which either engages or disengages the bottom frame and the top frame in response to an external stimulus to engage or disengage receiver electrical connectors in the bottom frame to external electrical connectors. The connection interface device also includes an integrated test adapter electrically connected to the testing device, coupled to the receiver module and including test electrical connectors which are engaged with the receiver electrical connectors permitting the testing device to exercise and test the device under test.

27 Claims, 41 Drawing Sheets

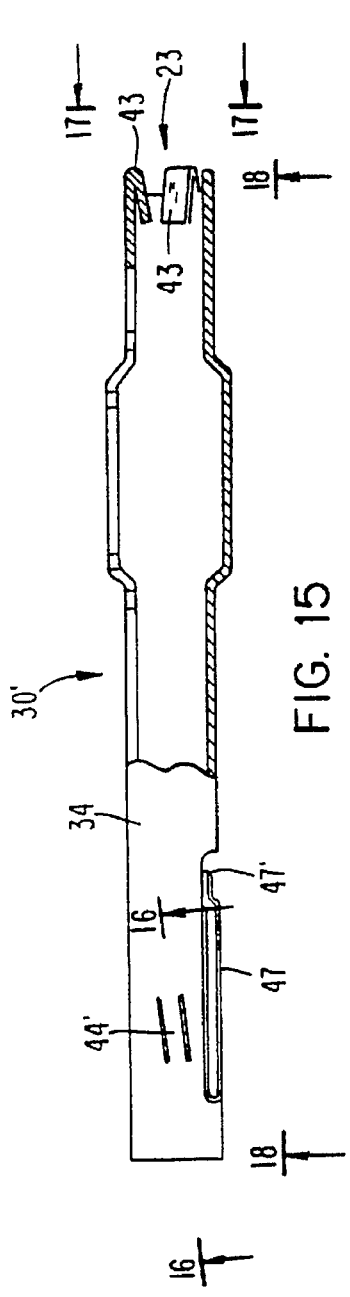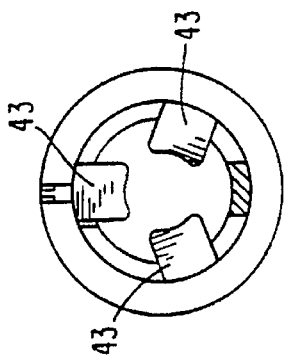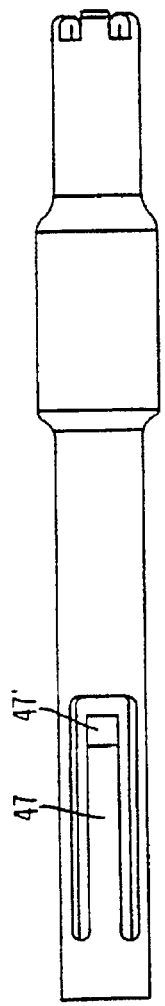

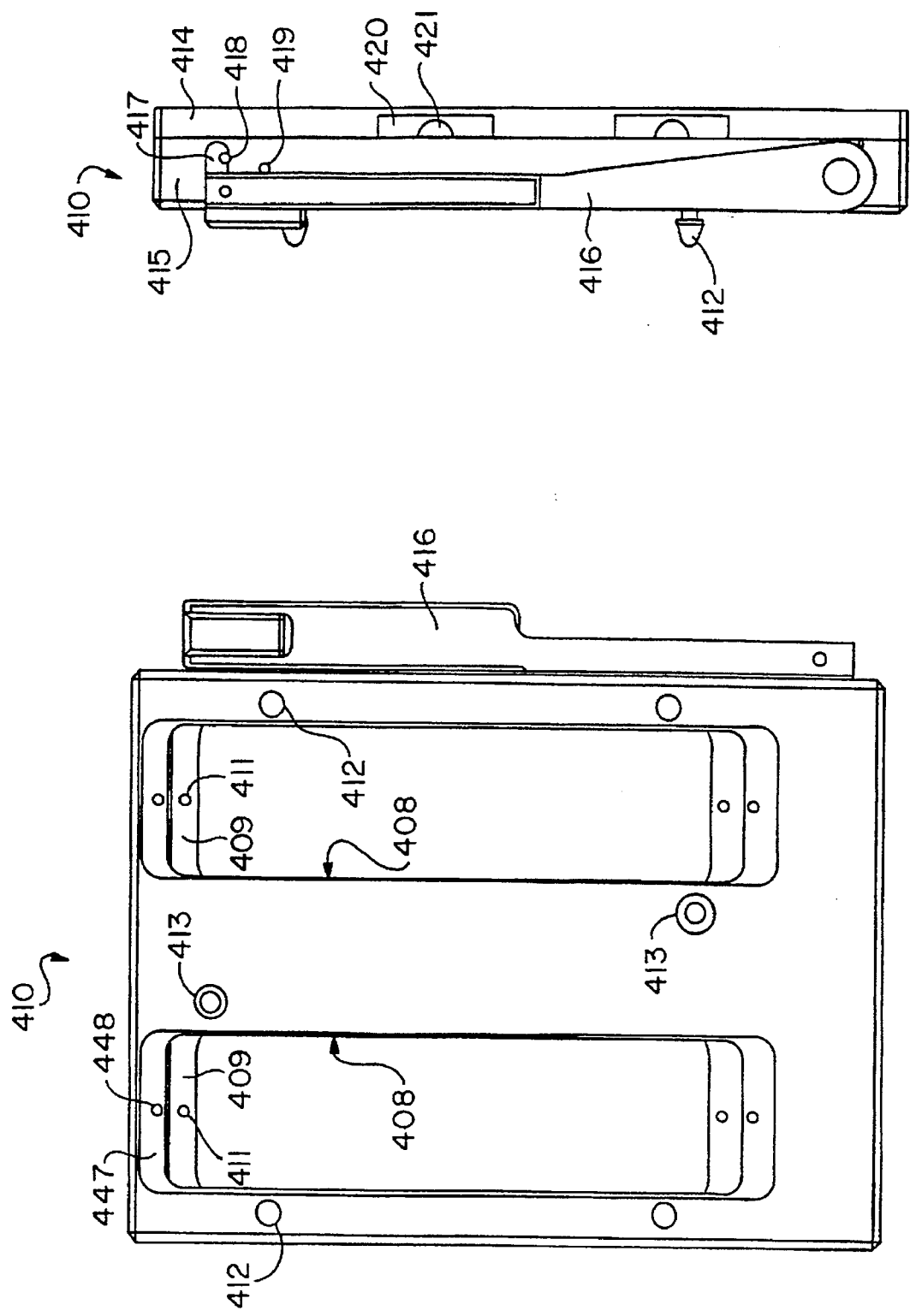

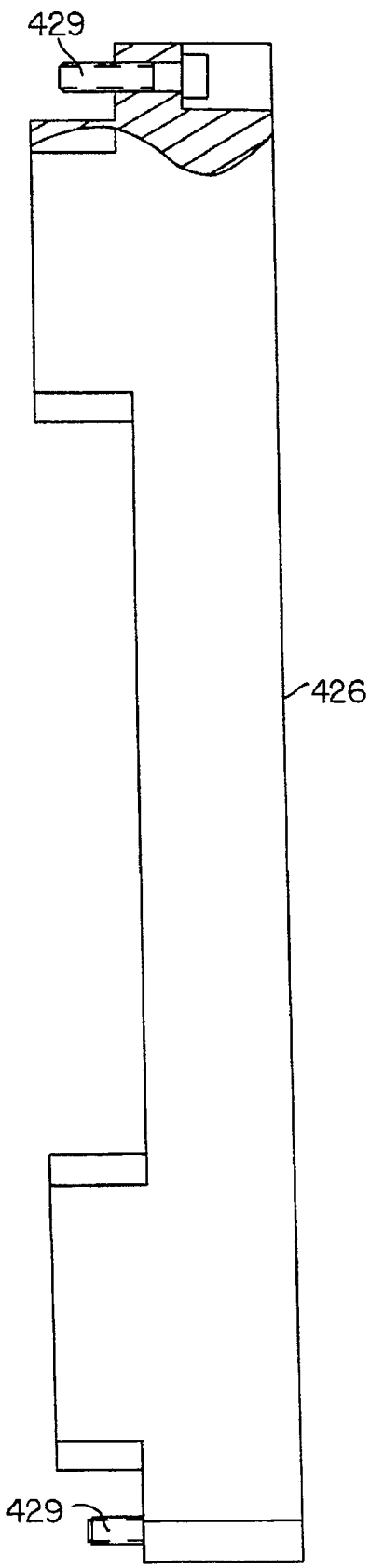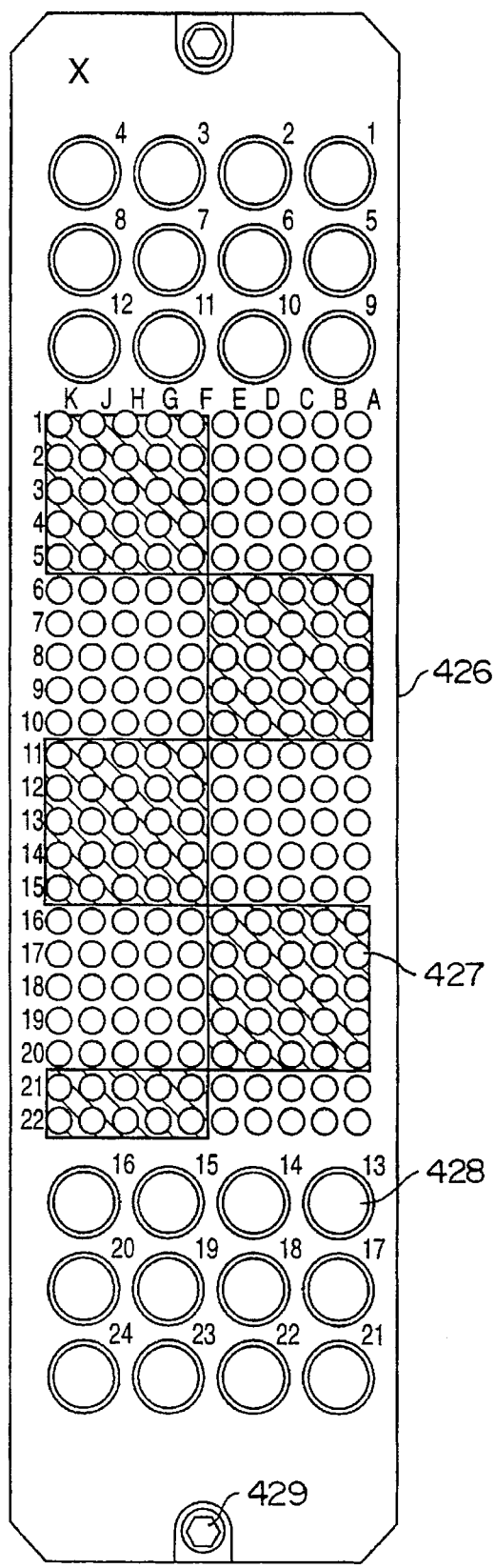
FIG. 35
FIG. 34

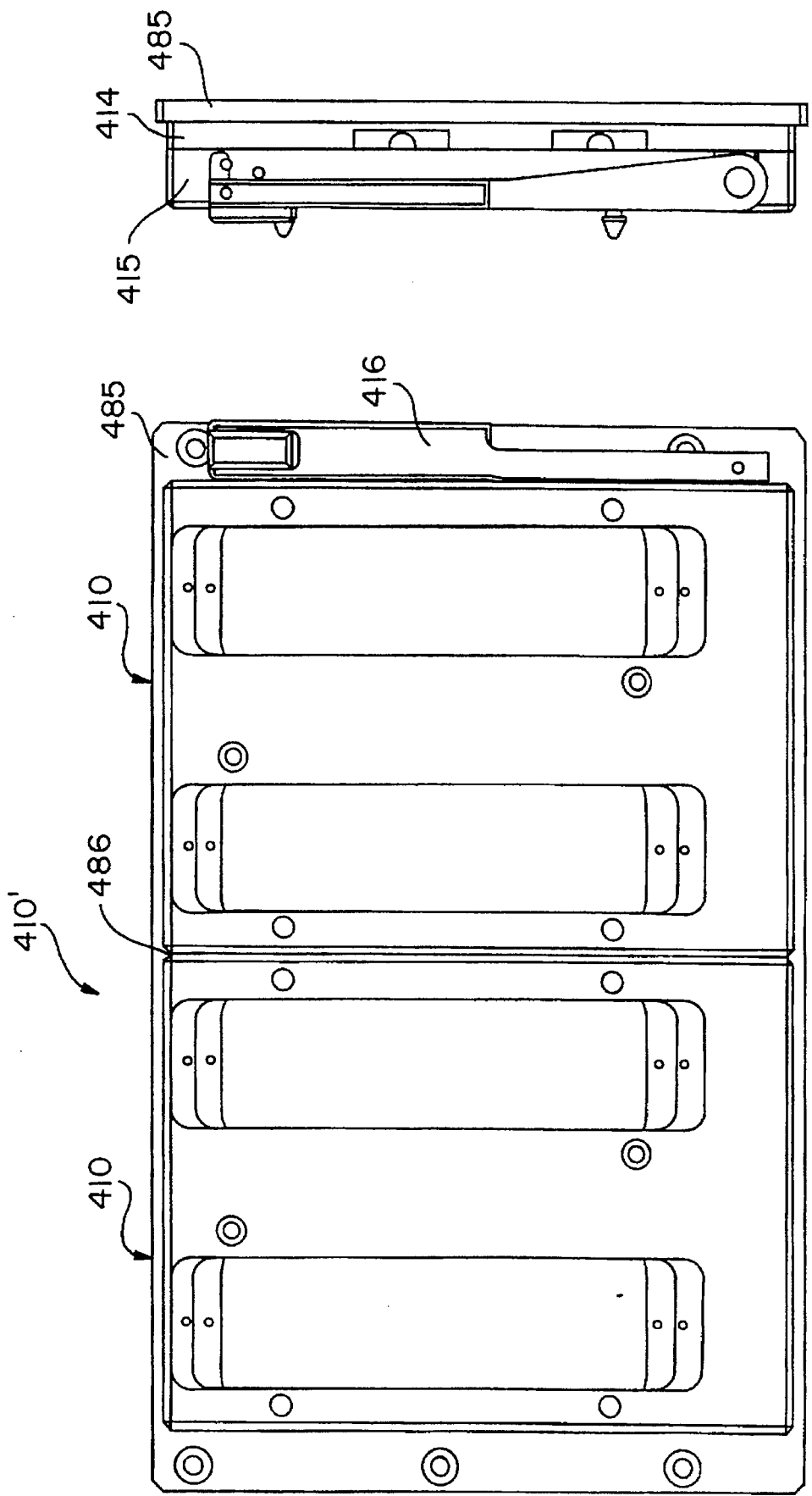

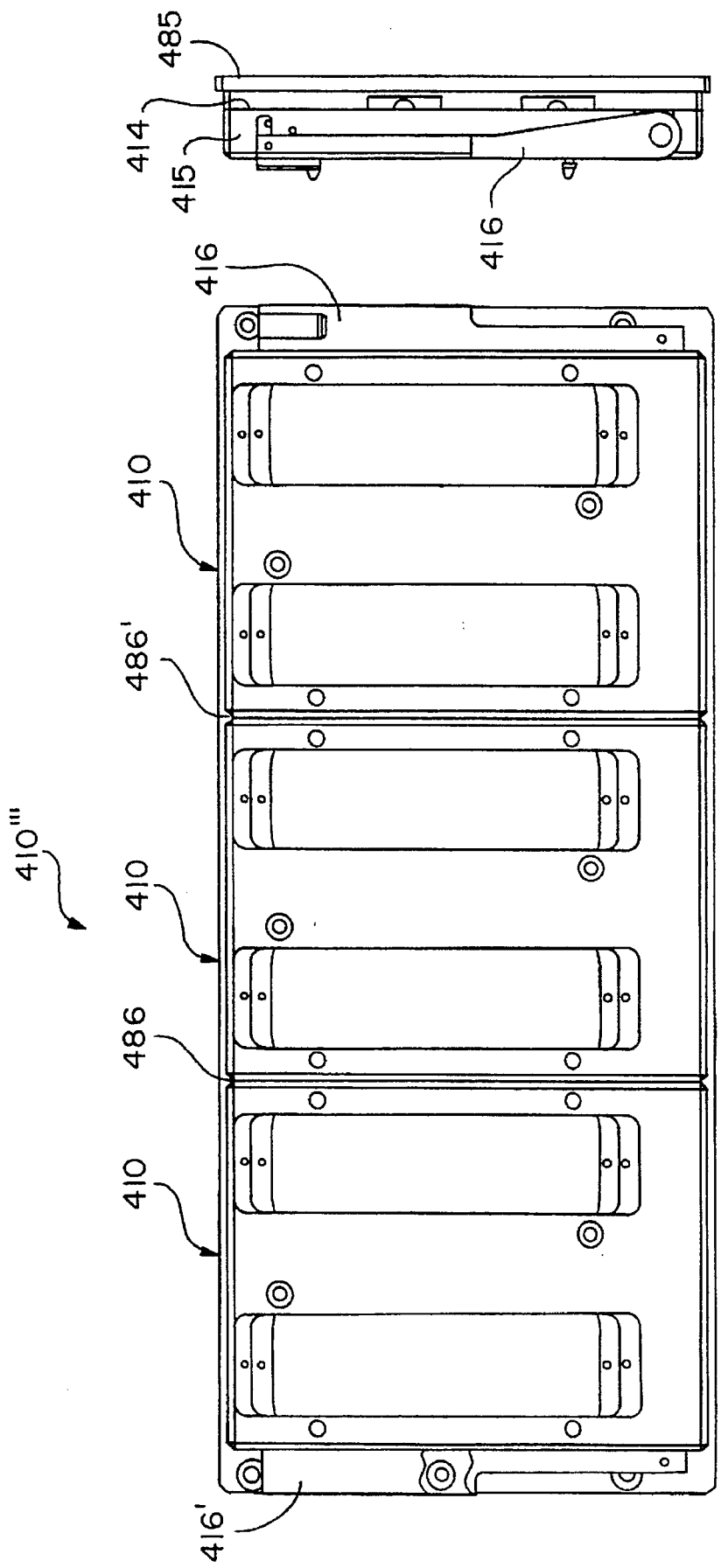

MICRO INTERFACE TECHNOLOGY SYSTEM UTILIZING SLIDE ENGAGEMENT MECHANISM

CROSS REFERENCE TO RELATED APPLICATIONS

This application is a continuation-in-part of patent application Ser. No. 07/848,894, filed Mar. 10, 1992, now U.S. Pat. No. 5,227,718, a continuation-in-part of patent application Ser. No. 08/049,395, filed Apr. 21, 1993 (now U.S. Pat. No. 5,420,514), and a continuation-in-part of patent application Ser. No. 08/320,514, filed Nov. 10, 1994 (now U.S. Pat. No. 5,576,631).

TECHNICAL FIELD

The invention relates broadly to electrical connectors and more particularly to electrical connecters which are utilized in computer interface equipment. Such computer interface equipment requires the frequent placement of interchangeable test adapters (ITA), multiple minute electrical contacts in operative engagement with the coacting electrical contacts of receivers. It is imperative that the receiver contacts an interchange test adaptor contacts engaged with precision to minimize wear and to prevent damaging the delicate and expensive equipment.

BACKGROUND ART

Testing, diagnosis, maintenance and calibration of electronic devices often require supplying test signals to, and receiving signals from, components of a Device Under Test (DUT) or Unit Under Test (UUT). When an electronic device is fabricated on one or more circuit boards, electronic components mounted on the circuit boards may not be accessible for testing using existing circuit board mounted connectors. Therefore, connections to components to be tested are made using external electrical probes applied to the exposed leads of the components and/or to a printed circuit board wiring layer.

Automatic testing of electrical circuits requires simultaneous connection to many circuit test points. The automatic testing equipment simultaneously supplies signals to, and receives signals from, combinations of test points. A conventional test fixture used to electrically probe a circuit card of a DUT includes a "bed of nails" having a platform for supporting the circuit card and an array of single headed spring probes. Each spring probe includes a probe head which makes positive electrical contact with an overlying portion of the circuit board being tested. An opposite end of each probe is connected to test equipment through single point wiring.

A conventional single headed electrical test probe is described by Johnston et al., U.S. Pat. No. 5,032,787 issued Jul. 16, 1991, incorporated herein by reference. The Patent describes a test probe assembly including a barrel having a hollow interior and a plunger which slides axially in the barrel. The plunger has an outer portion extending through an open end of the barrel, terminating in a contact tip outside the barrel for contact with a test point and a hollow, elongated receptacle extending through the barrel. The receptacle has a square or rectangular pilot hole so that an elongated fixed guide member in the barrel extends through the pilot hole. The guide member extends through the interior of the barrel away from the pilot hole and has an outer surface which engages the pilot hole. A spring inside the barrel extends along the guide member and is biased against the internal end of the receptacle inside the barrel.

Axial travel of the Johnston et al. plunger into the barrel is against the spring bias. The outer surface of the guide member engages the correspondingly shaped pilot hole and controls rotational motion of the plunger as it travels along the guide member against the bias of the spring. The guide member is not free to rotate or axially translate through the barrel, i.e., rotate while being depressed in toward the barrel. End 58 of conductive guide member 54 projects out from the end of the barrel to provide an anti-rotational detail for the probe assembly. Cylindrical terminal portion 60 of the end cylindrical section 56 is described as being rigidly affixed to the inside of the barrel. Terminal portion 62 of the guide member projects outside the barrel to provide anti-rotation. Thus, the Johnston et al. probe is useful to connect a dedicated test lead to a single component or conductive layer on one circuit board via rotation of the guide member.

Since testing equipment and other electronic equipment must typically be adapted to varied uses, it is often necessary to reconfigure signal connections and condition signals to interface the equipment to a particular DUT. This can be accomplished by dedicated wiring, patch panels, and/or using appropriate signal routing/conditioning interface equipment in the form of a personality board. A personality board is connected between a testing device and a DUT to properly route and condition signals between the two devices. Thus, a testing device is electrically adapted to a particular DUT by using an appropriate personality board. Substitution of personality boards allows a single testing device to be used with a plurality of DUTs.

The testing device is connected to a personality board which, in turn, is connected to a test fixture holding the DUT using conventional electrical connectors and cabling. Thus, the personality board is used to electrically connect two devices. However, the additional wiring used to connect the personality board can impair signal connectivity and degrade the transmitted signals. The added connectors and cables also increase device cost and require additional mounting space on each circuit board and between circuit boards. Further, the device connectors are subject to misalignment and introduce maintenance and reliability problems. Multiple connectors and cabling also complicate the substitution of personality boards. Further, we have discovered that most prior art probes, such as Johnson et al., only provide one-sided connection where, as in Johnson et al. only the guide member rotates.

We have discovered, however, that a need exists for a connector system providing easy installation and replacement of circuit board mounted devices.

In addition, we have discovered that a need exists for a reconfigurable connector system for interfacing various nodes of an electronic device to a corresponding point of a second electronic device without intervening connectors.

We have further discovered that for more critical testing conditions where the transmitted signals are more susceptible to noise or environmental conditions, there is a need to transmit testing signals with higher accuracy.

We have also discovered that for more complicated testing conditions where many signals are required to be transmitted between the DUT and the testing device via the personality board, there is a need to more effectively and efficiently utilize the limited space to transmit these greater number of testing signals.

In addition, we have discovered that there is a need to provide a connection interface system which utilizes micro interface technology (MIT) to electrically connect a testing device with the device under test.

We have also discovered that there is a need to provide a connection interface system which is relatively inexpensive and light in weight for consistently and precisely connecting a testing device with the device under test.

We have also discovered that there is a need for a connection interface system which utilizes a sliding mechanism to distribute the force and uniformly engages the interchangeable test adapter module with the receiver module for connecting the testing device to the device under test.

We have further discovered the need for a connection interface system where the interchangeable test adapter and receiver modules are first positioned for engagement, and then mechanically and electrically engaged thereafter, providing a smooth, precise and reliable interface.

We have also discovered the need for an engagement mechanism which provides sound structural support for the connection interface system while engaging the interchangeable test adapter and receiver modules.

DISCLOSURE OF THE INVENTION

An object of the invention is to provide a connector and connector system permitting ready installation and replacement of circuit boards requiring frequent changing.

Another object of the invention is to provide a connector and connector system for directly connecting electronic circuitry on opposing parallel circuit cards.

Another object of the invention is to provide a low loss signal path between electronic devices.

A further object of the invention is to provide a universal array of connectors for electrically interfacing a variety of electronic devices.

Another object of the invention is to transmit testing signals with higher accuracy for more critical testing conditions where the transmitted signals are more susceptible to noise or environmental conditions.

Another object of the invention is to more effectively and efficiently utilize the limited space to transmit a greater number of testing signals for more complicated testing conditions where many signals are required to be transmitted between the DUT and the testing device via the personality board.

Another object of the invention to provide a connection interface system which utilizes micro interface technology (MIT) to electrically connect a testing device with the device under test.

Another objection of the invention is to provide a connection interface system which is relatively inexpensive and light in weight for consistently and precisely connecting a testing device with the device under test.

A further object of the invention is to provide a connection interface system which utilizes a sliding mechanism to distribute the force and uniformly engages the interchangeable test adapter module with the receiver module for connecting the testing device to the device under test.

A further object of the invention is to provide a connection interface system where the interchangeable test adapter and receiver modules are first positioned for engagement, and then mechanically and electrically engaged thereafter, providing a smooth, precise and reliable interface.

A further object of the invention is to provide an engagement mechanism which provides sound structural support for the connection interface system while engaging the interchangeable test adapter and receiver modules.

According to one aspect of the invention, a double-headed spring contact probe for loaded board testing includes a barrel having a hollow interior and opposite plungers which slide axially and are free to rotate, in the barrel. The plungers have outer portions which extend through opposite open ends of the barrel, each terminating in a contact tip outside the barrel for contacting a test point on a circuit board. One of the plungers has a hollow receptacle extending into the barrel with a rectangular or notched keyway opening into the receptacle. The other plunger has a twisted guide member extending through the barrel into the keyway of the other plunger whereby axial translation of the plungers relative to each other causes relative rotation thereof. A spring engages opposite shoulder or collar portions of the plungers to bias the plungers outwardly against opposite ends of the barrel. Necked portions of the barrel limit travel of the plungers out from the barrel.

Rotation of the probe ends improve the resultant contact of the probe with the circuit board under test or a companion personality board as the rotating ends sweep oxide off of the contact area. The invention also exhibits improved electrical conductivity between plungers by providing a straight line current path between plungers, conductivity between the plungers provided by engagement of the guide member at the keyway opening. The double-headed construction further accommodates direct Printed Circuit (PC) board to PC board electrical connection.

According to another aspect of the invention, an electrical probe includes a housing having first and second opposite open ends. A first elongate plunger is partially positioned within the housing. A first portion of the first plunger extends out from the housing through the first opening end and terminates in a first electrical contact probe. A second portion of the first elongate plunger is rod-like, and is lengthwise contiguous with the first portion. The second portion is positioned within the housing and includes a bearing surface for transmitting a torque.

A second elongate plunger is likewise partially positioned within the housing. A first portion extends out from the housing through the second open end of the housing and terminates in a second electrical contact probe head. The second portion of the second elongate plunger is tubular, lengthwise contiguous with the first portion, and is positioned within the housing. The second rod-like portion of the first elongate plunger is centrally positioned within the hollow second portion of the second elongate plunger. An aperture within the second portion of the second elongate plunger engages the bearing surface of the first elongate plunger.

A compression spring is positioned within the housing and is positioned to engage the first and second plungers, biasing the plungers outward from the housing. The ends of the housing have restricted apertures for limiting axial travel of the first and second elongate plungers out from the housing.

According to a feature of the invention, one or more spiral channels are formed along a length of the second portion of the first elongate plunger, the bearing surface being formed by one or more walls of one or more channels. The aperture in the second elongate member may comprise a keyway and the second portion of the first elongate plunger may comprise a cylindrical member having a helical channel forming the bearing surface for engaging the keyway. The helical channel may subtend a radial angle of between 90 and 150 degrees over the length of the second portion of the first elongate plunger, an angle of 120 degrees plus or minus five degrees being preferred.

According to still another aspect of the invention, an electrical interface board includes a frame made of an insulating substrate and an array of probe assemblies extending axially through the frame. Each of the probe assemblies includes a housing having first and second opposite open ends, a spring and first and second plungers. The first plunger is partially positioned within the housing and has a first portion extending out from the housing through the first opening end and terminating in a first electrical contact probe. A rod-like second portion of the first plunger is lengthwise contiguous with the first portion and is positioned within the housing. The second portion has a bearing surface for transmitting a torque.

A second plunger is also partially positioned within the housing and includes a first portion extending out from the housing through the second open end, terminating in a second electrical contact probe head. A tubular second portion, lengthwise contiguous with the first portion, is positioned within the housing so that the second portion of the first plunger is positioned within the hollow cavity of the second portion of the second plunger. The second portion of the second plunger has an aperture at a terminal end for engaging the bearing surface of the first elongate plunger. The compression spring is positioned within the housing and engages the first and second elongate plungers, axially biasing the plungers outward from the housing.

In a further improvement or additional embodiment of this invention, the plunger barrel portion is designed for increased electrical contact with the plunger and its spiral groove. Specifically, in this embodiment, the keyway for engaging the plunger channel is disposed at about a 6° angle to the axis thereof so that the keyway will ride in the plunger channel. In addition, a leafspring is disposed along the keyway on the barrel to contact the plunger as it translates along the length of the barrel. Finally, the plunger barrel portion which normally receives a solid probe may have mutually spaced leaves inwardly crimped from the end thereof to engage the probe and retain the same in the barrel plunger.

In another embodiment of the invention an electrical test probe assembly for loaded board testing includes a housing having a hollow interior, and first and second opposite shields positioned and axially slidable in the housing and outwardly biased against each other. The first and second opposite shields form first and second shield cavities, respectively. In addition, the electrical test probe assembly includes first and second opposite insulators positioned and axially slidable in the first and second shield cavities, respectively. The first and second opposite insulators form an insulator cavity extending along the housing. Finally, the electrical test probe assembly includes first and second opposite plungers positioned and axially slidable in the insulator cavity of the first and second opposite insulators and outwardly biased against each other.

In addition, a method of providing electrical connection using a double-headed spring contact probe for loaded board testing is provides. The method includes the steps of providing a barrel for the double-headed spring contact probe, and providing first and second shields having first and second shield cavities to axially slide in the barrel and to transmit a first signal through the double-headed spring contact probe via the first and second shields. The method further includes the steps of outwardly biasing the first and second shields, and providing first and second insulators to axially slide in the first and second shield cavities of the first and second shields respectively. The method also includes the steps of providing first and second plungers to axially slide relative to each other in the insulator cavity formed by the first and second insulators, and to transmit a second signal through the double-headed spring contact probe which is electrically insulated from the first signal, and outwardly biasing the first and second plungers.

A connection interface system is also provided which positions and electrically connects a testing device to a device under test. The testing device exercises and tests the device under test. The connection interface system includes a receiver module electrically connected to the device under test and including receiver electrical connectors. The receiver module includes a top frame and a bottom frame, movable with respect to the top frame and operatively connected thereto. The bottom frame includes at least one receiver module having at least one receiver electrical connector. The receiver module further includes an engagement mechanism movably connected to the bottom frame and to the top frame which either engages or disengages the bottom frame and the top frame in response to an external stimulus to engage or disengage receiver electrical connectors in the bottom frame to external electrical connectors. The connection interface device also includes an integrated test adapter electrically connected to the testing device, coupled to the receiver module and including test electrical connectors which are engaged with the receiver electrical connectors permitting the testing device to exercise and test the device under test.

The foregoing and other objects, features, aspects and advantages of the present invention will become more apparent from the following detailed description of the present invention when taken in conjunction with the accompanying drawings.

BRIEF DESCRIPTION OF DRAWINGS

FIG. 15 is a partial sectional view similar to FIG. 3 illustrating an alternative embodiment of the plunger barrel portion;

FIG. 16 is a view taken along lines 16—16 of FIG. 15;

FIG. 17 is a view taken along lines 17—17 of FIG. 15;

FIG. 18 is a view taken along lines 18—18 of FIG. 15;

FIG. 30 is a top view of the receiver module in the connector interface system;

FIG. 31 is a side view of the receiver module in the connector interface system;

FIG. 34 is a top view of the interchangeable test adaptor module probe assembly in the connector interface system;

FIG. 35 is a side view of the interchangeable test adaptor module probe assembly in the connector interface system;

FIG. 49 is a top view of a double receiver module in the connector interface system;

FIG. 50 is a side view of a double receiver module in the connector interface system;

FIG. 57 is a top view of a triple receiver module in the connector interface system;

FIG. 58 is a side view of a triple receiver module in the connector interface system.

BEST MODE FOR CARRYING OUT THE INVENTION

Figure 1:
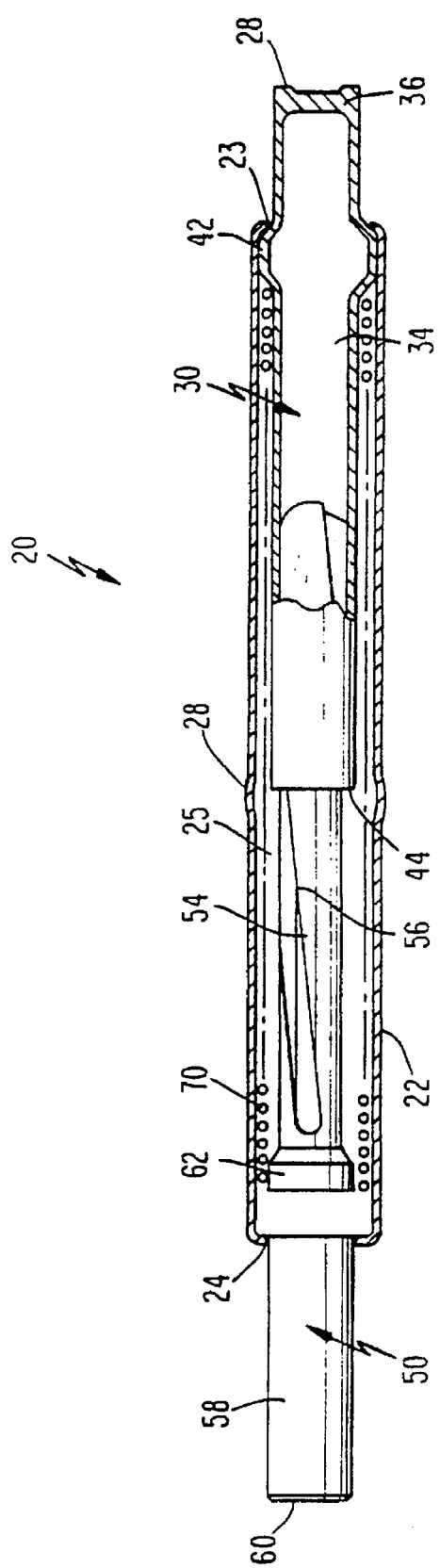
FIG. 1 is a partial cross sectional view of a double-headed twist probe according to the invention.

Referring to FIG. 1, a miniature double-headed twist probe 20 includes a hollow tubular housing 22 having open ends 23 and 24. A tubular plunger 30 is slidably positioned within central cavity 25 of housing 22, extending outward through aperture 23 and terminating in contact tip 38. An internal barrel portion 34 of plunger 30 is coaxial with housing 22, extending approximately to the midpoint of the housing. Opposing rod-like plunger 50 is slidably positioned within an opposite portion of cavity 25, extending out from housing 22 through aperture 24 and terminating in contact tip 60. An internal twisted rod portion 54 of plunger 50 is shaped like a drill bit or slotted helix, extending through a matching aperture or keyway 44 of barrel portion 34. Both plungers 30 and 50 are free to rotate and longitudinally translate within housing 22. External portions of plungers 30 and 50 are made of a conductive substance such as heat treated beryllium copper (BeCu) or hardened steel plated with gold over nickel. Housing 22 is preferably made of a material such as deep drawn gold plated brass or nickel silver.

Plunger 30 includes lengthwise contiguous internal hollow tubular or barrel portion 34 and external probe portion 36 which axially extends out through an aperture in an end of housing 22. A shoulder portion 42 limits travel of plunger 30, maintaining the probe within housing 22 by engaging a restricted portion of the aperture formed by crimping or rolling. An inner face of shoulder portion 42 serves as a seat for spring 70 which biases plunger 30 outward from housing 22.

Plunger 50 axially extends through an opposite aperture in housing 22 and includes an internal twist rod portion 54 within the housing and an external probe portion 58 having a terminal contact tip 60. Internal twist rod 54 is helically formed and includes a twisted bearing surface 56. Internal twist rod 54 passes through an aperture forming a keyway 44 in an internal terminal end of barrel 34. Keyway 44 engages twist rod including bearing surfaces 56 thereof so that axial travel of the plungers results in relative rotation thereof.

Spring 70 is positioned within cavity 25 of housing 22, coaxially surrounding barrel 34 and twisted rod 54 of the plungers. Spring 70 is made of a spring material such as stainless steel, music wire or beryllium copper and is positioned within housing 22. Opposite ends of spring 70 are seated on and engage shoulder portion 42 and collar portion 62 of plungers 30 and 50, respectively, thereby biasing the plungers outward from the housing. Inward travel of plungers 30 and 50 is against an outward bias provided by spring 70.

Figure 2:
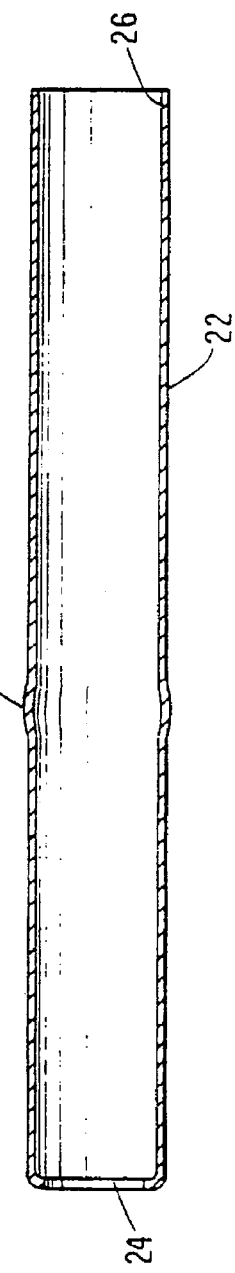
FIG. 2 is a sectional view of a probe housing prior to insertion of plungers and crimping of the open insertion end.

Housing 22 prior to assembly of the twist probe is shown in FIG. 2 of the drawings. The housing has a substantially tubular body with an aperture 24 formed at one end while an opposite end 26 remains open for insertion of the remaining probe components. A bulge in the housing forms press ring 28 for retaining the twist probe housing in a support member. After plunger 30, spring 70 and probe 50 are inserted into housing 22, open end 26 is rolled to form a lip, securing the components within the housing.

Figure 3:
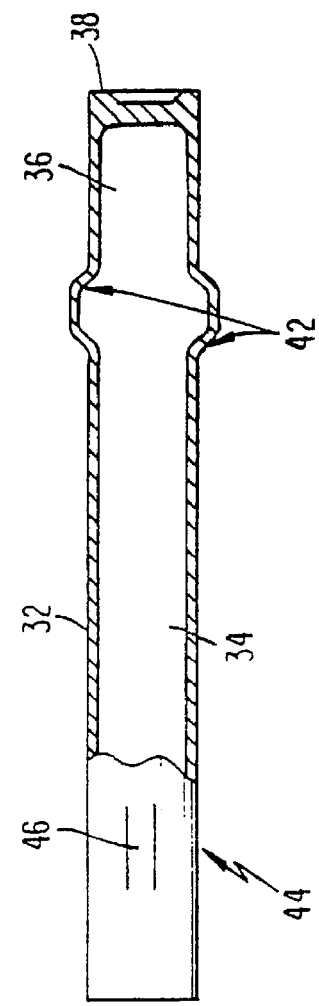
FIG. 3 is a partial sectional view of a plunger barrel portion.
Figure 4:
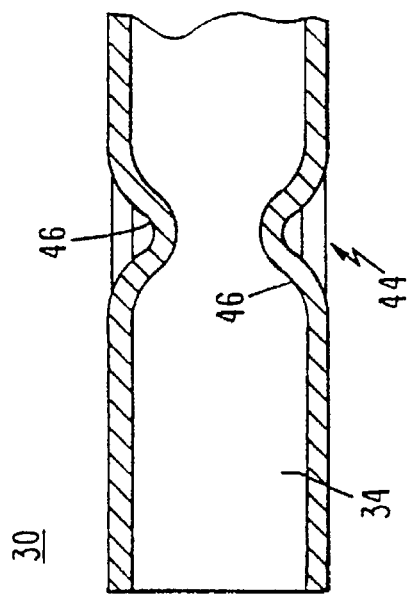
FIG. 4 is a partial sectional view of a barrel keyway.
Figure 5:
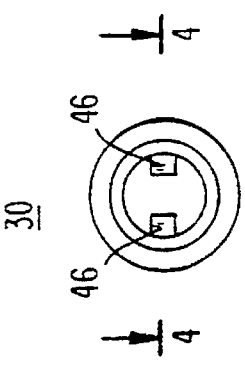
FIG. 5 is a partial cross-sectional view of a plunger barrel.

Plunger 30 is shown in greater detail in FIGS. 3–5 of the drawings. Therein, plunger 30 is made of a tubular material such as 360 brass plated with gold over nickel. Plunger 30 has an open internal barrel portion 34 and a closed external probe portion 36 terminating in contact tip 38. Shoulder portion 42 both limits axial travel of the probe within housing 22, and provides a seating surface for engaging spring 70, biasing plunger 30 outward from housing 22. Keyway 44 includes crimped portions 46 forming tabs extending radially into the cavity 34 of internal barrel 32. These tabs are configured to engage bearing surface 56 of probe 50.

Figure 6:
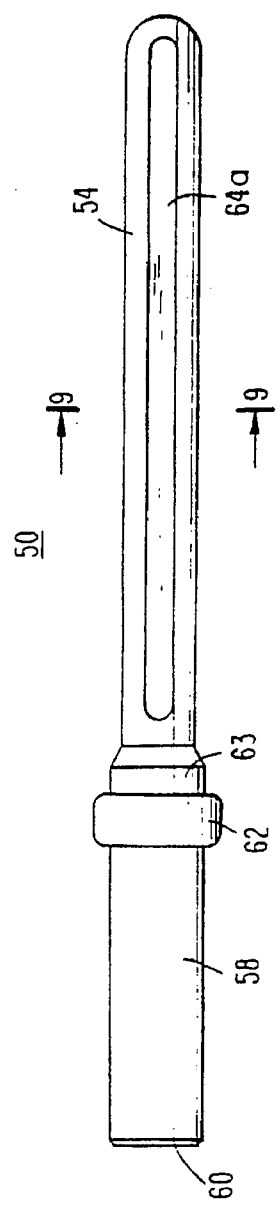
FIG. 6 is a side view of a plunger prior to twisting.
Figure 7:
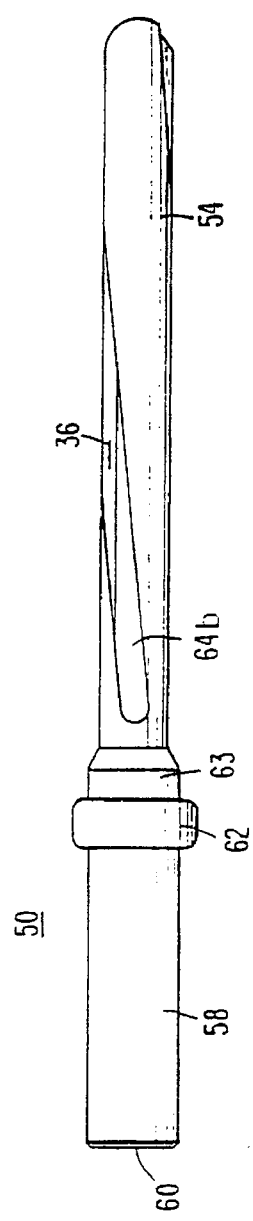
FIG. 7 is a side view of a plunger after twisting to form a spiral channel.
Figure 8:
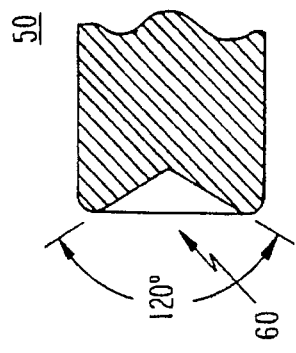
FIG. 8 is a partial sectional view of a terminal end of a plunger forming an electrical contact probe head.
Figure 9:
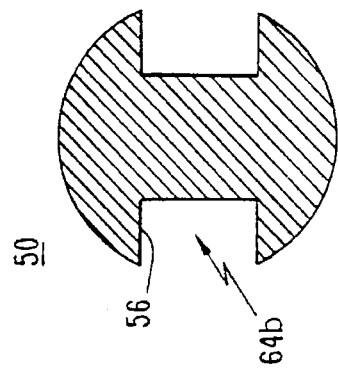
FIG. 9 is a cross-sectional view of a plunger showing channel detail.

Referring to FIGS. 6–9, plunger 50 includes an internal rod portion forming internal twist rod 54. Initially, as shown in FIG. 6, a straight channel 64a is formed in opposite sides of the surface of twist rod 54. The rod is then twisted 120 degrees as shown in FIG. 7 so that a spiral groove is formed by the twisted channel 64b. Channel 64b is configured to engage keyway 44 of plunger 30 whereby relative axial movement of the probes causes relative rotation of the probes. Collar portion 62 of plunger 50 limits axial travel of the probe and forms a seat for the opposite end of spring 70, biasing probe 50 outward of housing 22 against plunger 30. Shoulder portion 63 abuts collar portion 62 on the inner portion of plunger 50 and engages an inner surface of spring 70 to maintain coaxial alignment of the spring within housing 22.

Although the keyway and matching bearing surface of plungers 30 and 50 are shown as inward protruding tabs or "divots" engaging a channel, other geometric shapes can be used. For example, keyway 44 may comprise a rectangular aperture to engage a plunger having a corresponding mating rectangular cross-section. The tab/channel combination, however, has the advantage of increasing plunger-to-plunger contact surface area thereby minimizing electrical resistance through the probe.

A further embodiment of the plunger barrel shown in FIGS. 3–5 is provided in FIGS. 15–18. In that embodiment, the plunger barrel 30' mounts the inwardly protruding tab or "divot" 44'. However, it is disposed at an acute angle of about a 6° angle to the longitudinal axis of the plunger barrel 30' (or an obtuse angle if viewed in the opposite direction of 174°) to more precisely accommodate the spiral groove formed by the twisted channel 64b in twist rod 54. As will be obvious to those skilled in the art, by providing the keyway 44' at the angle shown, it will engage the channel 64b for better electrical connection. As shown in FIG. 16, the keyway 44' is provided on opposite sides of the barrel portion 34 to engage both the grooves 64b in the twist rod 54. In this way, the keyway 44' will engage the channels and continue to engage the channels during relative rotational movement of the plungers caused by relative movement thereof along the common longitudinal axis.

In addition, with attention to FIGS. 15 and 18, the barrel portion 34 also provides a leafspring 47 having a bearing surface 47' for contacting the plunger twist rod 54 as it moves axially through the barrel 30'. As shown in FIG. 18, the leafspring 47 is stamped from the barrel portion and is integral therewith.

Figure 10:
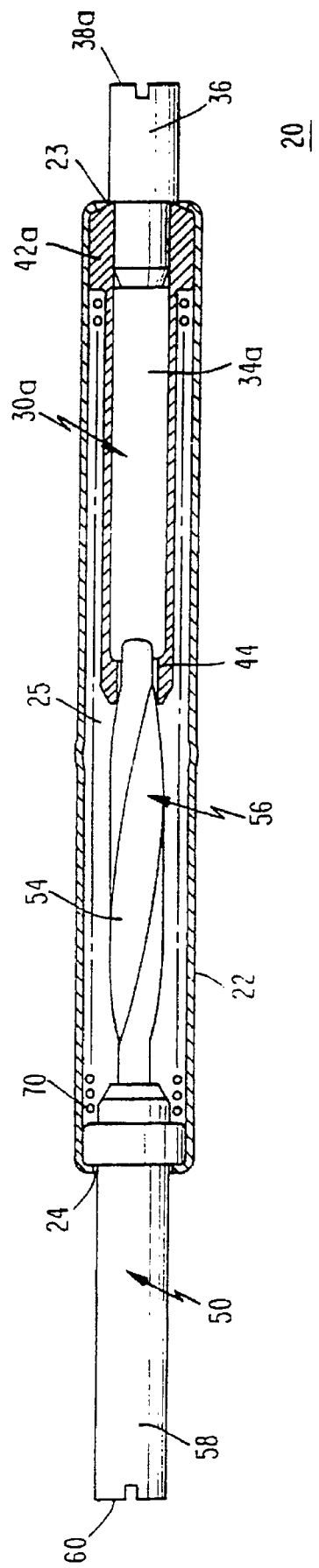
FIG. 10 is a partial sectional view of an alternate embodiment of a double-headed twist probe.

In another embodiment of the invention, spring 22 can be positioned within internal barrel 34 to bias plungers 30 and 50 axially outward from housing 22. An alternate construction of the double-headed twist probe is illustrated in FIG. 10. Housing 22 and plunger 50 are substantially the same as in the first embodiment of FIG. 1. However, plunger 30a is constructed of discrete portions including a barrel portion 34a having a distal end including collar portion 42a retaining a solid probe 36a. Although this embodiment requires more machining than is required by the first embodiment, the discrete solid probe 36a accommodates a greater variety of geometries for contact tip 38a.

As an alternative to collar portion 42a, as shown in FIGS. 15 and 17, leaves 43 may be provided around the circumference of the open distal end to facilitate retaining a solid probe. The leaves 43 are intended to engage a corresponding collar portion (not shown) of a probe 36 inserted therein.

Figure 11:
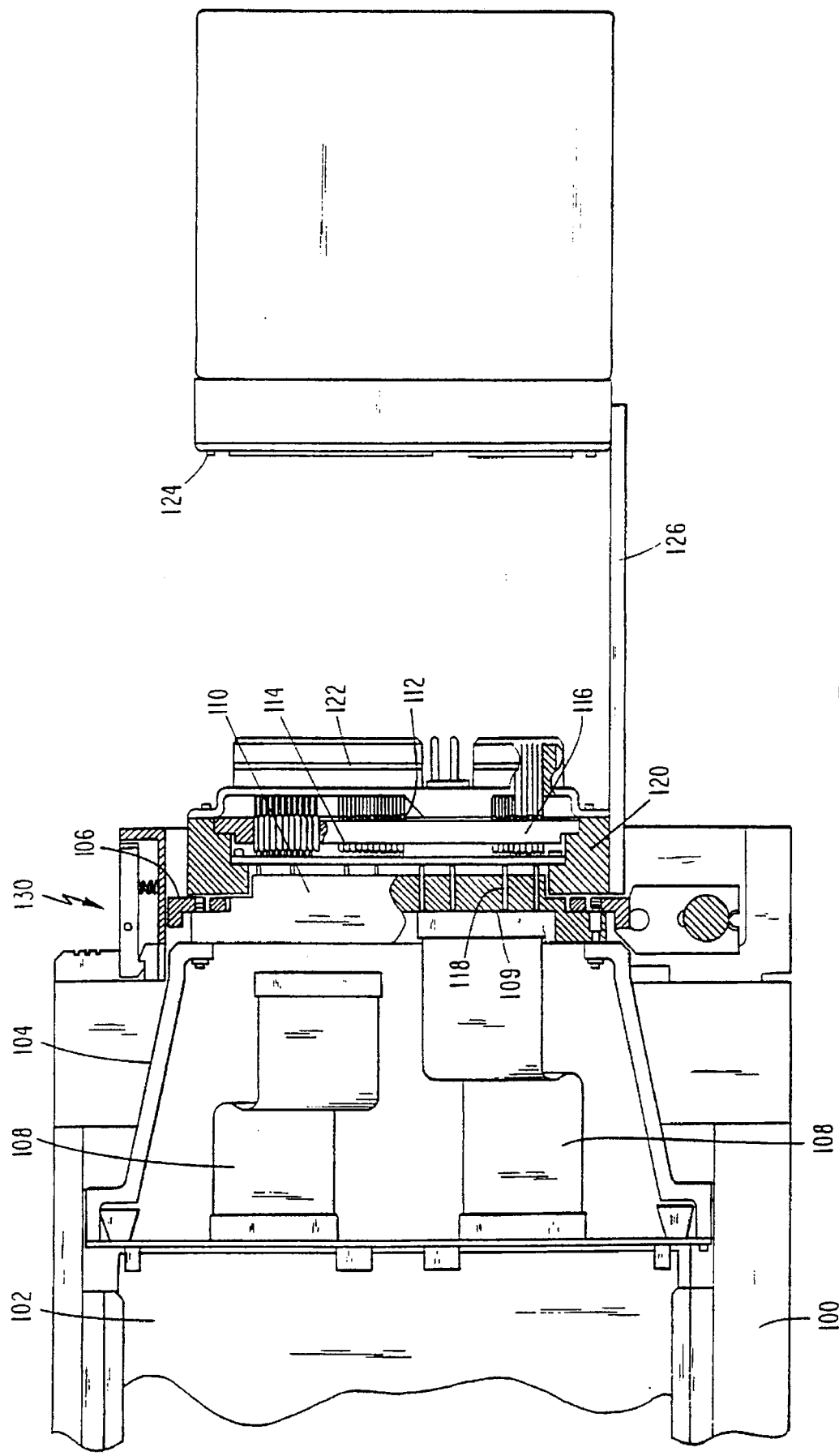
FIG. 11 is a partial sectional side view of a Twin Access Connector (TAC™) module including an array of double-headed twist probes providing electrical connectivity between components of a test device.

Another embodiment of the invention is shown in FIG. 11 wherein a plurality of twist probes are configured in an array to form a Twin Access Connector (TAC™) module for interfacing test components with a personality board. A testing device 100 includes a plurality of test cards 102 housed in a card cage. Each test card 102 has attached, to a front plate thereof, an interconnect adaptor 104. The details of the interconnect adaptor can be found in allowed U.S. patent application, Ser. No. 07/585,800, filed Sep. 21, 1990, incorporated herein by reference. A rear TAC module 110 is attached to the front of interconnect adaptor 104, the combination being located by receiver frame 106. TAC module 110 includes a plurality of twist probes 118 providing electrical contact between terminal ends 109 of cables 108 and a personality board 114. An opposite face of personality board 114 engages twist probe connectors 112 of front TAC module 116 to provide electrical conductivity to connector 122. Device Under Test (DUT) 124 includes corresponding connectors to engage connector 122 and is supported by support plate 126.

The TAC modules shown in FIG. 11 permit rapid removal and replacement of personality board 114 to adapt testing equipment 110 to various DUTs 124. In particular, to change a personality board, receiver 130 is disengaged, thereby releasing the ITA 120 which contains front TAC module 116 and personality board 114. Upon minor disassembly of ITA 120 the personality board 114 can then be removed and replaced by a new personality board and ITA 120 can be reassembled. Upon engaging receiver 130, TAC module 116 is brought back into engagement with personality board 114. Because twist probes 118 rotate upon depression, oxide on connector pads and components of personality board 114 is removed, thereby creating a low resistance connection.

Figure 12:
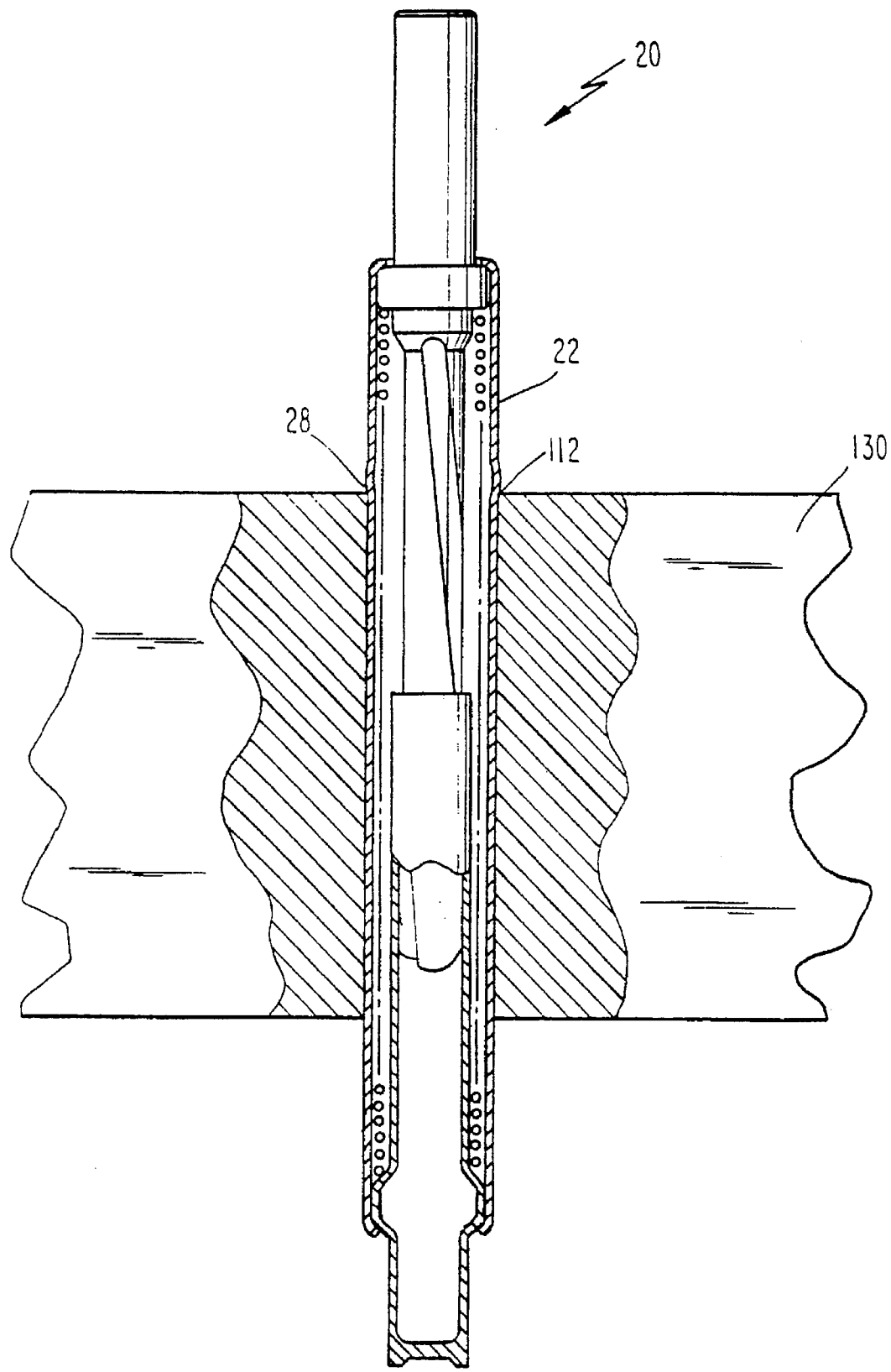
FIG. 12 is a partial sectional view of double-headed twist probe mounted in a module.

Mounting of a double-headed twist probe 20 in a TAC module 110 is shown in greater detail in FIG. 12. Housing 22 is inserted into an aperture 112 in frame 130 of module 110 until press ring 28 engages a front surface of the frame. Probe 20 is deformably retained in the aperture as shown. The frame may comprise an insulating substrate such as plastic with an array of through holes for receiving probes 20. Peripheral portions of frame 130 include mounting structures for securing the frame to the front of a card cage.

Figure 13:
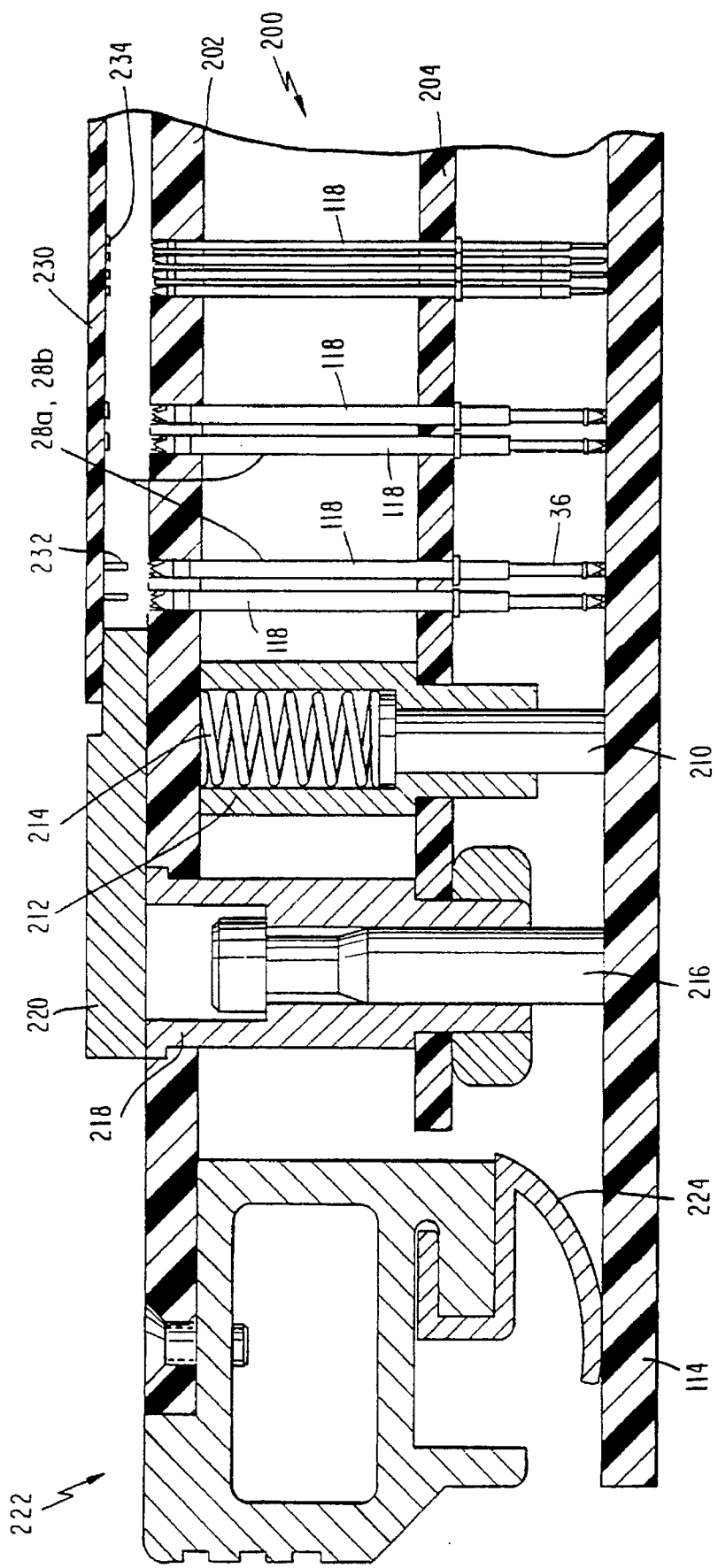
FIG. 13 is a partial sectional view of wireless fixture for interfacing a personality board to a printed circuit board under test.
Figure 14:
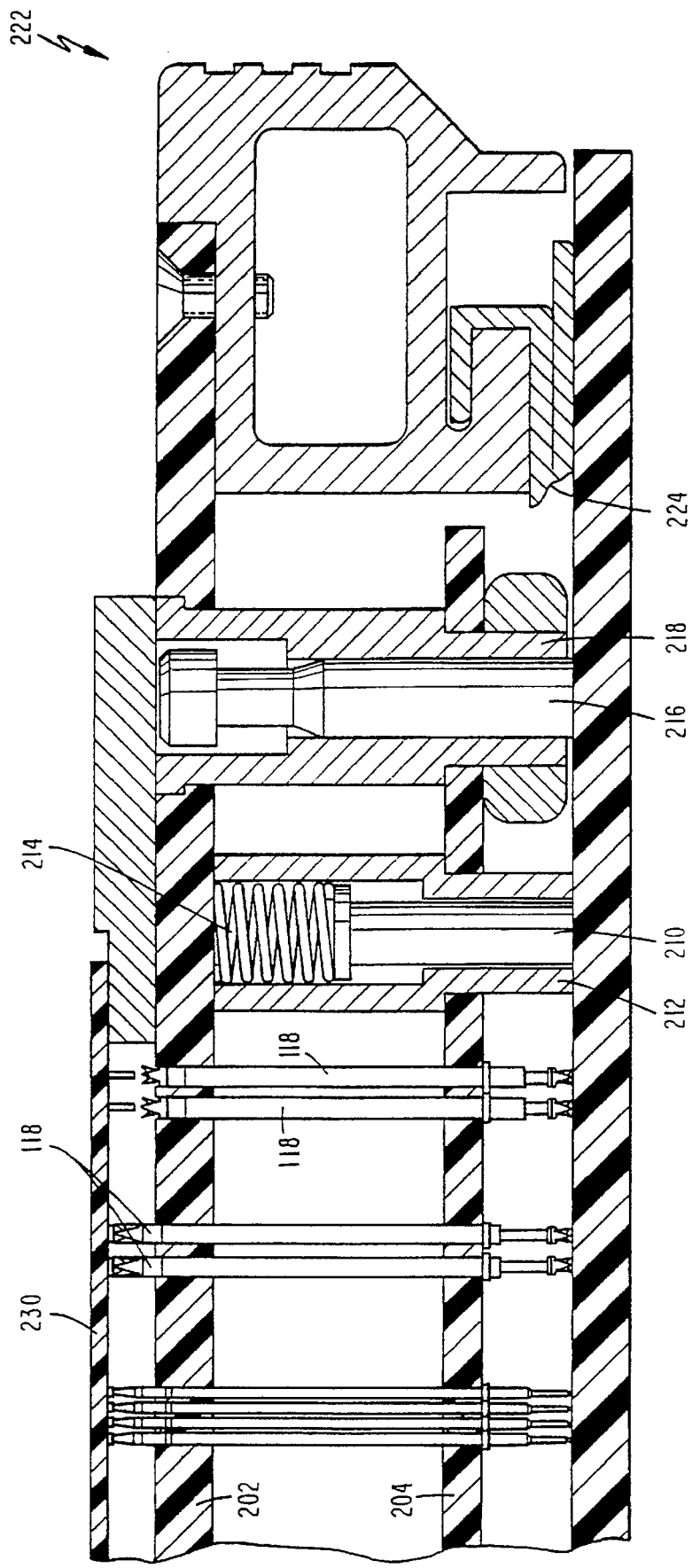
FIG. 14 is a partial sectional view of the wireless fixture shown in FIG. 13 with the printed circuit board positioned to engage the twist probes.

Another embodiment of the invention illustrated in FIGS. 13 and 14 incorporates a plurality of double-headed probes to directly interface a personality board to a circuit board under test. The probes may be double-headed helix twist probes. Referring to FIG. 13, an interface fixture 200 includes parallel top plate 202 and alignment plate 204. Plates 202 and 204 are made of a suitable electrical insulating material such as plastic with a plurality of aligned through holes. Probes 118 are positioned between the boards with opposite ends of the probes extending through respective vertically aligned through holes of plates 202 and 204. The through holes have diameters greater than a housing diameter of probes 118 positioned therein but less than the diameter of retaining rings 28a and 28b formed proximate opposite ends of the housings. Upward axial translation of probes 118 through the through holes is constrained by engagement of upper retaining ring 28a by surrounding portions of top plate 202 and downward translation is limited by lower retaining ring 28b engaging surrounding portions of alignment plate 204.

Fixture 200 is positioned above a personality board 114 so that lower external probe portions 36 of probes 118 engage contact pads formed on an upper surface of the personality board. Spring plungers 210 extend upward from personality board 114 and are retained within spring housings 212 provided at peripheral portions of the fixture. Return compression springs 214 are seated atop spring plungers 210 with opposite ends of the springs engaging top plate 202 to bias top plate 202 and alignment plate 204 upward. Upward travel of top plate 202 is limited by engagement of the head portions of spring plungers 210 with lower necked portions of spring housings 212.

Guide pins 216 and guide bushings 218 maintain alignment between the personality board 114, fixture 200 and a printed circuit board 230 of a unit under test (UUT). The guide pins 216 are positioned at peripheral portions of personality board 114 to engage corresponding guide bushings extending through top plate 202 and alignment plate 204 to engage UUT gasket 220. Peripheral portions of printed circuit board 230 rest on UUT gasket 220 to position the printed circuit board parallel to and above top plate 202.

A frame member 222 is positioned atop personality board 114 with fixture 200 and printed circuit board 230 located within the frame opening. A lower surface of frame member 222 includes a fixture gasket 224 made of a resilient material. The gasket provides a compressible air seal between frame member 222 and underlying personality board 114. An upper surface of frame member 222 includes a flange on which UUT gasket 220 is seated.

The combination of personality board 114, frame member 222, fixture 200 and printed circuit board 230 form a closed chamber. When the chamber is subjected to atmospheric pressure as shown in FIG. 13 frame member 222, fixture 200 and printed circuit board 230 resting thereon are biased upward, away from personality board 114 by return spring 114. In this "free state", component leads 232 and printed circuit pads 234 located on the lower surface of printed circuit board 230 are spaced above personality board 114 whereby the upper contact terminals of twist probes 118 are spaced apart from printed circuit board 230. Upon application of a vacuum source to the chamber, printed circuit board 230 is drawn down under atmospheric pressure into engagement with twist probes 118 as shown in FIG. 14. Alternate mechanical activation of the fixture is possible.

Figure 19:
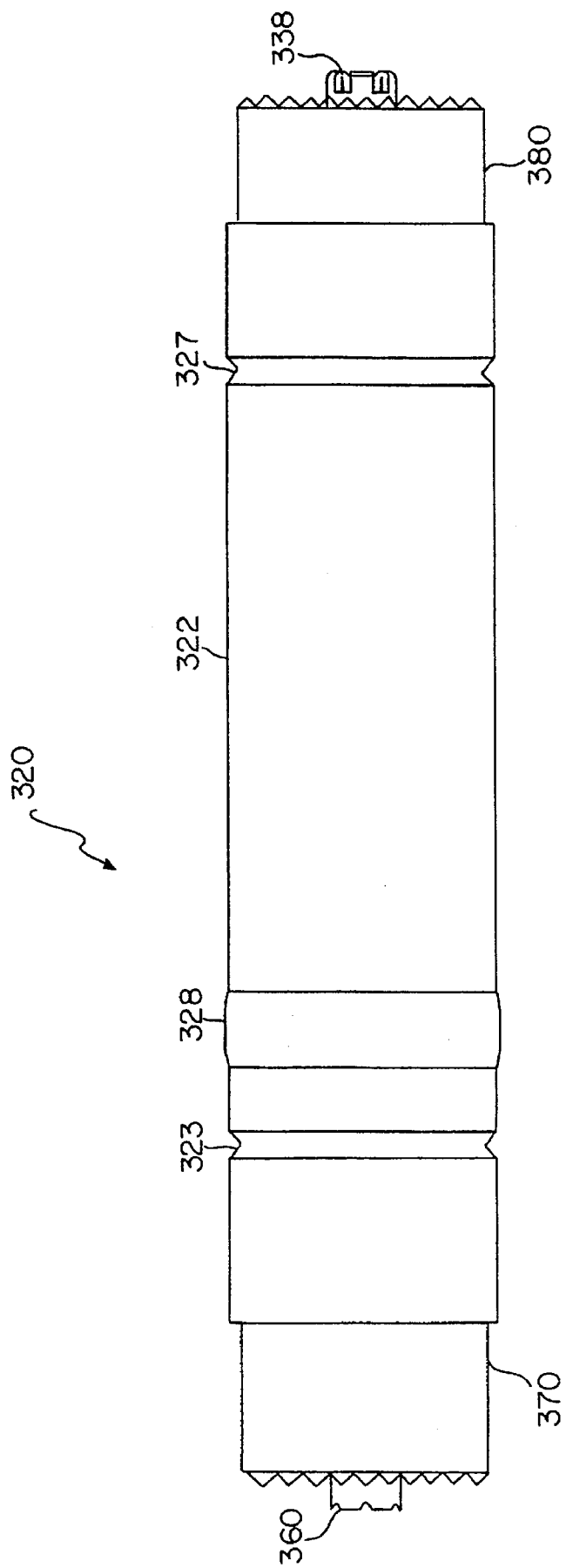
FIG. 19 is a view of a coaxial double-headed twist probe according to another embodiment of the invention.

FIG. 19 is a view of a coaxial double-headed twist probe according to another embodiment of the invention. In FIG. 19, coaxial double-headed twist probe 320 includes a tubular housing 322 with a bulge forming press ring 328 for retaining the coaxial twist probe housing in a support member in for example, frame 130 in TAC module 110 of FIGS. 11 and 12. Coaxial double-headed twist probe 320 also includes crimped portions 329 and 327 which prevent front and rear shields 370 and 380 from separating from tubular housing 322. Finally, coaxial double-headed twist probe 320 includes contact tips 360 and 338 for connection between, for example, test components and a personality board as illustrated in FIGS. 11 and 12.

Figure 20:
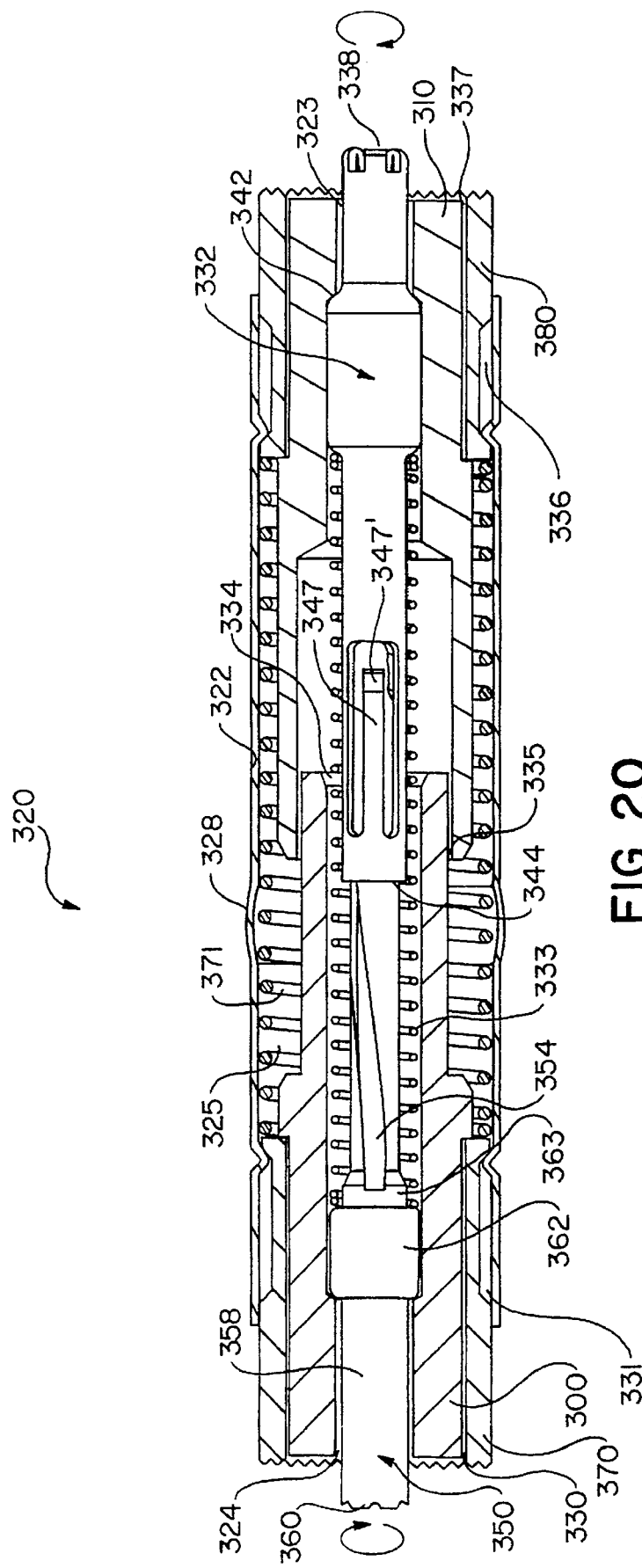
FIG. 20 is a partial cross sectional view of a coaxial double-headed twist probe according to another embodiment of the invention.

FIG. 20 is a partial cross sectional view of a coaxial double-headed twist probe according to another embodiment of the invention. In FIG. 20, coaxial double-headed twist probe 320 includes a tubular housing 322 with press ring 328 and open ends 331 and 336. A tubular plunger 332 is slidably positioned within rear insulator 310, extending outward through aperture 323 and terminating in contact tip 338. Tubular plunger 332 is coaxial with housing 322 and rear insulator 310. Opposing rod-like plunger 350 is slidably positioned within front insulator 300, extending out from housing 322 through aperture 324 and terminating in contact tip 360.

Front insulator 300 is coaxial with housing 322 and rear insulator 310. In addition, front insulator 300 is slidably positioned within rear insulator 310. Front and rear insulators 300 and 310 are partially disposed within open ends 330 and 337 of front and rear shields 370 and 380, respectively. Front and rear insulators 300 and 310 are biased by movement of the front and rear shields 370 and 380. In addition, front and rear shields 370 and 380 are biased against each other via spring 371 disposed within cavity 325 of housing 322. Spring 371 is preferably made of a spring material such as stainless steel, music wire or beryllium copper. Inward travel of front and rear shields 370 and 380 is against an outward bias provided by spring 333. While spring 371 is shown as a spirally wound structure, other spring mechanisms are also contemplated which can outwardly bias front and rear shields 370 and 380.

An internal twisted rod portion 354 of plunger 350 is shaped like a drill bit or slotted helix, extending through a matching aperture or keyway 344 of plunger 332. Plunger 350 is preferably identical to plunger 50 illustrated in FIGS. 6 and 7. In addition, plunger 332 is preferably identical to plunger 30' illustrated in FIGS. 15–18. Both plungers 332 and 350 are free to rotate and longitudinally translate within housing 322 and front and rear insulators 300 and 310. External portions of plungers 332 and 350 are preferably made of a conductive substance such as heat treated beryllium copper (BeCu) or hardened steel plated with gold over nickel. Housing 322 is preferably made of a material such as deep drawn gold plated brass or nickel silver.

Plunger 332 includes lengthwise contiguous an internal barrel portion and an external probe portion which axially extends out through aperture 323 of rear insulator 310 and housing 322. A shoulder portion 342 of rear insulator 310 limits travel of plunger 332, maintaining the plunger within housing 322 by engaging a restricted portion of the aperture formed by counter-sinking rear insulator at shoulder portion 342. The internal barrel portion of plunger 332 serves as a seat or stop for spring 333 which biases plunger 332 outward from housing 322 and against plunger 350.

Plunger 350 axially extends through an opposite aperture or cavity in front insulator 300 and includes an internal twist rod portion 354 within the front insulator and an external probe portion 358 having a terminal contact tip 360. Internal twist rod 354 is helically formed and includes a twisted bearing surface. Internal twist rod 354 passes through an aperture forming a keyway 344 in an internal terminal end of barrel 332. Keyway 344 engages twist rod 354 so that axial travel of the plungers 332 and 350 results in relative rotation of contact tips 338 and 360.

Although the keyway and matching bearing surface of plungers 330 and 350 are preferably comprised of inward protruding tabs or "divots" engaging a channel as shown in FIGS. 3–5 and FIGS. 15–18. However, other geometric shapes can also be used. For example, keyway 344 may comprise a rectangular aperture to engage a plunger having a corresponding mating rectangular cross-section. The tab/channel combination, however, has the advantage of increasing plunger-to-plunger contact surface area thereby minimizing electrical resistance through the probe.

Spring 333 is positioned within the cavity of front and rear insulators 300 and 310, coaxially surrounding the barrel of plunger 332 and twisted rod 354 of plunger 350. Spring 333 is preferably made of a spring material such as stainless steel, music wire or beryllium copper. While spring 333 is shown as a spirally wound structure, other spring mechanisms are also contemplated which can outwardly bias plungers 332 and 350. Opposite ends of spring 333 are seated on and engage a shoulder portion of plunger 332 and shoulder and collar portions 363 and 362 of plunger 350, respectively, thereby biasing plungers 332 and 350 outward from the housing 322 and from each other. Inward travel of plungers 332 and 350 is against an outward bias provided by spring 333.

Figure 21:
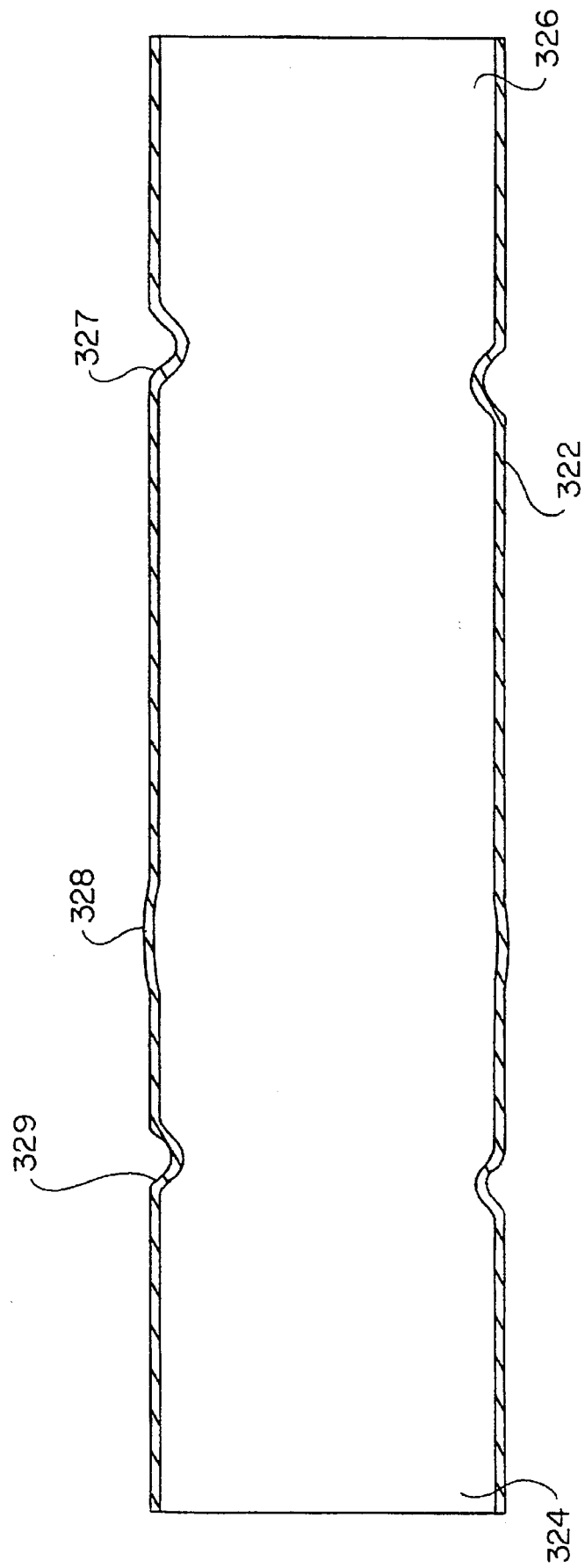
FIG. 21 is a sectional view of a probe housing prior to insertion of plungers and crimping of the coaxial double-headed twist probe of FIG. 20.

Housing 322, prior to assembly of the coaxial double-headed twist probe, is shown in FIG. 21 of the drawings. The housing has a substantially tubular body with an aperture 324 formed at one end while an opposite end 326 remains open for insertion of the remaining probe components. A bulge in the housing forms press ring 328 for retaining the twist probe housing in a support member. After plunger 330, spring 333 and plunger 350 are inserted into housing 322. Next, front and rear insulators 300 and 310 may be placed in housing 322 around plungers 332 and 350. Front and rear insulators are held in place via front and rear shields 370 and 380. Front shield 370 may be inserted via aperture 331 of housing 322 which is then crimped at 329 to secure the front insulator and front shield 300 and 370 structure. Rear shield 380 may be then inserted via aperture 336 of housing 322 which is then crimped at 327 to secure the rear insulator and rear shield 310 and 380 structure.

Figure 22:
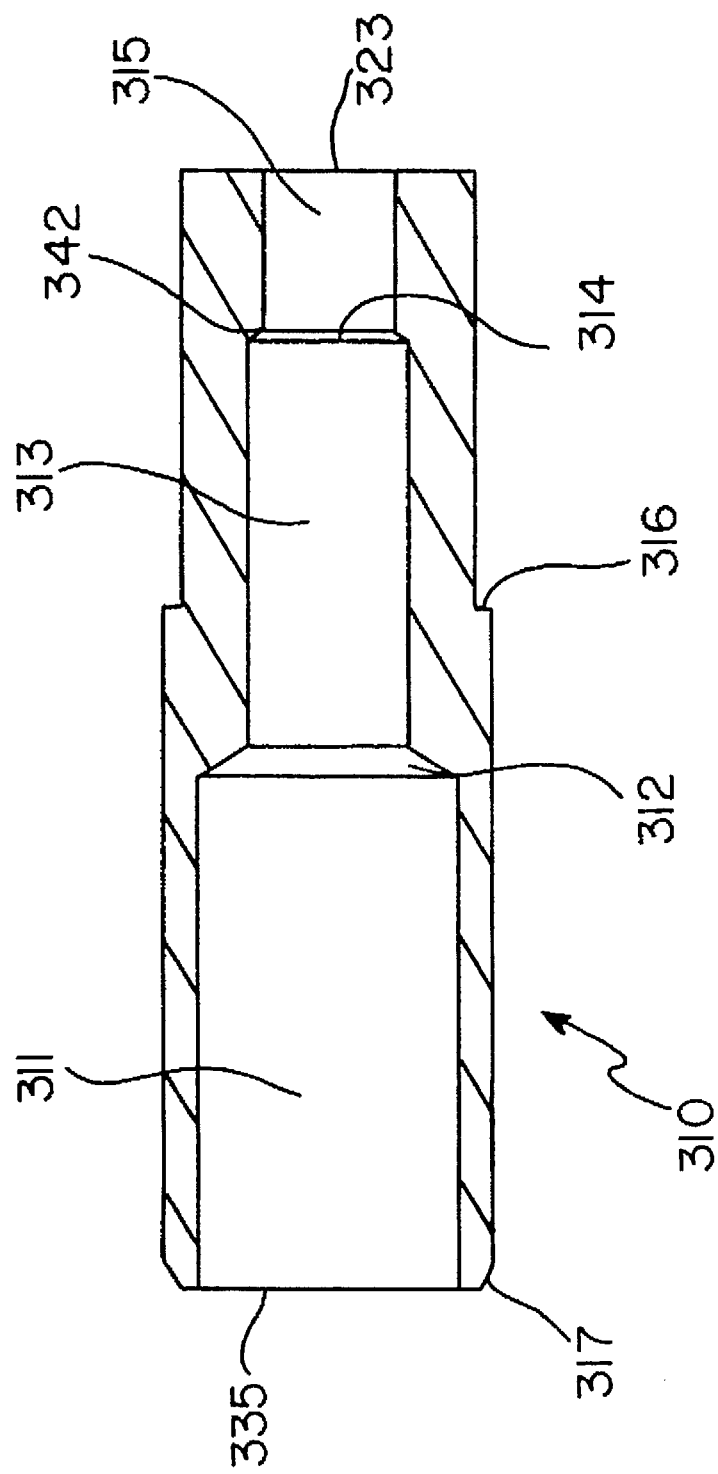
FIG. 22 is a sectional view of a rear insulator of the coaxial double-headed twist probe of FIG. 20.

FIG. 22 is a sectional view of a rear insulator of the coaxial double-headed twist probe of FIG. 20. As shown in FIG. 22, rear insulator 310 includes a first cavity 311 forming opening 335 for receiving front insulator 300, plungers 332 and 350 with spring 333 biasing plungers 332 and 350. Cavity 311 is counter-sinked at 312 to facilitate compression of spring 333. Rear insulator 310 further includes a second cavity 313 which is smaller than first cavity 311 for receiving the shoulder portion of plunger 332 and a portion of spring 333 which abuts the shoulder portion of plunger 332. Cavity 313 is counter-sinked at 314 to form shoulder portion 342 which limits travel of plunger 332. Shoulder portion 342 maintains the plunger within housing 322 by engaging a restricted portion of the aperture formed by counter-sinking rear insulator at 314 forming shoulder portion 342.

Rear insulator 310 further includes third cavity 315 resulting in opening 323 for receiving contact tip 338 of plunger 332 and permitting contact tip 338 external contact. Rear insulator 310 also includes lip 316 which abuts rear shield 380 and which is influenced by rear shield 380. In particular, rear insulator 310 is driven inward toward the center of the coaxial double-headed contact probe 320 by the inward movement of rear shield 380. Rear insulator 310 further includes shaved tip 317 at opening 335 to facilitate compression of spring 371 upon the inner movement of front and rear shields 370 and 380.

Figure 23:
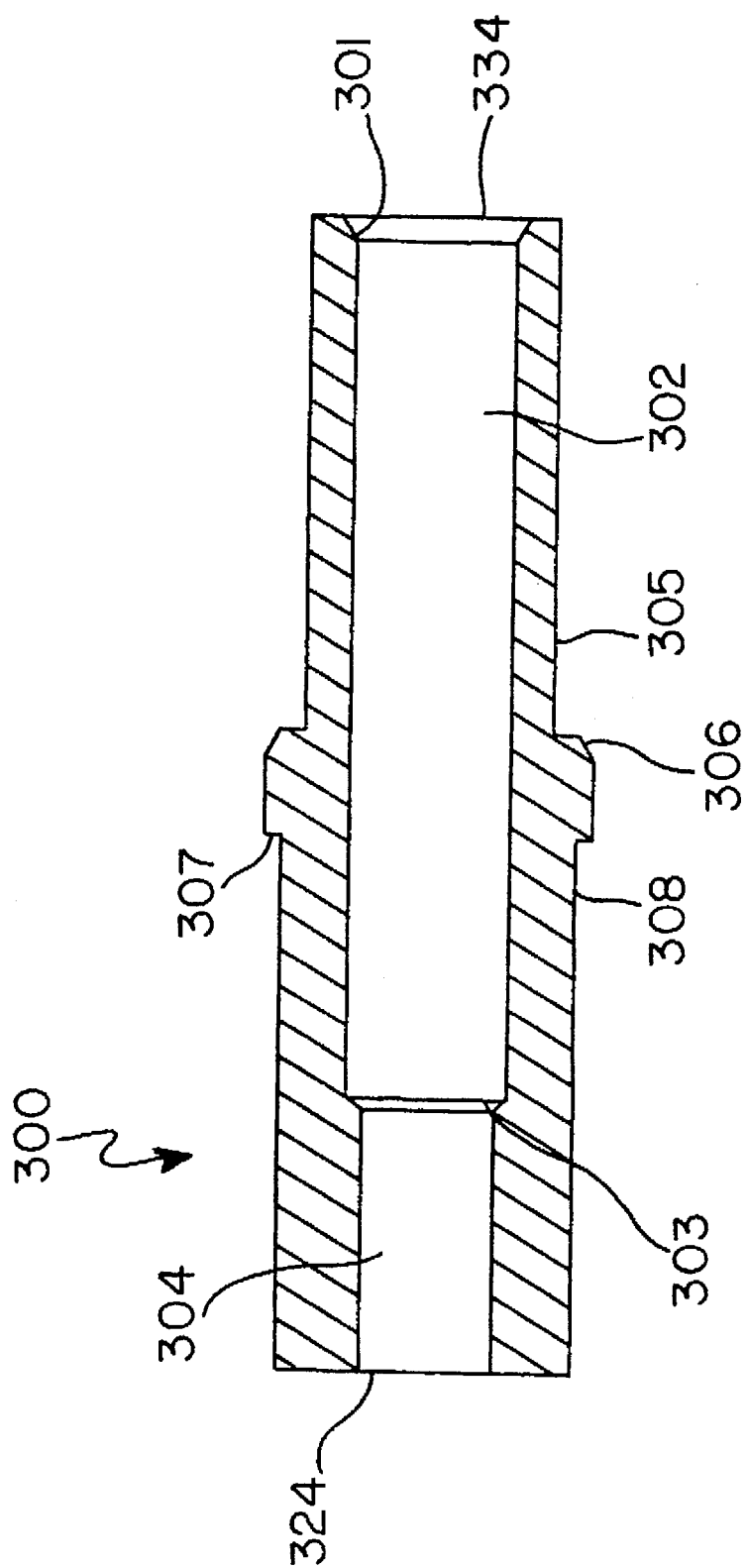
FIG. 23 is a sectional view of a front insulator of the coaxial double-headed twist probe of FIG. 20.

FIG. 23 is a sectional view of a front insulator of the coaxial double-headed twist probe 320 of FIG. 20. As shown in FIG. 23, front insulator 300 includes a first cavity 302 which is counter-sinked at 301 forming opening 334 for receiving plungers 332 and 350 with spring 333 biasing plungers 332 and 350. Cavity 302 is counter-sinked at 301 to facilitate compression of spring 333. Front insulator 300 further includes a second cavity 304 forming opening 324. Cavity 304 is smaller than the first cavity 302 for receiving the narrower external probe portion 358 of plunger 350 which includes contact tip 360. Cavity 304 is counter-sinked at 303 to facilitate engagement with the shoulder portion 362 of plunger 350. Cavity 304 and counter-sink 303 maintains the plunger 350 within housing 322 by engaging shoulder portion 362 with counter-sink 303.

Front insulator 300 also includes lip 307 adjoining section 308 which abuts front shield 370 and which is influenced by front shield 370. In particular, front insulator 300 is driven inward toward the center of the coaxial double-headed contact probe 320 by the inward movement of front shield 370. Front insulator 300 further includes shaved tip 306 at section 305 to facilitate compression of spring 371 upon the inner movement of front and rear shields 370 and 380. Section 305 is narrower than section 308 for insertion in opening 335 of rear insulator 310. Further, section 308 is constructed for insertion in opening 330 of front shield 300.

Front and rear insulators 300 and 310 may be made of any insulating material which is able to insulate the inner plunger combination of plungers 332 and 350 from housing 322, front and rear shields 370 and 380 and spring 371. Front and rear insulators 300 and 310 are preferably made of foamed polyethylene material which provides these acceptable characteristics while also being easy to work with and shape described above in connection with FIGS. 22 and 23.

Figure 24:
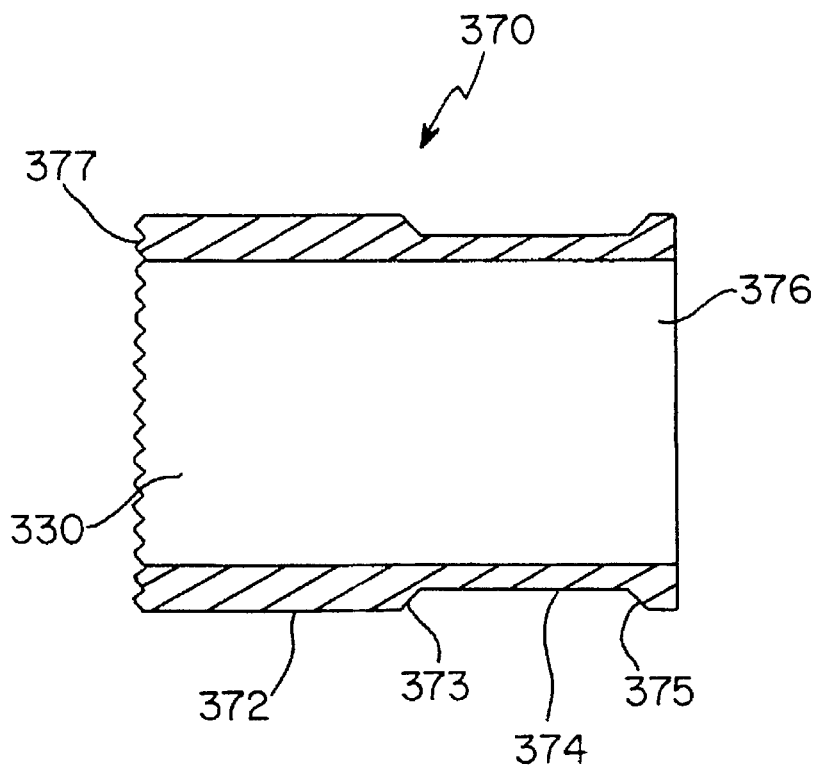
FIG. 24 is a sectional view of a front shield of the coaxial double-headed twist probe of FIG. 20.
Figure 25:
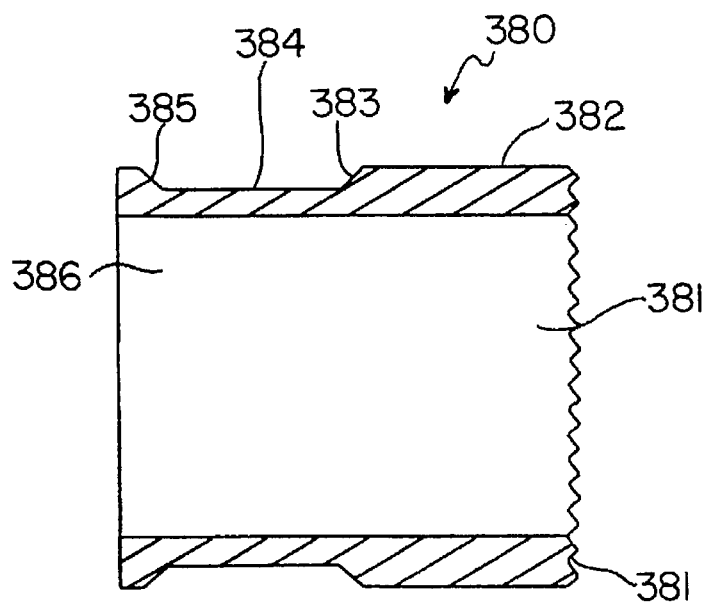
FIG. 25 is a sectional view of a rear shield of the coaxial double-headed twist probe of FIG. 20.

FIGS. 24 and 25 are sectional views of respective front and rear shields of the coaxial double-headed twist probe 320 of FIG. 20. FIG. 24 illustrates front shield 370 with opening 330 finely knurled to form saw teeth 377. Alternatively, instead of saw teeth 377, opening 330 may be in the shape of a flat ring. Front shield 370 also includes section 372 which is insertable in opening 331 of housing 322. Part of section 372 is external to housing 322 for contacting an external surface which may or may not be the same surface which is contacted by contact tip 360. Section 372 adjoins narrow section 374 which is bordered by angled or slanted surfaces 373 and 375 of front shield 370. Narrow section 374 is constructed to receive crimped portion 329 of housing 322. Angled surfaces 373 and 375 restrict the movement of front shield 370, i.e., angled surface 373 prevents front shield 370 from being inserted too far into housing 322, and angled portion 375 prevents front shield 370 from exiting housing 322. Angled surface 373 and 375 are angled to facilitate engagement with crimped portions 329 of housing 322 which have a similar angled surfaces.

FIG. 25 is a sectional view of rear shield 380 of the coaxial double-headed twist probe 320 of FIG. 20. In FIG. 25, rear shield 380 with opening 337 finely knurled to form saw teeth 381. Alternatively, instead of saw teeth 381, opening 337 may be in the shape of a flat ring for enhanced connection. Rear shield 380 also includes section 382 which is insertable in opening 336 of housing 322. Part of section 382 is external to housing 322 for contacting an external surface which may or may not be the same surface which is contacted by contact tip 338. Section 382 adjoins narrow section 384 which is bordered by angled or slanted surfaces 383 and 385 of rear shield 380. Narrow section 384 is constructed to receive crimped portion 327 of housing 322. Angled surfaces 383 and 385 restrict the movement of rear shield 380, i.e., angled surface 383 prevents rear shield 380 from being inserted too far into housing 322, and angled portion 385 prevents rear shield 380 from exiting housing 322. Angled surface 383 and 385 are angled to facilitate engagement with crimped portions 327 of housing 322 which have a similar angled surfaces.

Front and rear shields 370 and 380 may be any suitable conductive material, and are preferably made of a material such as gold plated brass or heat treated gold plated BeCu. Front and rear shields 370 and 380 provide for or conduct additional signals which may enhance the transmission of the signal through plungers 332 and 350 and spring 333 by providing ground potential with respect to the transmitted signal. Alternatively, front and rear shields 370 and 380 may provide a medium for simultaneously transmitting a second signal with the assistance of spring 371 and housing 322.

Front and rear insulators 300 and 310 are used to isolate or insulate the signal which is transmitted via plungers 332 and 350 with the assistance of spring 333 for fine or enhanced signal transmission. Note that for plungers 332 and 350, the signal transmitted therethrough is not conducted by housing 322 which significantly isolates the signal from the outside. In addition, front and rear insulators 300 and 310 are also used to insulate the signal which is conducted via front and rear shields 370 and 380 with the assistance of spring 371 and housing 322. In this application, it is presumed that the signal carried therethrough does not require the isolated conditions of the signal discussed above which is conducted through plungers 332 and 350 since this signal is conducted via housing 322 which may be adversely affected by the area or region which is external to the coaxial double-headed spring loaded contact probe. When front and rear shields 370 and 380 are used to conduct a second data signal, the coaxial double-headed twist probe provides the further advantage of transmitting two different signals while effectively and efficiently using the limited space allocated.

Figure 26:
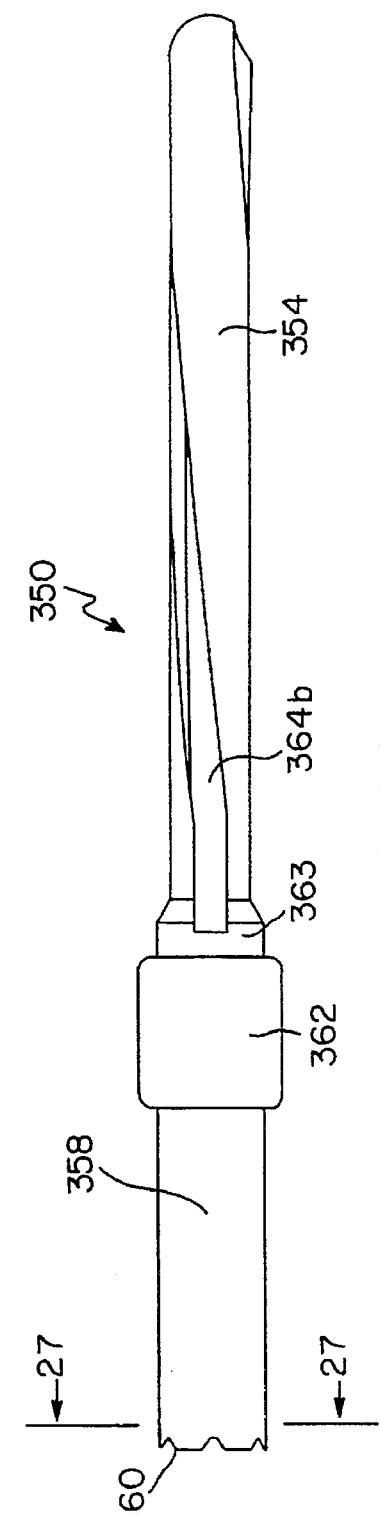
FIG. 26 is a side view of a plunger after twisting to form a spiral channel.

FIG. 26 is a side view of a plunger after twisting to form a spiral channel. In FIG. 26, plunger 350 includes an internal rod portion forming internal twist rod 354. Plunger 350 is preferably similar to plunger 50 shown in FIGS. 6 and 7 where plunger 350 is twisted 120 degrees so that a spiral groove is formed resulting in twisted channel 364b shown in FIG. 26. Channel 364b is configured to engage keyway 344 of plunger 332 whereby relative axial movement of the plungers also causes relative rotation of the plungers. Collar portion 362 of plunger 350 limits axial travel of the probe and forms a seat for the opposite end of spring 333, biasing plunger 350 outward of housing 322 and against plunger 332. Shoulder portion 363 abuts collar portion 362 on the inner portion of plunger 350 and engages an inner surface of spring 333 to maintain coaxial alignment of the spring within housing 322.

Figure 27:
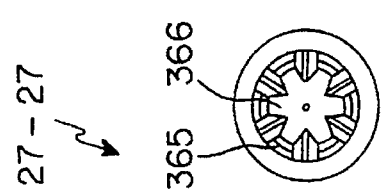
FIG. 27 is a cross-sectional view of a plunger taken along section lines 27—27 of FIG. 26.

FIG. 27 is a cross-sectional view of exterior portion 358 of plunger 350 taken along section lines 27—27 of FIG. 26. In FIG. 27, the exterior portion 358 near the contact tip 360 counter-sinked using a standard counter-sink tool to form counter-sink area 365. The exterior portion 358 is then slotted in a star shape using a standard V-shape cutting tool to form opening 366. Advantageously, this counter-sinked star-shaped opening provides the necessary structure to remove dirt or dust from the contact area of contact tip 360 by drawing the debris into star-shaped opening 366 or by expelling the debris from the contact tip.

In summary, the double-headed twist probe and the coaxial double-headed twist probe according to the invention provides direct electrical conductivity between circuitry mounted on parallel substrates, avoiding intermediate connectors and wiring. By mounting a plurality of double-headed twist probes or a plurality of coaxial double-headed twist probes in a suitable supporting member, a double-sided "bed of nails" configuration is achieved to form a TAC module. The TAC module accommodates simplified removal and replacement of frequently changed circuit board mounted components, such as testing equipment personality boards.

Figure 28:
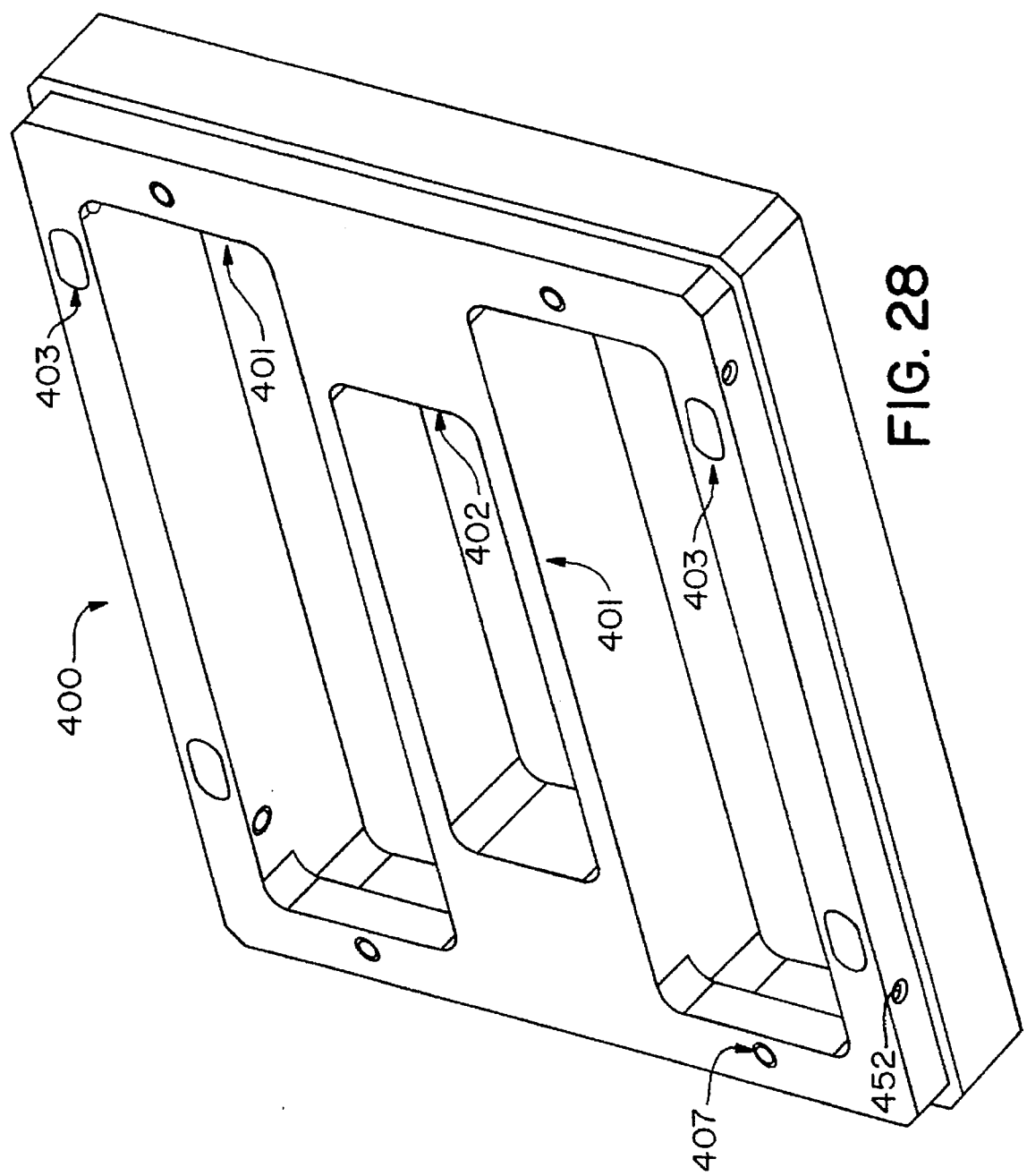
FIG. 28 is a top view of an interchangeable test adaptor in the connector interface system.
Figure 29:
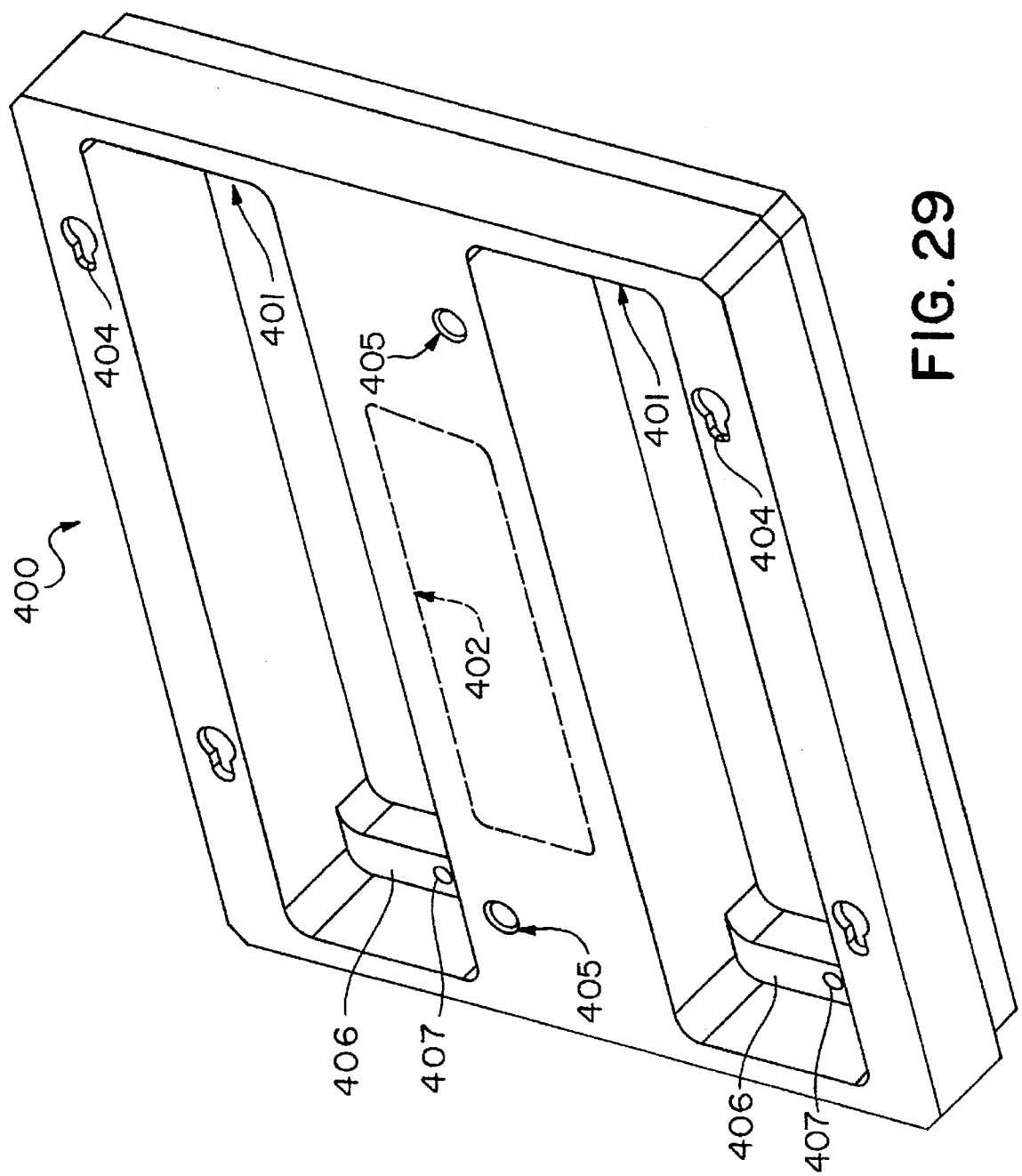
FIG. 29 is a bottom view of the interchangeable test adaptor in the connector interface system.

FIGS. 28 and 29 are respective top and bottom views of the interchangeable test adaptor (ITA) in the connector interface system. As shown in FIGS. 28 and 29, interchangeable test adaptor 400 includes interchangeable test adaptor module pockets 401 for receiving modules which have been connected to a testing device. The interchangeable test adaptor modules are connected to the interchangeable test adaptor module 400 via interchange test adaptor module mounting bracket or surface 406 and interchangeable test adaptor module mounting hole 407. Other connection means may also be used to connect the interchangeable test adaptor modules to interchangeable test adaptor device or module 400. Interchangeable test adaptor module 400 also includes weight reducing pocket 402 which removes a substantial mass from interchangeable test adaptor 400 to reduce the weight of interchange test adaptor module 400 while maintaining the overall structural integrity. Female bayonet mounting holes 404 are formed on the side of the interchangeable test adaptor module 400 which engages with the receiver module in the connector interface system. Female bayonet mounting holes 404 include female bayonet cavity 403 for providing clearance for the male bayonet connector, discussed later, to engage with female bayonet mounting hole 404. Interchangeable test adaptor 400 further includes bushing clearance hole 405 which receives an alignment/ stabilization pin from the receiver module when the interchangeable test adaptor module 400 is engaged with the receiver module of the connector interface system. Interchangeable test adaptor module 400 also includes cover mounting holes 452 for permitting an external cover to protect and substantially enclose the external side of interchangeable test adaptor test module 400 from the environment. The interchangeable test adaptor cover will protect the connections between the testing system and the interchangeable test adaptor module from the environment.

As previously discussed, the interchangeable test adaptor 400 may include a predetermined number of replacement modules having various arrays of electrical contacts therein, requiring engagement with the coacting contacts on the receiver modules. It should be understood that the electrical contact patterns and types on both the receiver and interchangeable test adaptor modules may vary and the connection interface system of the present invention is not limited in its use to any particular contact arrangement or type as long as the contacts on the receiver and interchangeable test adaptor are constructed and positioned for proper engagement under the influence of the slide mechanism in the connection interface system. For example, the interchangeable test adaptor may include jumpers for configuring instrumentation modules as required for a particular application and may provide various wiring arrangements or configurations. In addition, the interchangeable test adaptor may include a vacuum fixture in bed of nails or an edge connection fixture connected to various instrumentation cards for exercising a device or unit under test (DUT or UUT) circuit board. Alternatively, the interchangeable test adaptor can be configured to provide connectors and cables suitable for connecting the testing system to a particular unit under test which is to be exercised and tested. Since interchangeable test adapters are quickly and easily changed, various testing configurations can be implemented without rewiring or changing multiple individual connectors to the instrumentation cards providing excellent reuse characteristics.

FIGS. 30 and 31 are respective top and side views of a receiver module in the connector interface system. As shown in FIGS. 30 and 31, receiver module 410 includes bottom frame 414 engaged with top frame 415 responsive to the movement of handle 416. Receiver module 410 includes receiver module pocket 408 for receiving a receiver wiring or probe assembly. The receiver probe assembly is mounted to receiver 410 via receiver mounting bracket 409 and receiver module mounting hole 411. The receiver module probe assembly is then secured to receiver 410 via a screw. Of course, other devices or methods may be used to secure the receiver module probe assembly to the receiver module 410. On the top surface of receiver module 410, male bayonets 412 are connected for securing receiver module 410 to the interchangeable test adaptor module 400 via female bayonets 404 (shown in FIG. 28). This connection system provides an effective way for quickly connecting the interchangeable test adaptor module 400 to receiver module 410.

Once the interchangeable test adaptor 400 has been connected to receiver module 410 via male bayonets 412 and female bayonet mounting holes 404, the positioning of the two modules can be further adjusted via an alignment pin (not shown) which is inserted through bushing hole 413 of receiver module 410 and simultaneously through bushing clearance hole 405 of interchangeable test adaptor module 400. Handle 416 preferably includes handle latch 417 which rotates about the end of handle 416 and which engages locking pin 418. In addition, stop pin 419 is provided to prevent handle 416 from overextending. Handle latch 417 is preferably spring loaded and biased against handle 416 facilitating the locking of handle 416 to top frame 415 of receiver module 410. Bottom frame 414 of receiver module 410 also includes recessed cavity 420 and screw access cavity 421 which is further bored in recessed cavity 420 to provide access to the internal sliding mechanism (not shown) of receiver module 410. Advantageously, when handle 416 is open, the internal sliding mechanism of receiver 410 exposes the slide pins which may then be removed via standard tool, such as a screwdriver. Receiver module 410 also includes receiver contact protection screen mounting bracket or surface 447 and receiver mounting hole 448. Receiver mounting bracket 447 and receiver screen mounting hole 448 are used for mounting a protective screen onto receiver module 410 to protect a receiver module probe assembly including the electrical contact probes which are connected via receiver module mounting bracket 409 and receiver module mounting hole 411.

Figure 33:
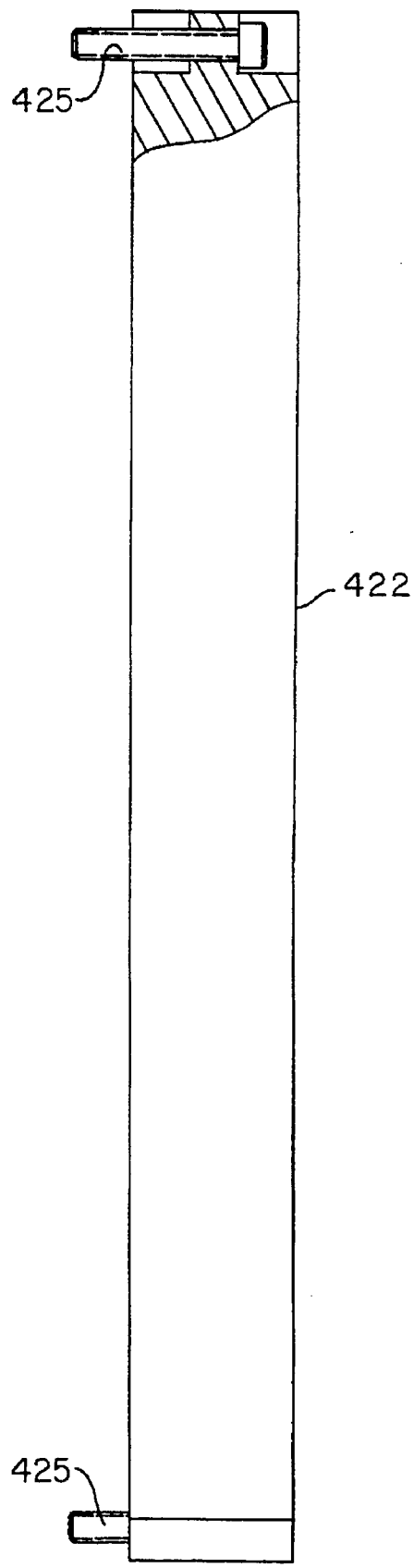
FIG. 33 is a side view of the receiver module probe assembly in the connector interface system.
Figure 32:
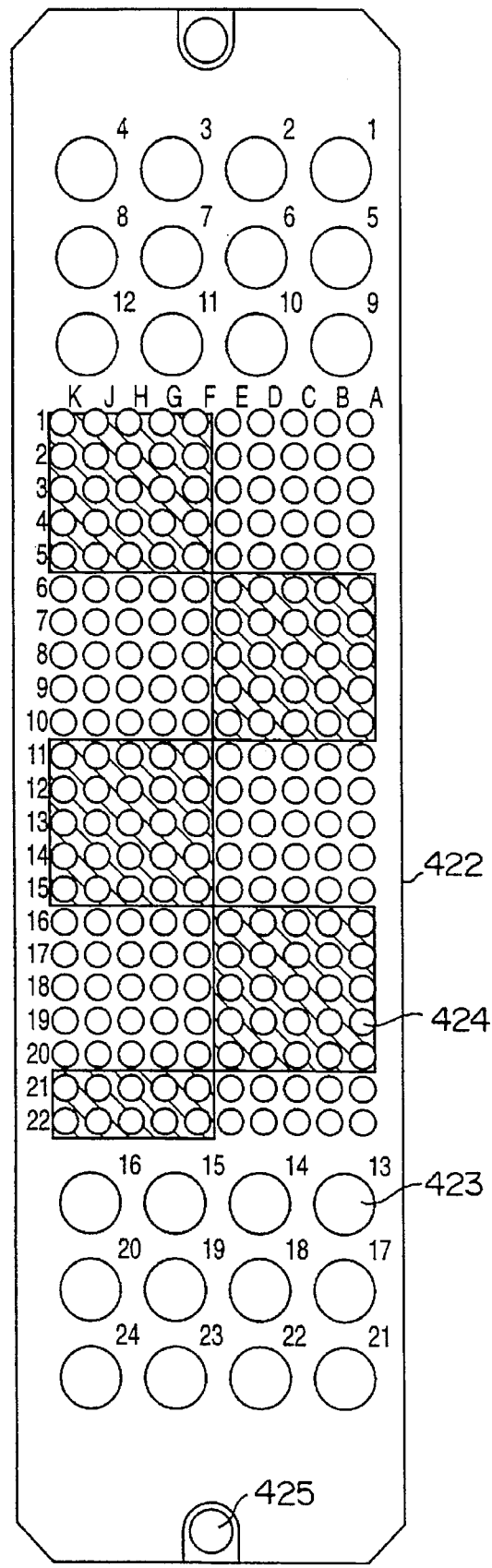
FIG. 32 is a top view of the receiver module probe assembly in the connector interface system.

FIGS. 32 and 33 are respective top and side views of a receiver module probe assembly which is secured to receiver module 410. As shown in FIGS. 32 and 33, receiver module probe assembly 422 includes various surfaces, or contact probes for connection to the receiver module probe assembly. For example, receiver module probe assembly 422 may include receiver probe coaxial twin access connector (TAC) mating surface 423 or receiver probe TAC mating surface 424. Receiver module probe assembly 422 further includes receiver module assembly mounting screw 425 for insertion in receiver mounting hole 441 for securing receiver module probe assembly 422 to receiver module 410.

FIGS. 34 and 35 are respective top and side views of the interchangeable test adaptor module probe assembly. As shown in FIGS. 34 and 35, interchangeable test adaptor module probe assembly 426 includes interchangeable test adaptor probe TAC 427 which provides the electrical connection with a TAC probe embedded therein with the TAC mating surface 424 (see FIG. 32), and coaxial TAC 428 permits electrical connection between a coaxial TAC embedded therein and coaxial mating surface 423 of the receiver module probe assembly 422 (see FIG. 32). Interchangeable test adaptor module probe assembly 426 also includes an interchangeable test adaptor module assembly mounting screw 429 which mounts the interchangeable test adaptor module probe assembly 426 to the interchangeable test adaptor module 400 via mounting bracket 406 and mounting hole 407 (see FIG. 29).

Accordingly, the use of interchangeable test adaptor module probe assembly 422 and receiver module probe assembly 426 facilitates the connection between the testing device and a unit under test since modules 422 and 426 organize and reliably establish electrical between the testing device and the unit under test.

Figure 36:
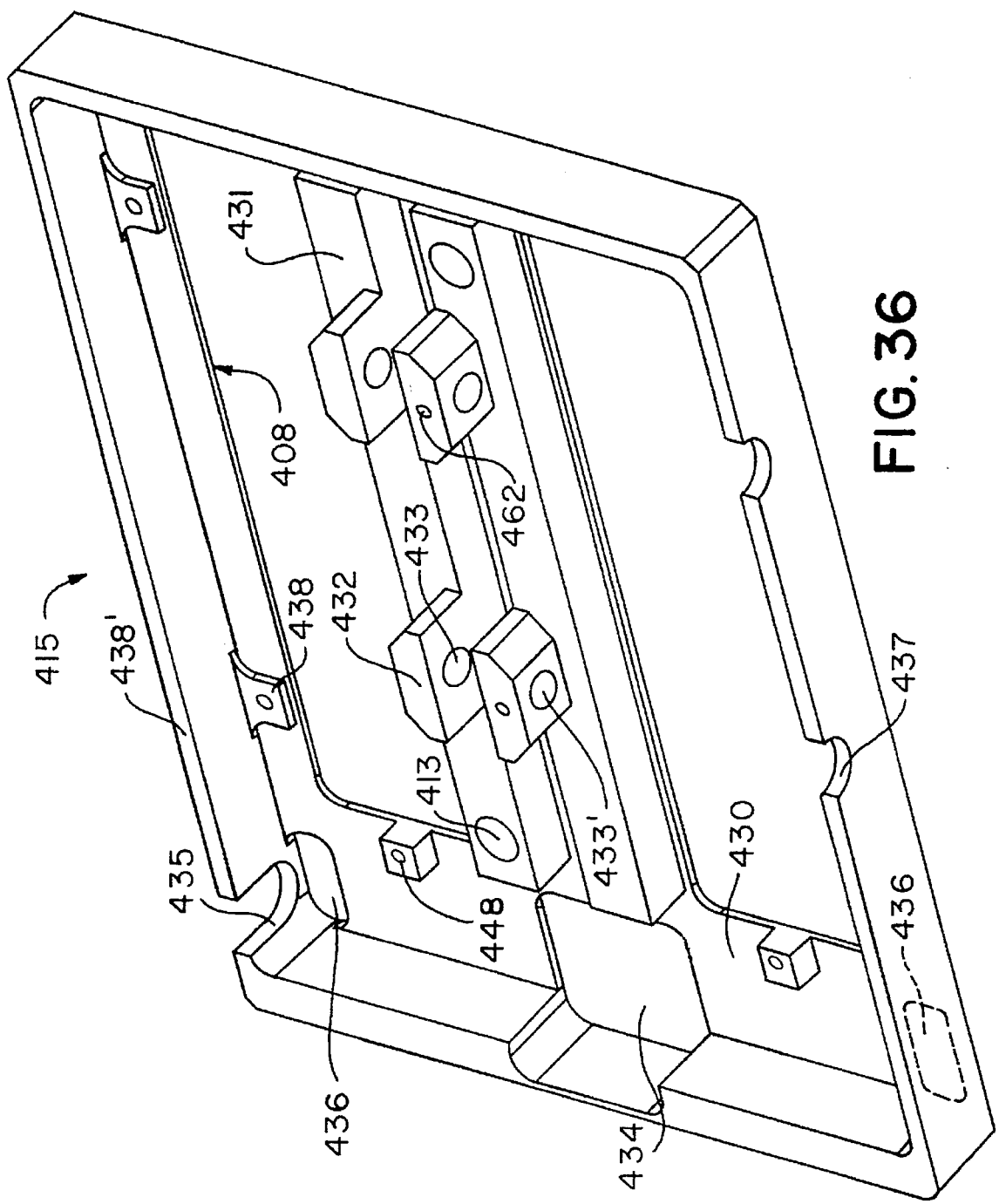
FIG. 36 is a bottom view of the top frame of the receiver module in the connector interface system.
Figure 37:
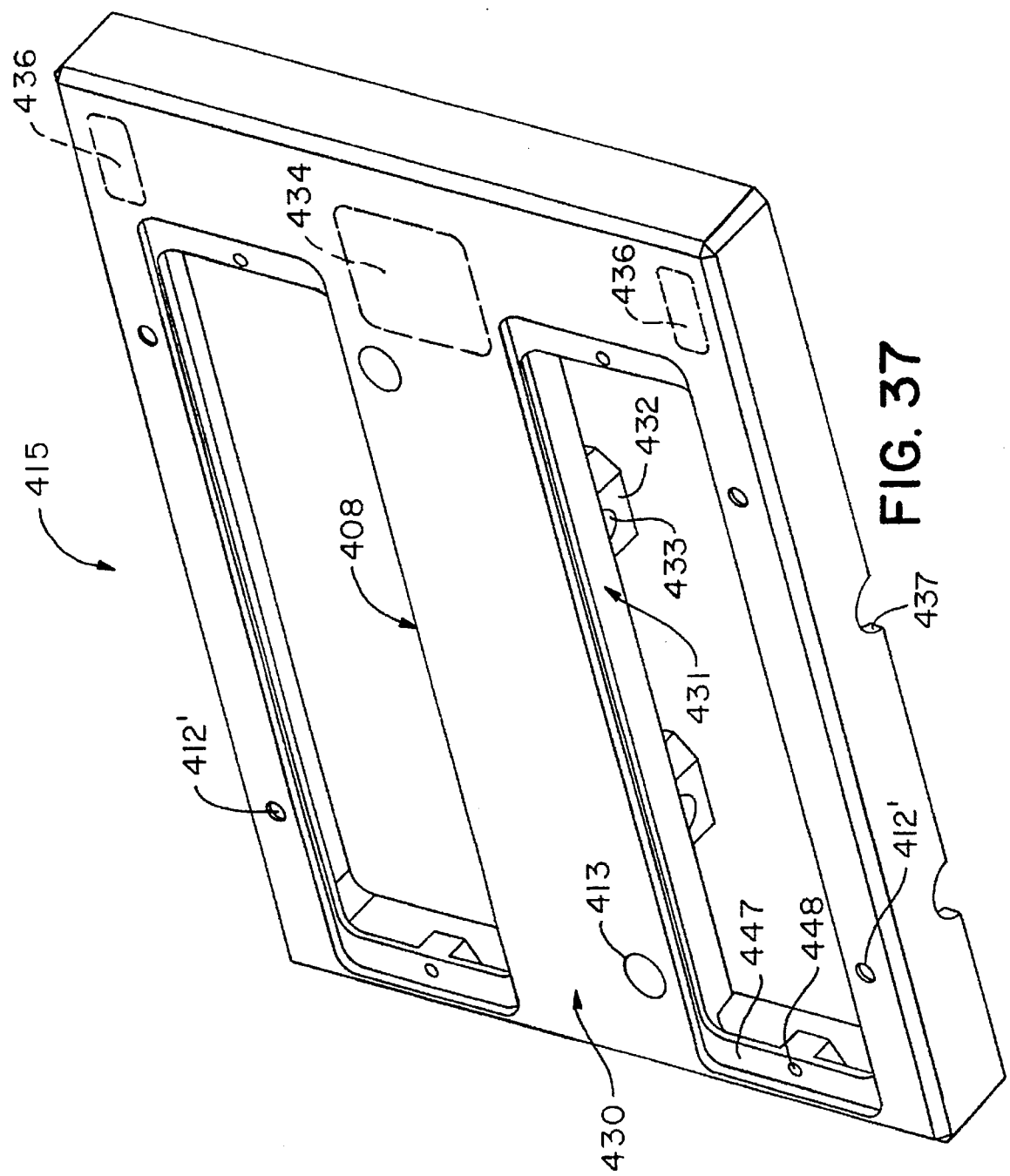
FIG. 37 is a top view of the top frame of the receiver module in the connector interface system.

FIGS. 36 and 37 are respective bottom and top views of the top frame of the receiver module in the connector interface system. As shown on FIGS. 36 and 37, top frame 415 includes main surface 430 with receiver module pockets 408. Male bayonets 412 (not shown) are inserted in male bayonet mounting holes 412' for securing receiver module 410 to interchangeable test adaptor module 400. Top frame 415 further includes top frame slide support 431 with slide guide projections 432 to stabilize the sliding mechanism (not shown) in receiver module 410. Slide guide projections 432 include top frame bearing holes 433, 433' which receive a slide bearing pin which is inserted through the slide mechanism in receiver module 410. Top frame bearing holes 433, 433' are preferably constructed so that a slide pin in threaded on the end which is inserted into hole 433 and is flat in the area between holes 433, 433' where the sliding mechanism is inserted in top frame 415. Top frame 415 also includes linkage pocket 434 and torsion shaft support clearance pockets 436 which provide additional clearance for the sliding mechanism linkage and torsion shaft when the sliding mechanism is used to engage the top frame 415 with bottom frame 414 of receiver module 410. Top frame 415 also includes torsion shaft access passage 435 which permits the torsion shaft to extend beyond top frame 415 for connection to handle 416 (not shown) to actuate the sliding mechanism in receiver module 410. Top frame 415 also includes slide bearing screw access holes 437 which permit access to the sliding pin which accesses slide bearing hole 433 of top frame 415. Advantageously, when the slide mechanism does not engage the bottom frame 414 and top frame 415, i.e., when handle 416 is open, slide bearing screw access hole 437 will provide access to the sliding pins which are inserted in slide bearing holes 433. In addition, top frame 415 includes main surface supports 438 for further securing the main surface to the peripheral structure 438' of top frame 415.

Figure 38:
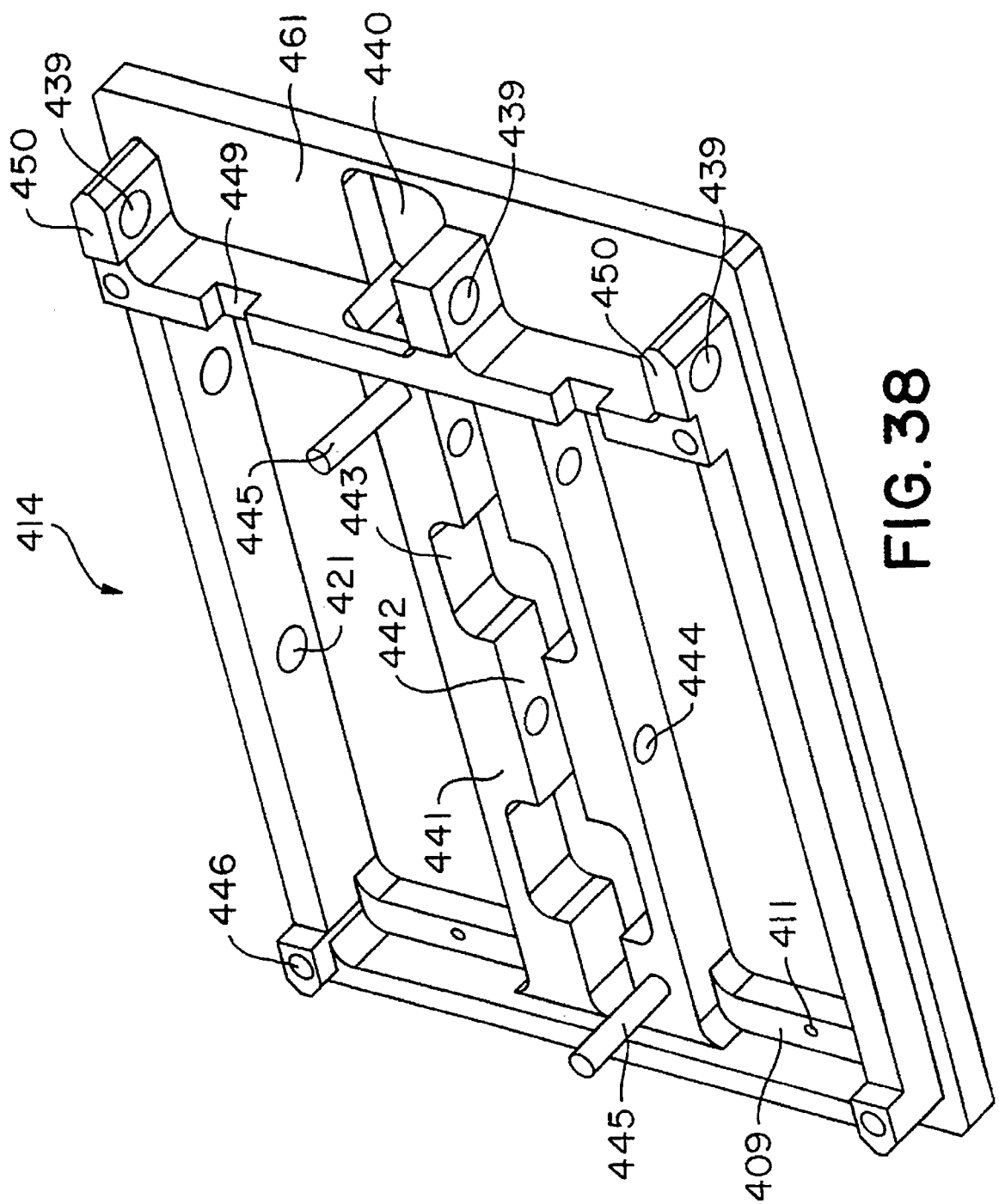
FIG. 38 is a top view of the bottom frame of the receiver module in the connector interface system.

FIG. 38 is a top view of the bottom frame of the receiver module in the connector interface system. As shown in FIG. 38, bottom frame 414 includes torsion shaft support 450 including torsion shaft hole 439 for receiving the torsion shaft of the sliding mechanism (not shown), and bottom frame linkage pocket 440 for providing additional clearance for the linkage of the sliding mechanism when actuated. Bottom frame 414 further includes opposite frame slide supports 441 forming slide pockets 442, and slide projection pockets 443 for receiving the slide guide projections 432 of upper frame 415 (see FIG. 36). This structural combination of slide supports 441 with projection pockets 443 of bottom frame 414 and slide supports 431 with projections 432 of top frame 415, advantageously provides a solid or secure frame around the sliding mechanism for consistently good performance by the sliding mechanism (see FIG. 39). Thus, the specific arrangement of bottom frame 414 with top frame 415 provides a unique structure for obtaining good slide performance.

Bottom frame 414 includes bottom frame slide bearing hole 444 for inserting therein a slide pin which permits the sliding mechanism to move with respect to bottom frame 414. Bottom frame 414 also includes alignment pins 445 which when the bottom frame 414 and top frame 415 are engaged with interchangeable test adaptor module 400 protrude through bushing hole 413 of top frame 415 and through bushing clearance hole 405 of interchangeable test adaptor module 400, thereby further aligning bottom frame 414 and top frame 415 with interchangeable test adaptor 400 to insure proper alignment and engagement of receiver module probe assembly 422 (see FIG. 32) with interchangeable test adaptor test assembly 426 (See FIG. 34). Alternatively, bottom frame 414 may include a bushing hole, and top frame 415 may include the alignment pin, thereby guiding the engagement of top frame 415 with respect to bottom frame 414. Bottom frame 414 also includes spring cavity 446 for outwardly biasing bottom frame 414 against top frame 415 for insuring a slow and smooth engagement between bottom frame 414 and top frame 415 when the sliding mechanism is actuated by handle 416 (not shown). Bottom frame 414 also includes notches 449 for insuring proper clearance between bottom frame 414 and receiver module mounting hole 411 of top frame 415 (see FIG. 36).

Figure 39:
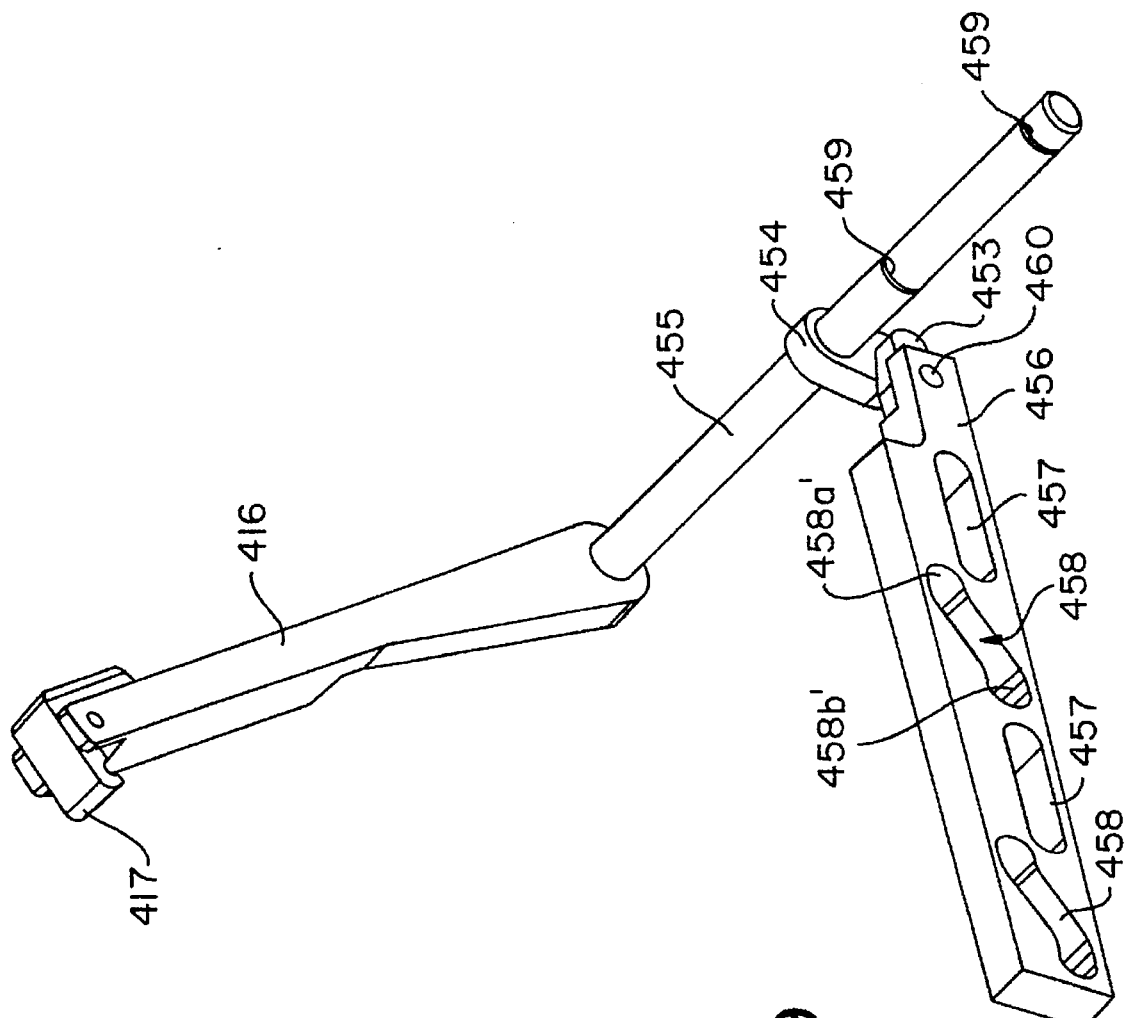
FIG. 39 is a top view of the receiver module with the top and bottom frames engaged illustrating the linkage in the connector interface system.

FIG. 39 is a detailed isometric view of the sliding mechanism in the connector interface system. As shown in FIG. 39, the sliding mechanism includes shaft 455 which is fixed to shaft link 454. Shaft link 454 is rotatably connected to slide link 453. Upon the rotation of shaft link 454 which is responsive to the rotational movement of handle 416 and shaft 455, shaft link 454 will then cause slide link 453 to rotate with respect to shaft link 454 and slide 456. Slide link 453 is connected to slide 456 via slide link pin 460. Accordingly, rotation of shaft link 454 will drive slide link 453 which will drive slide 456 in the forward or reverse direction in response to the movement of handle 416. Slide 456 includes slide transverse hole 457 and slide diagonal hole 458. Slide diagonal hole 458 includes unengaged portion 458a and engaged portion 458b. The degree of slope for diagonal holes 458 may be varied according to need. A slope of between approximately 30° to 45° has worked satisfactorily.

As will be discussed greater detail, bottom frame 414 is slidably connected to slide 456 via pins which slide transversely in slide transverse holes 457. Top frame 415, on the other hand, is slidably secured to slide 456 via slide pins in the in top frame 415 which are inserted in slide diagonal hole 458. When the slide pins of top frame 415 are positioned in slide unengaged portion 458a, bottom frame 414 and top frame 415 are not engaged. When handle 416 actuates torsion shaft 455 which causes slide 456 to move in the direction toward torsion shaft 455, top frame 415 will slide diagonally downward with respect to slide diagonal hole 458 until top frame 415 engages bottom frame 414 in a vertical downward direction via the slide pins of top frame 415 engaging the slide engaged portions 458b. This dual link mechanism, i.e. slide link 453 and shaft link 454 provides the unique advantage of distributing the rotational force generated by handle 416 in a uniform and continuous manner, thereby providing a distributed and substantially uniform force generated by the sliding mechanism. As a result, the slide mechanism will exert a uniform and continuous force on bottom frame 414 when bringing bottom frame 414 in engagement with top frame 415 of receiver 410 and in engagement with the interchangeable test adaptor 400. Since the sliding mechanism provides this distributed and even force when engaging the various electrical connectors, the entire connection interface system is more durable and has a much longer useful life. Torsion shaft 455 also includes shaft stops 459 which prevent shaft 455 from sliding beyond the appropriate position of torsion shaft holes 439 (see FIG. 40 below).

Figure 40:
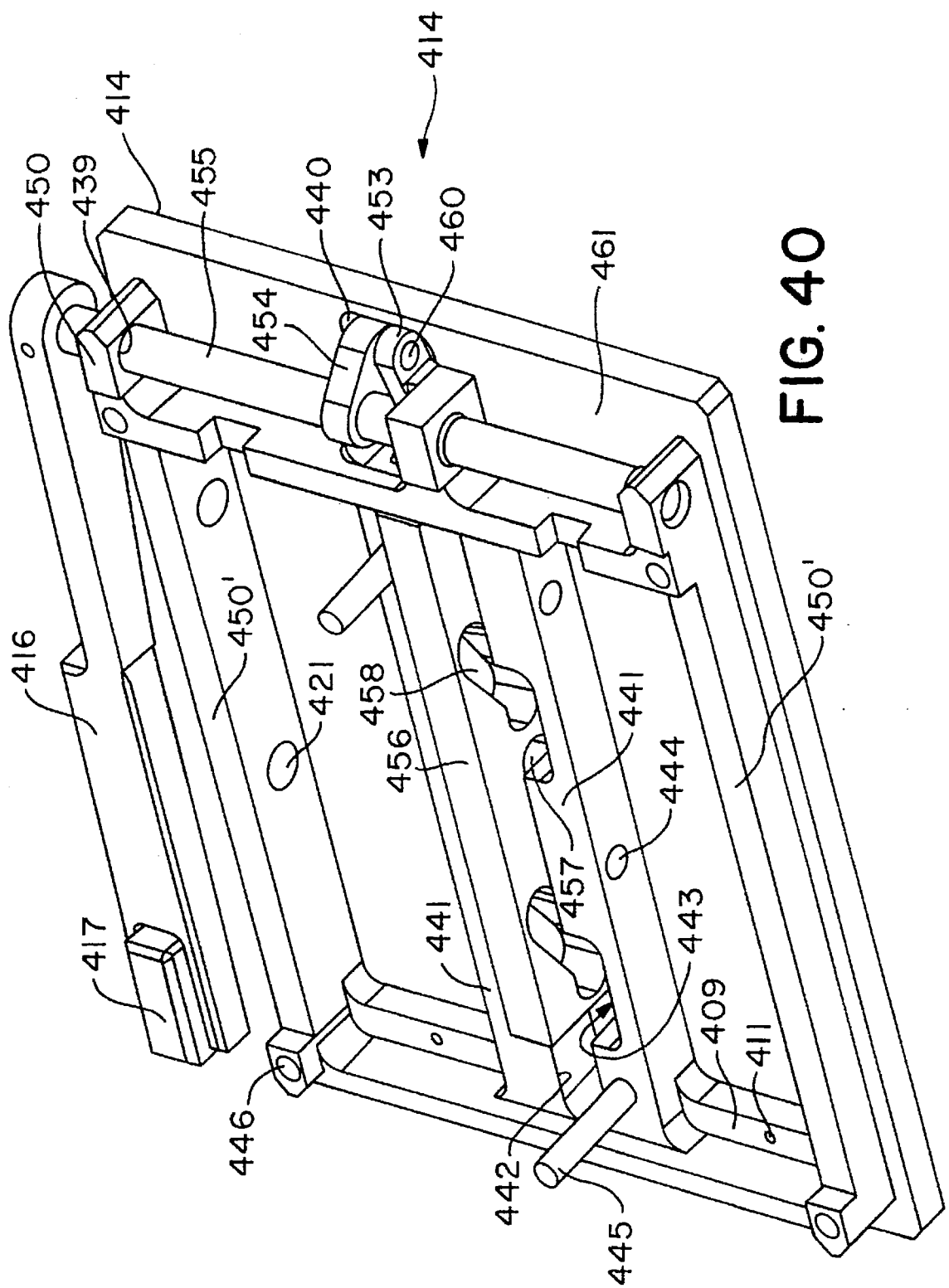
FIG. 40 is a detailed isometric view of the sliding mechanism of the receiver module in the connector interface system.
Figure 41:
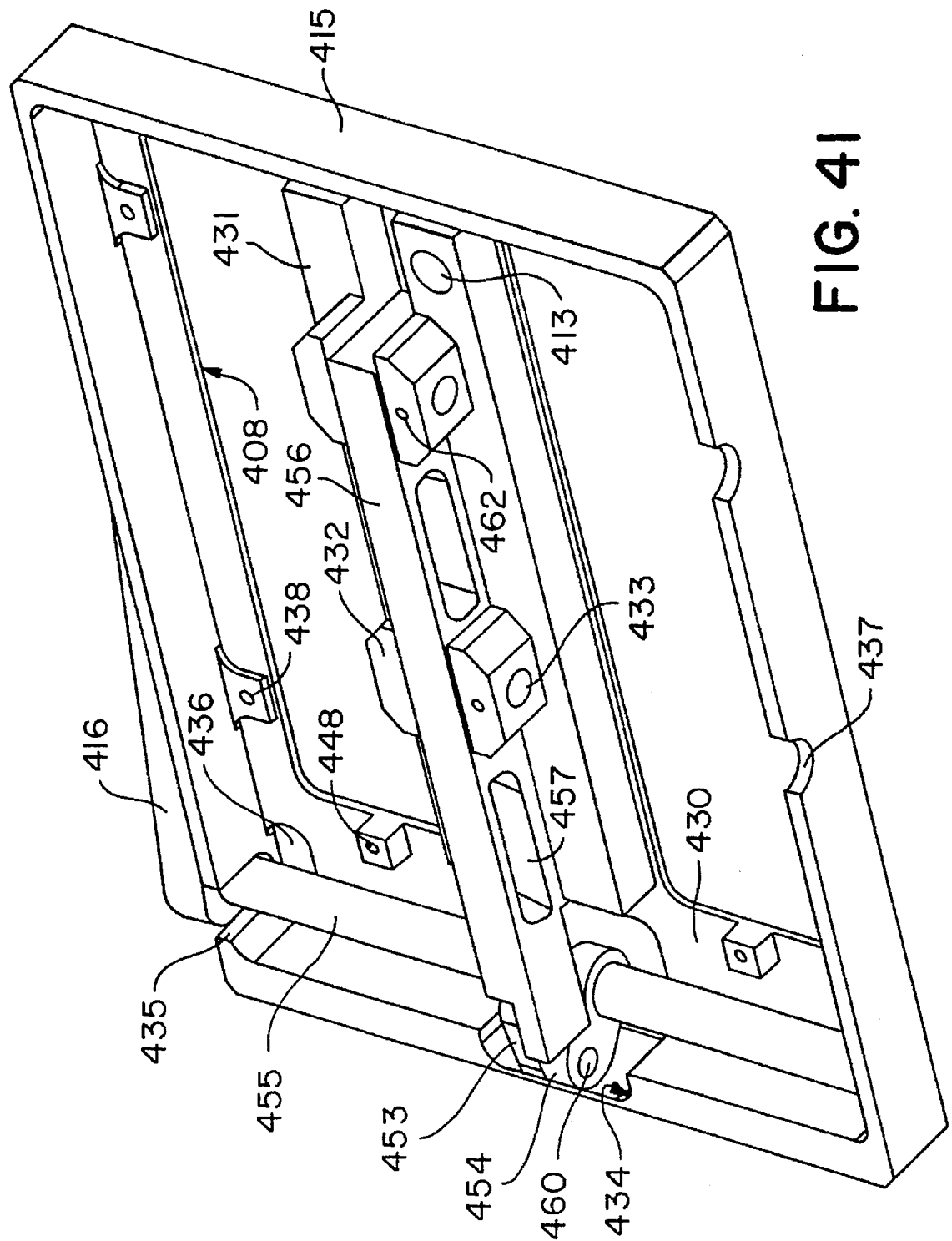
FIG. 41 is a top view of the bottom frame of the receiver module with the handle and linkage connected to the bottom frame in the connector interface system.
Figure 42:
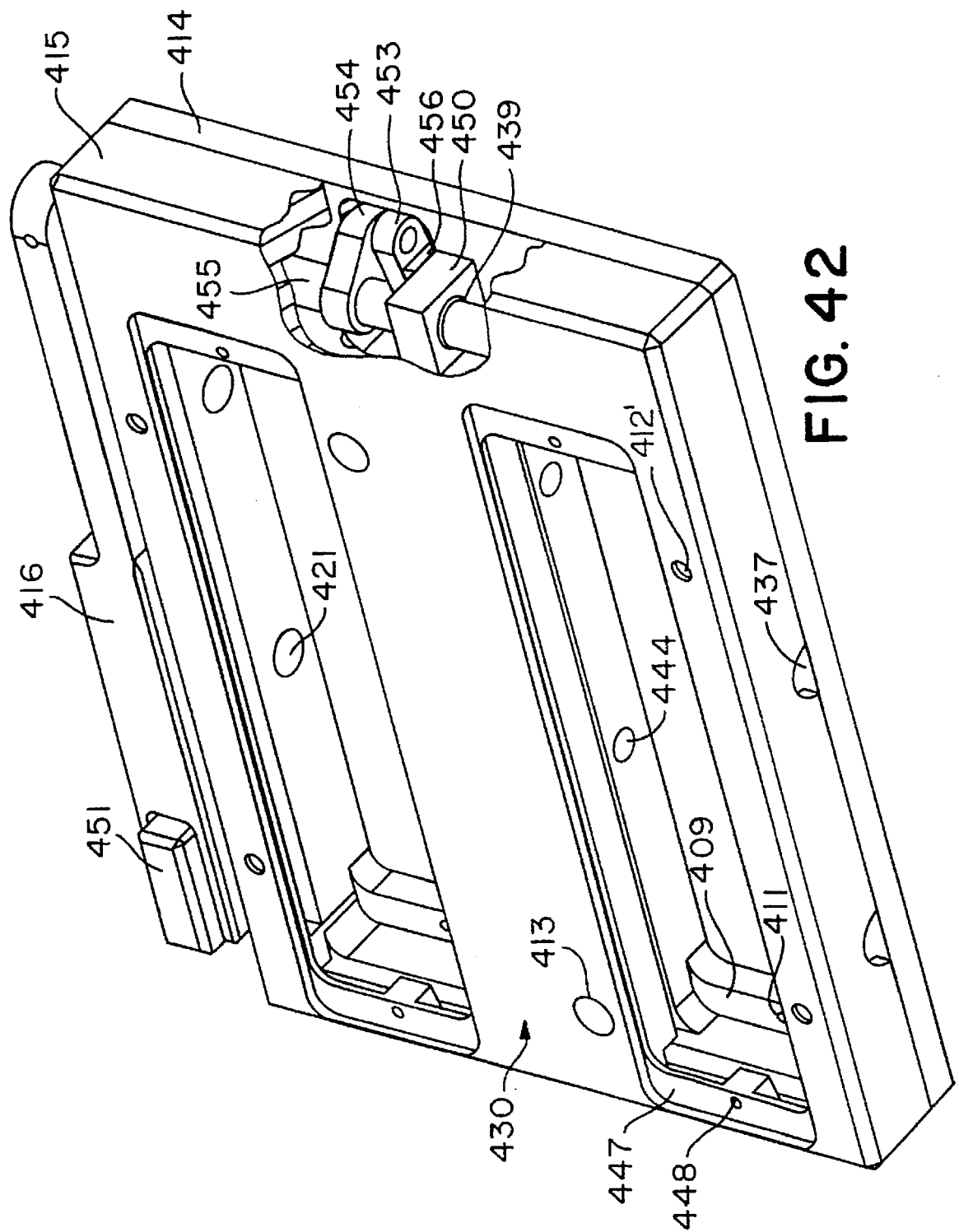
FIG. 42 is a bottom view of the top frame of the receiver module with the handle and linkage connected to the top frame in the connector interface system.
Figure 43:
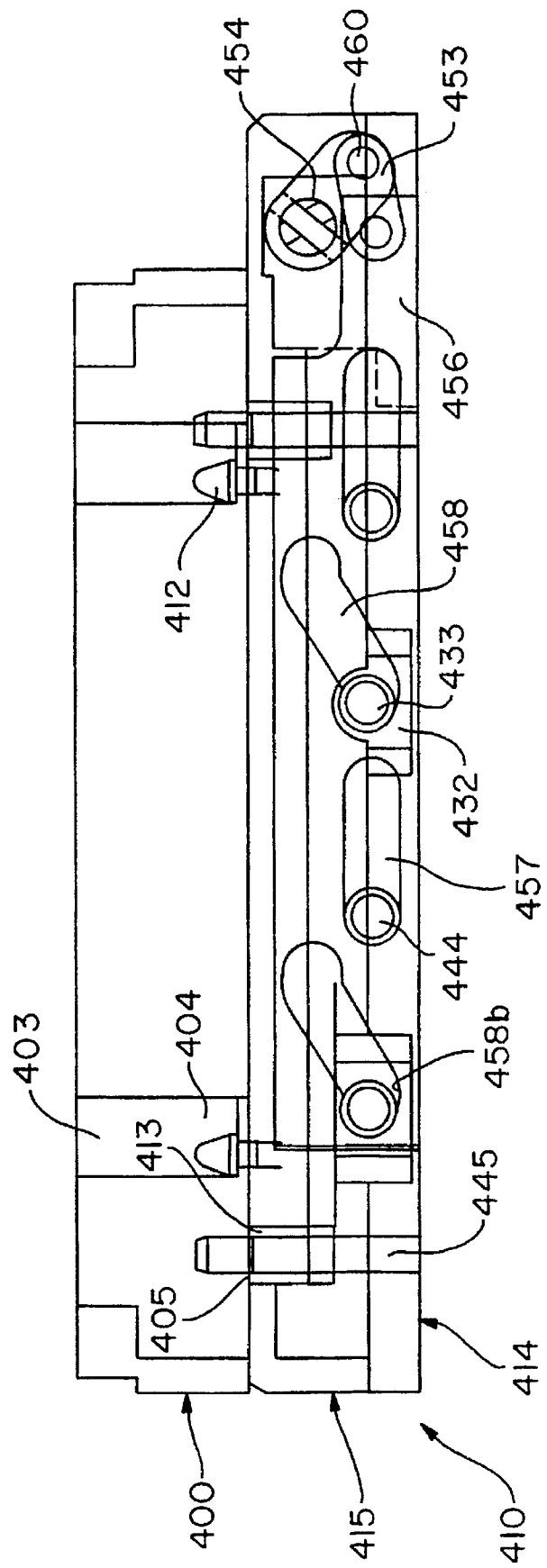
FIG. 43 is a side sectional view of the interchangeable test adaptor and receiver module engaged in the connector interface system.

FIGS. 40–43 show the various details of the slide mechanism and the connector interface system. FIG. 40 is a top view of the bottom frame of the receiver module with the slide mechanism connected thereto. FIG. 41 is a bottom view of the top frame of the receiver module with the slide mechanism connected thereto. FIG. 42 is a top view of the receiver module with the top and bottom frames engaged and with the slide mechanism connected both to the top and bottom frames. FIG. 43 is a side sectional view of the slide mechanism showing the receiver and interchangeable test adaptor modules engaged. As shown in FIG. 40, bottom frame main surface 461 secures torsion shaft supports 450 and bottom frame peripheral supports 450', thereby permitting torsion shaft 455 to rotate with respect to torsion shaft support 450 and torsion shaft holes 439. Slide 456 is disposed in bottom frame slide pocket 442. Bottom frame slide bearing holes 444 include pins which are inserted therein and through slide transverse holes 457 for permitting slide 456 to slide in the transverse direction with respect to bottom frame 414. The remaining features of FIG. 40 have already been described. As shown in FIG. 41, slide 456 is disposed between top frame slide supports 431 and slide guide projections 432. Slide pins are then inserted in slide bearing hole 433 through slide diagonal hole 458 (see FIG. 40) which then causes top frame 415 to move with respect to the bottom frame 414 in a diagonal manner upon activation of slide 456 via torsion shaft 455 and handle 416. As indicated in connection with FIGS. 36 and 37, the slide pins which are used to slidably fix slide 456 to slide projections 432 and slide supports 441 are preferably constructed to be threaded on one end for insertion as described, and smooth on the end which engages slide transverse hole 457 and slide diagonal hole 458. The slide pins are also grooved on the end which is not fixed to the bottom frame 414 or top frame 415 for easy removal using, for example, a screwdriver which obtains access to the slide pins via slide bearing screw access hole 437. The slide pin which is inserted top frame slide bearing hole 433 through slide diagonal hole 458 is secured to slide guide projections 432 via set screw 462 which prevents the slide pin from exiting. This specific arrangement or construction of the slide pins as connected to bottom frame 414 and top frame 415, provides an efficient and cost effective receiver module 410. Further, the strategic positioning of slide bearing screw access holes 437 facilitates the assembly of the receiver module 410 without creating unnecessary or burdensome manufacturing steps. Thus, screw access holes 437 are very useful in the overall receiver module 410 structure. The remaining elements of FIGS. 40-41 have been previously discussed.

FIG. 42 illustrates the receiver module with the top and bottom frames engaged while revealing slide link 453 and shaft link 454. The remaining elements of FIG. 42 have been discussed previously. FIG. 43 is a side sectional view of the slide mechanism when interchangeable test adaptor and receiver are engaged. As shown in FIG. 43, male bayonets 412 are engaged in female bayonet mounting holes 404, and alignment pin 445 protrudes through bushing hole 413 of top frame 415 and bushing hole 405 of interchangeable test adaptor 400, thereby providing a secured and aligned connection between interchangeable test adaptor 400 and receiver 410. In addition, the slide pins of top frame 415 are inserted in slide bearing hole 433 and are engaged in slide engaged portion 458b of slide diagonal hole 458. In addition, the slide pins for bottom frame 414 are inserted in bottom frame slide bearing holes 444 which are engaged in slide transverse hole 457. The remaining elements of FIG. 43 have been previously discussed, and need not be discussed here in detail.

Figure 44:
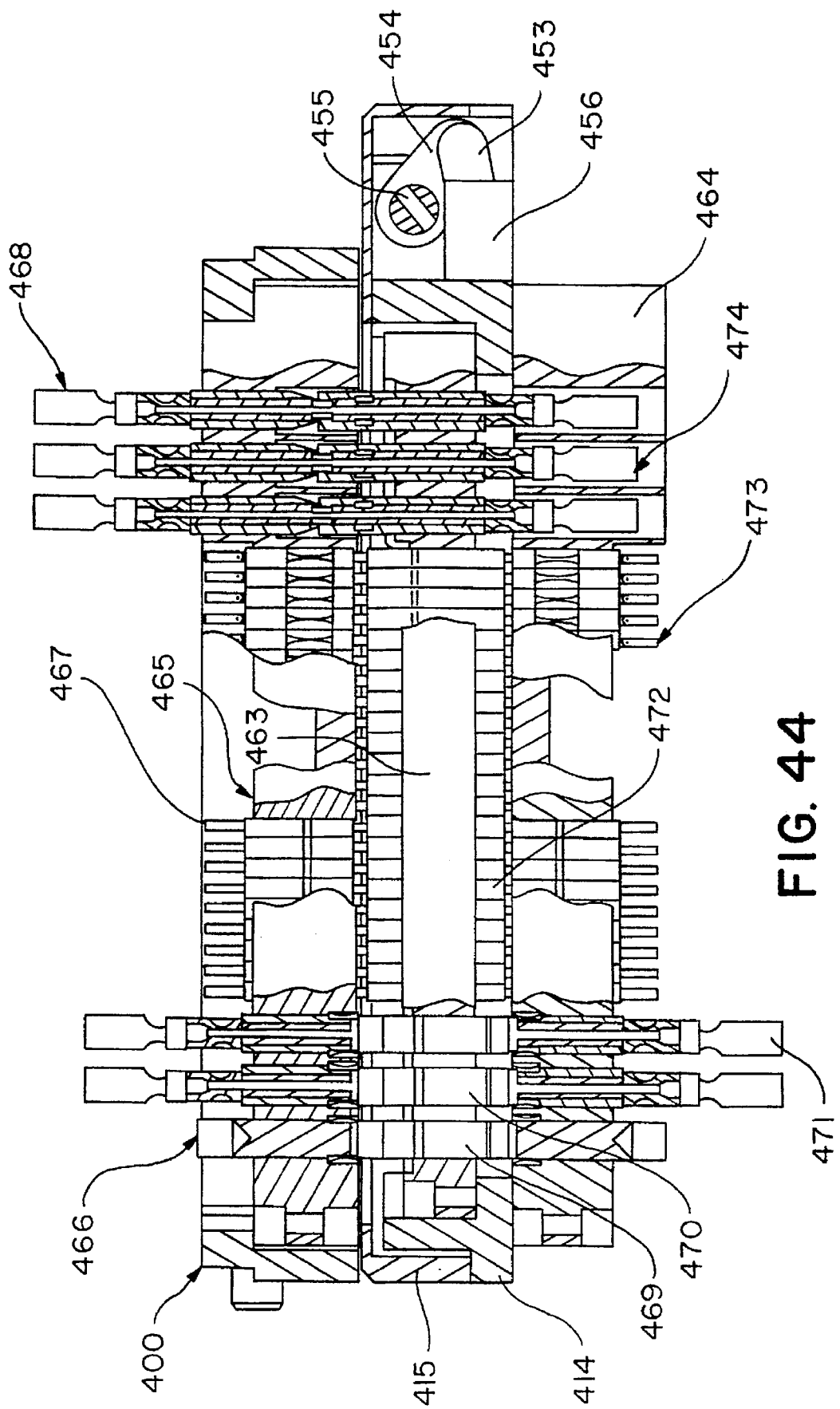
FIG. 44 is a side sectional view of the interchangeable test adaptor and receiver module engaged illustrating different contact probes.
Figure 45:
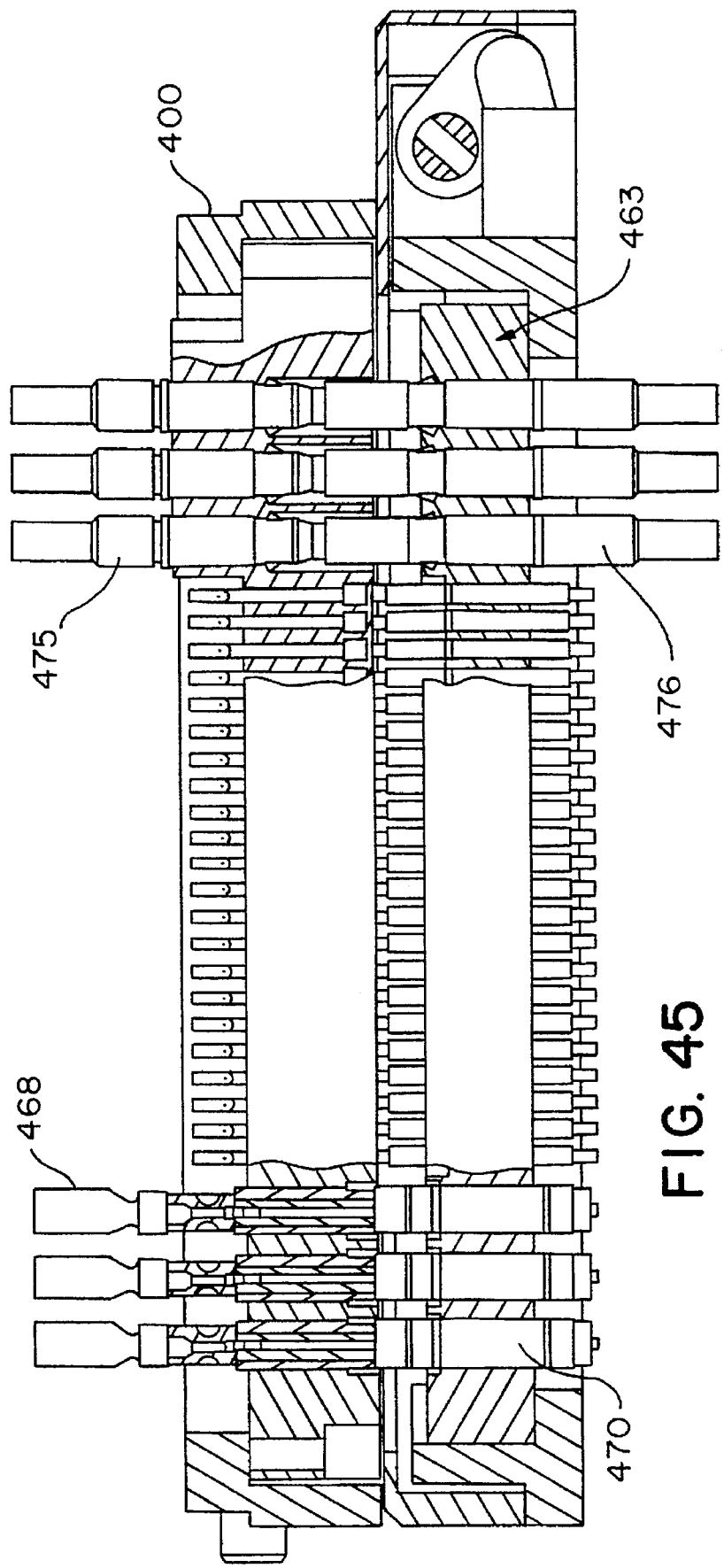
FIG. 45 is a side sectional view of the interchangeable test adaptor and receiver module engaged illustrating different contact probes.
Figure 46:
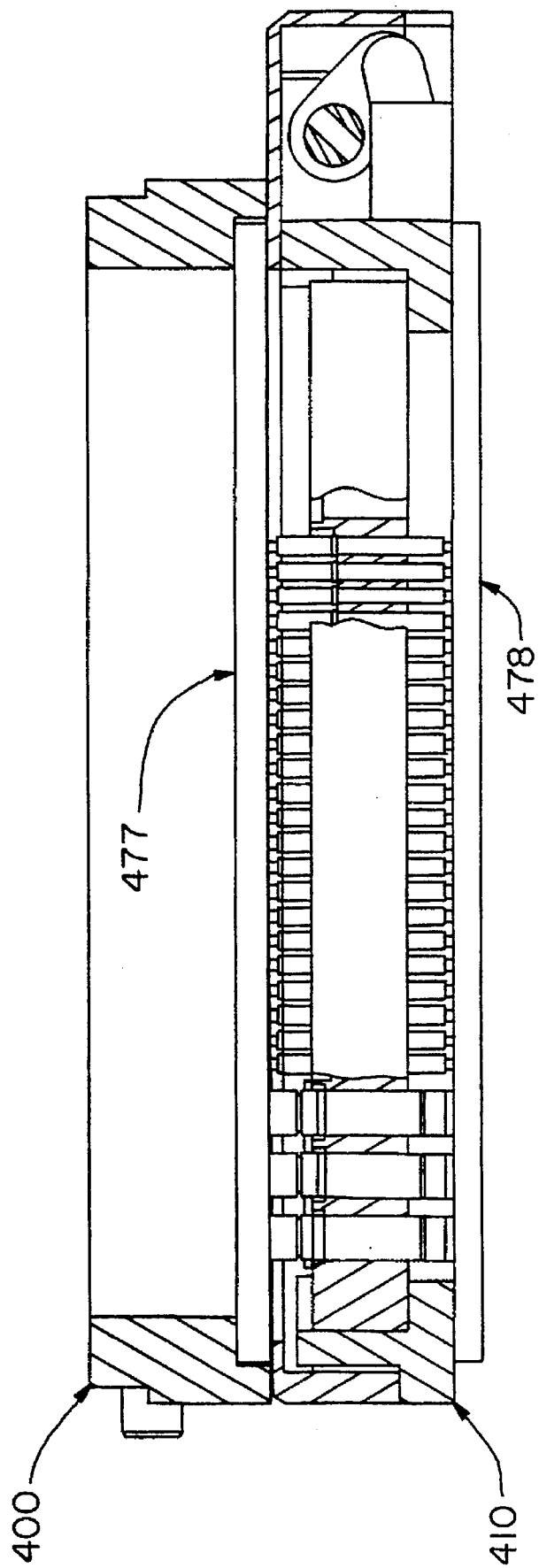
FIG. 46 is a side sectional view of the interchangeable test adaptor and receiver module engaged electrically connecting printed circuit boards.

FIGS. 44-46 are side sectional views of the interchangeable test adaptor and receiver module engaged with different connection schemes or arrangements. As shown in FIG. 44, receiver module 463 includes receiver wiring module 464 connected thereto. Receiver module 463 includes twin access connector (TAC) contact 472, TAC power contact 469 and TAC coax contact 470 for electrically connecting interchangeable test adaptor wiring module 465 with receiver wiring module 464. Receiver wiring module 464 includes coax surface contact 471, snap-in signal surface signal contact 473 and female mini-coax contact 474 for connection between the device or unit under test and receiver module 463. In addition, interchangeable test adaptor module 400 includes power surface contact 466, press-in signal surface contact 467 and male mini-coax TAC 468 for connection between the interchangeable test adaptor 400 and the testing device. FIG. 45 is an illustration of a similar connection scheme as shown in FIG. 44, where FIG. 45 further includes male mini-coax contact 475 for connection between the testing device and the interchangeable test adaptor 400, and female mini-coax contact 476 for connection between receiver module 463 and the unit under test. FIG. 46 further illustrates electrically connecting two printed circuit boards 477 and 478 together via the twin access connectors utilized in receiver module 463.

Figure 47:
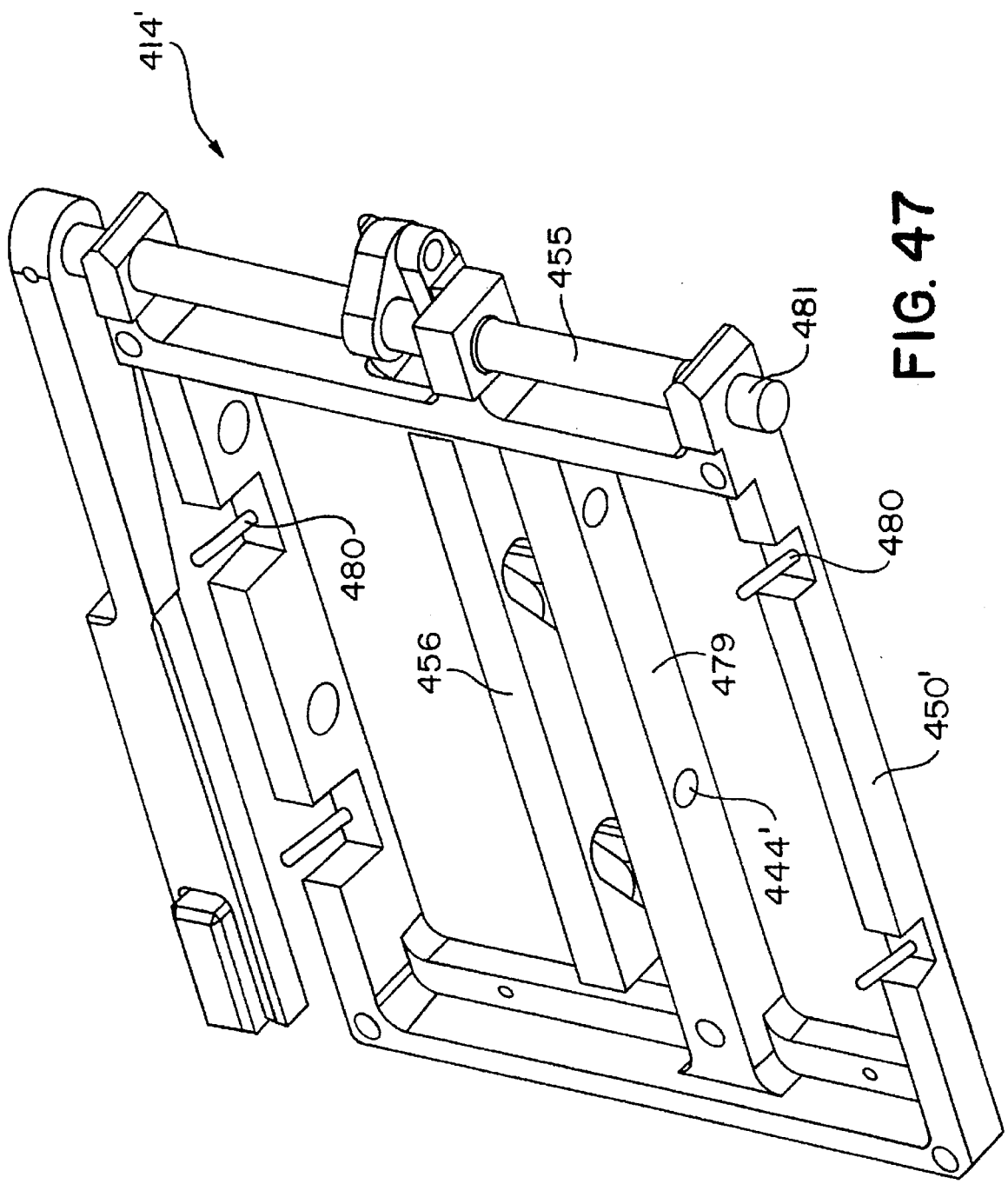
FIG. 47 is a top view of a second embodiment of the bottom frame of the receiver module in the connector interface system with the handle and linkage connected to the bottom frame.
Figure 48:
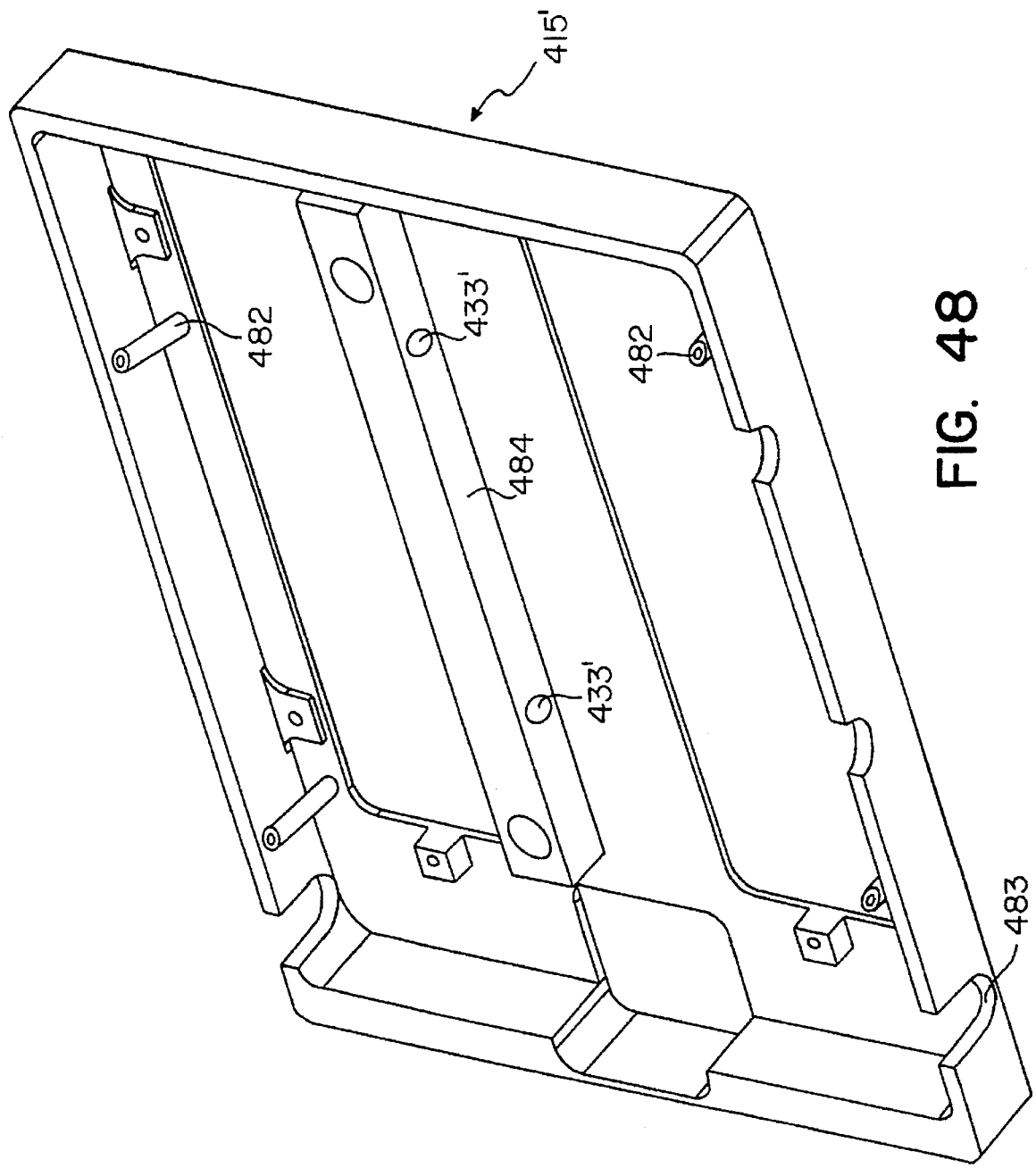
FIG. 48 is a bottom view of a second embodiment of the top frame of the receiver module in the connector interface system.

FIGS. 47 and 48 are illustrations of a second embodiment of the receiver module of the connection interface system. FIG. 47 is a top view of a second embodiment of the bottom frame of the receiver module with the sliding mechanism connected thereto. As shown in FIG. 47, guide pins 480 are connected to bottom frame peripheral supports 450' for guiding bottom frame 414' into top frame 415'. Bottom frame 414' includes single bottom frame slide support 479 which supports slide 456 from one side. Torsion shaft 455 further includes protruding portion 481 which rests in additional torsion shaft access passage 483 of top frame 415' (see FIG. 48). FIG. 48 is a bottom view of a second embodiment of the top frame of the receiver module. As shown in FIG. 48, top frame 415' includes top frame guide holes 482 for receiving bottom frame guide pins 480 (shown in FIG. 47) thereby guiding the top frame 415' and bottom frame together. In addition, top frame 415' includes additional torsion shaft access passage 483 for receiving the protruding portion 481 of torsion shaft 455. Top frame 415' also includes top frame slide support 484 having slide bearing holes 433'. Similar to the first embodiment of the connection interface system, bottom frame slide bearing holes 444' will be connected to the slide pins that are inserted in transverse holes 457 of slide 456 (shown in FIG. 39). In addition, top frame 415' includes slide pins which are inserted in slide diagonal holes 458 via slide bearing holes 433'. These slide pins may preferably be flat headed screws which are threaded for insertion into slide bearing holes 433' of top frame 415', and bottom frame slide bearing holes 444' of bottom frame 414'. This specific arrangement of slide support 484 in top frame 415' with slide support 479 in bottom frame 414' provides a secure frame like structure surrounding slide 456 in a similar manner as the first embodiment. However, this second embodiment does not require the double frame support as in the first embodiment (see FIGS. 36-38), thereby sacrificing some structural support for a simple receiver construction.

FIGS. 49-50 are respective top and side views of a double receiver module in the connection interface system. As shown in FIGS. 49 and 50, double receiver 410' preferably comprises the combination of two single receiver modules 410 as discussed previously (see FIG. 30). Single receiver modules 410 are coupled together at junction 486. Each of the individual receiver modules 410 include top frame 415 and bottom frame 414 as previously discussed. The bottom frame 414 of each of receiver modules 410 are coupled or connected to bottom frame joining plate 485 to stabilize the overall double receiver module 410'. Double receiver module 410' also includes handle 416 which is used to simultaneously engage the multiple contacts for both of the individual receiver modules 410, as discussed below.

Figure 52:
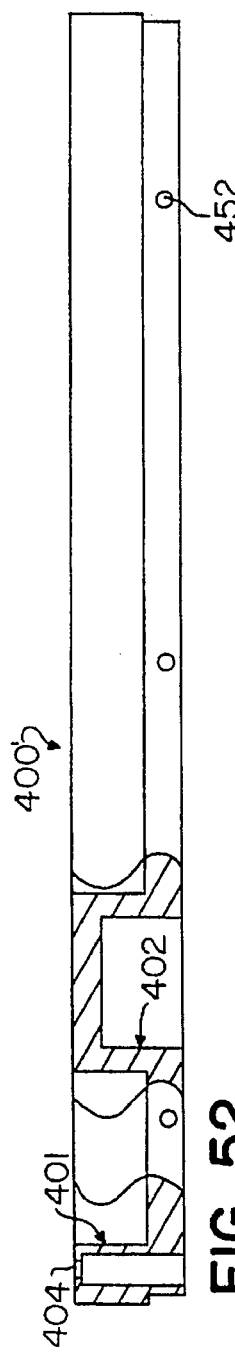
FIG. 52 is a side sectional view of a double interchangeable test adaptor in the connector interface system.
Figure 51:
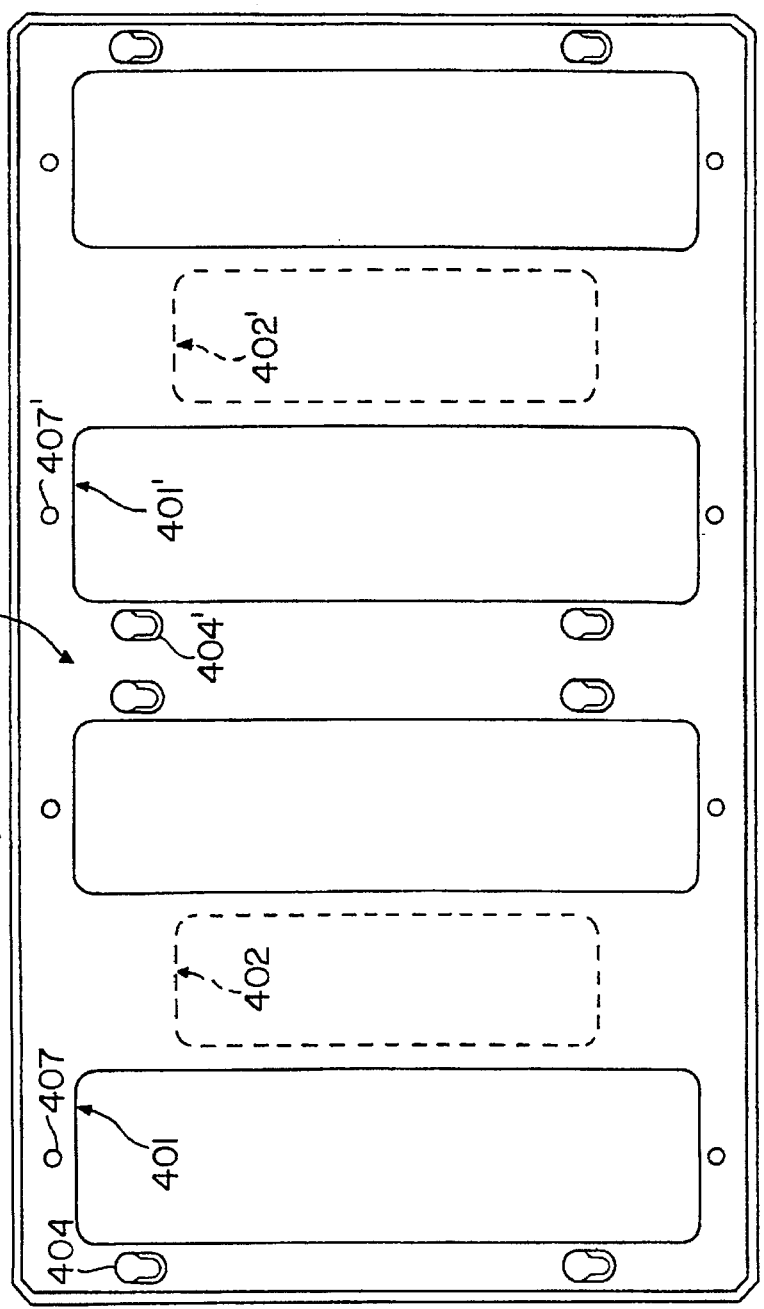
FIG. 51 is a bottom view of a double interchangeable test adaptor in the connector interface system.
Figure 53:
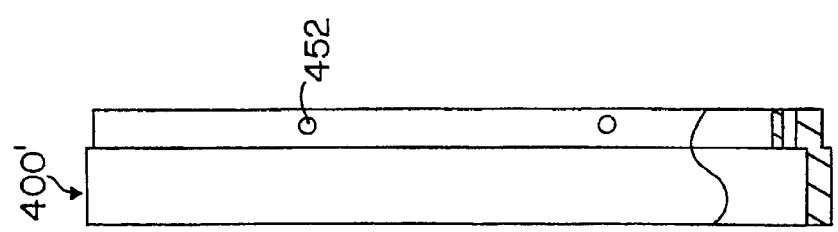
FIG. 53 is a side sectional view of a double interchangeable test adaptor in the connector interface system.

FIGS. 51-53 are respective bottom and side sectional views of the double interchangeable test adaptor in the connection interface system. As shown in FIGS. 51-53, double interchangeable test adaptor 400' includes an integrated main surface 487 which is twice the size of the previously discussed interchangeable test adaptor 400 (see FIG. 29). Integrated main surface 487 preferably includes two pairs of interchangeable test adaptor module pockets 401, 401', as well as two weight reducing pockets 402, 402'. Further, integrated main surface 487 includes two sets of female bayonet mounting holes 404, 404', for maintaining a suitable, flat engagement between interchangeable test adaptor module 400' and double receiver module 410'. Integrated main surface 487 also includes two sets of interchangeable test adaptor module mounting holes 407, 407' for mounting interchangeable test adaptor module probe assemblies (see FIG. 34). As similarly provided in single interchangeable test adaptor module 400 (see FIG. 29), cover mounting holes 452 are provided on the side of double interchangeable test adaptor 400' for mounting an external cover to substantially protect the delicate wiring required between the testing device and the interchangeable test adaptor module probe assembly.

Figure 54:
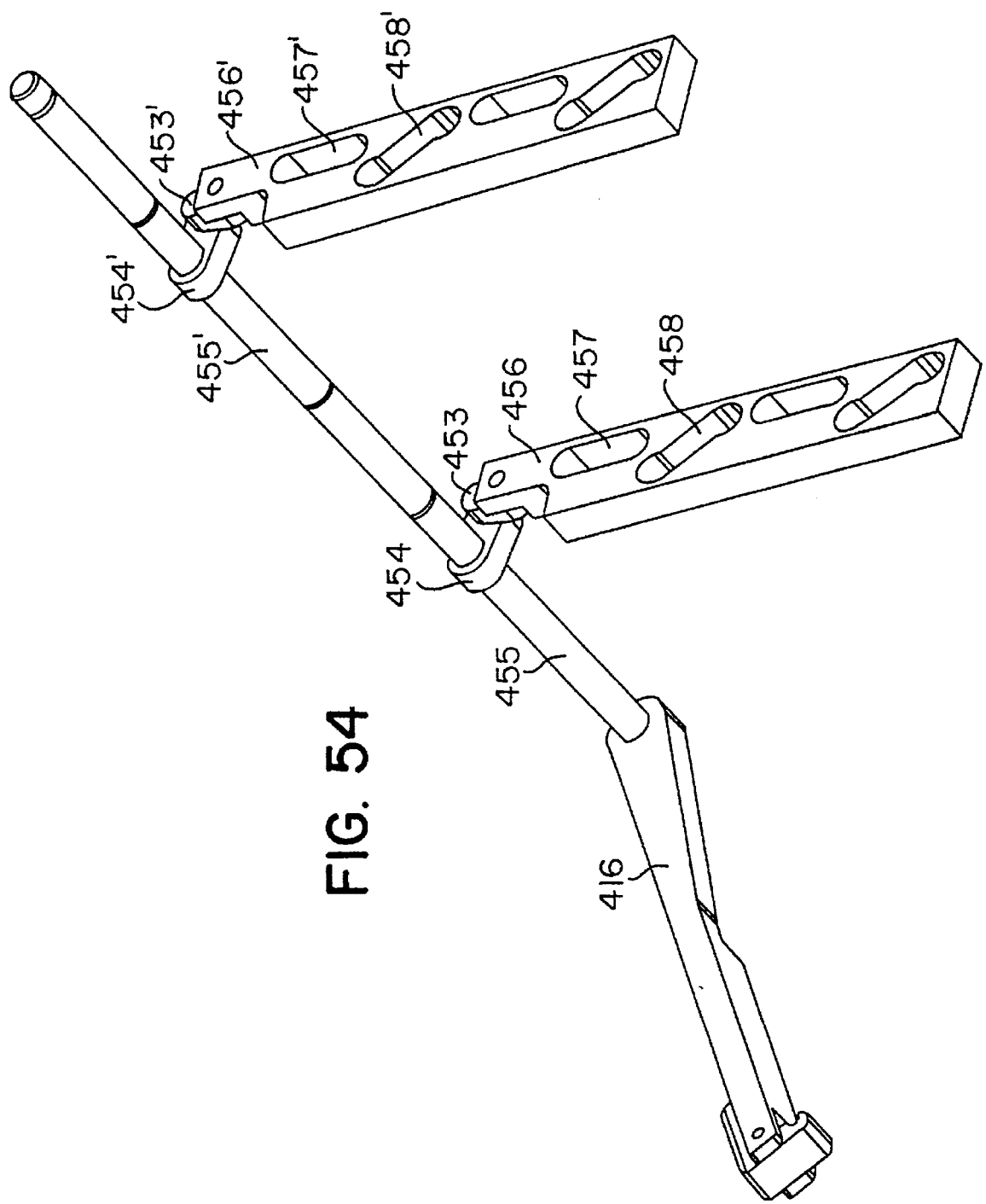
FIG. 54 is a detailed isometric view of the sliding mechanism for a double receiver module in the connector interface system.

FIG. 54 is a detailed isometric view of a double slide mechanism of the double receiver module in the connection interface system. As shown in FIG. 54, the double slide mechanism includes handle 416 connected to shafts 455, 455'. Shaft links 454, 454' are connected respectively to shafts 455, 455' and rotate in response to the rotation of shafts 455, 455' and handle 416. Shaft links 454, 454' are respectively rotatably connected to slides 456, 456' via slide links 453, 453'. Slides 456, 456' respectively contain or include slide transverse holes 457, 457' and slide diagonal holes 458, 458' as previously discussed (see FIG. 39).

Figure 55:
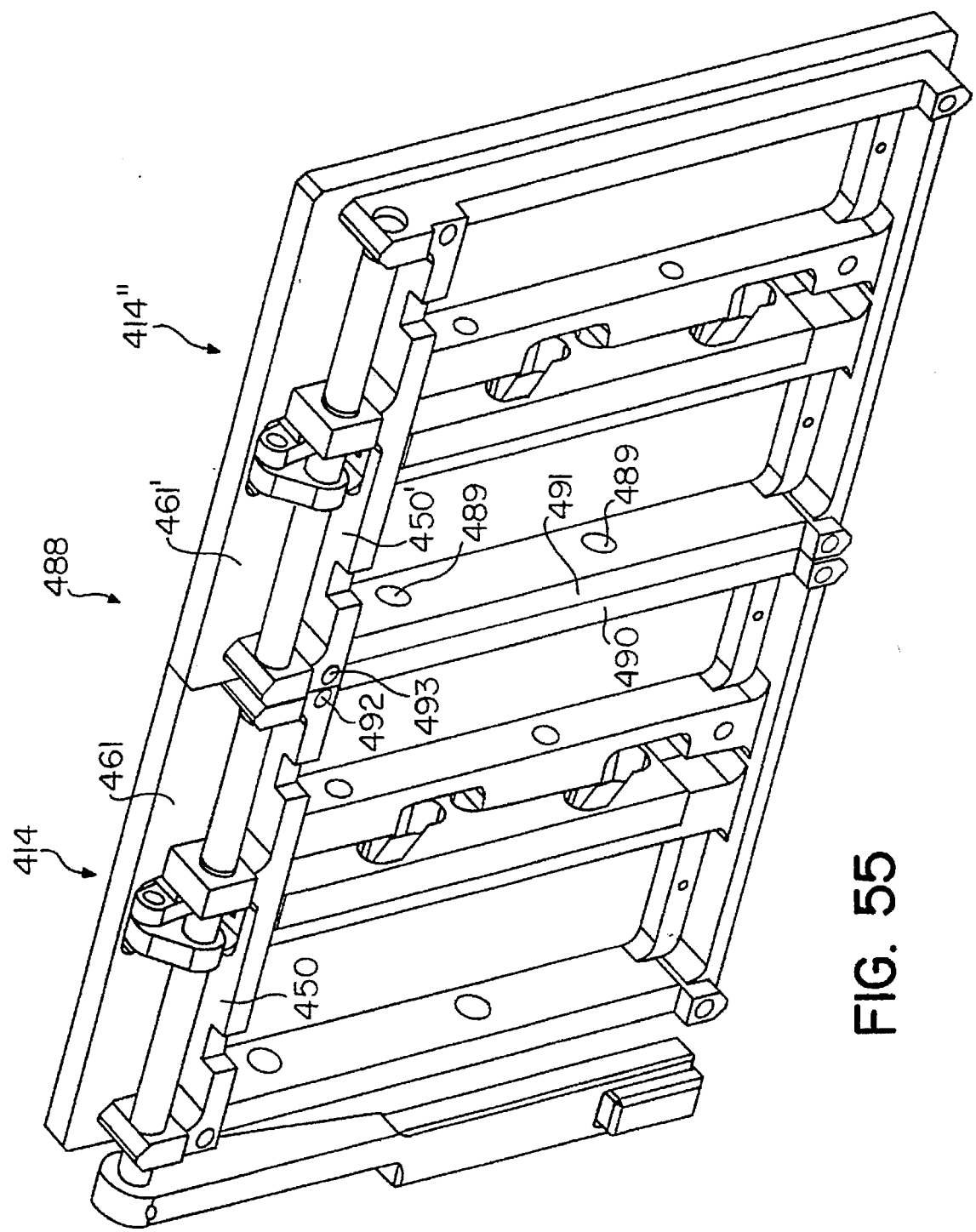
FIG. 55 is a top view of the bottom frame of a double receiver module in the connector interface system.

FIG. 55 is a top view of the bottom frame of the double receiver module in the connection interface system. As shown in FIG. 55, double bottom frame 488 includes the combination of two single bottom frames 414 which include the double sliding mechanism (see FIG. 54). Each of the single bottom frames 414 are connected together via screws 489 which secure adjacent supporting members 490, 491, of each of the bottom frames 414. Further, connection screws 492, 493 are provided for connecting main surfaces 461, 461' respectively to torsion shaft supports 450, 450' and adjacent supporting members 490, 491. Of course, the use of screws 489, 492 and 493 are only examples of the different types of connection means which may be used, and therefore, other types of connection means are contemplated and within the scope of the present invention.

Figure 56:
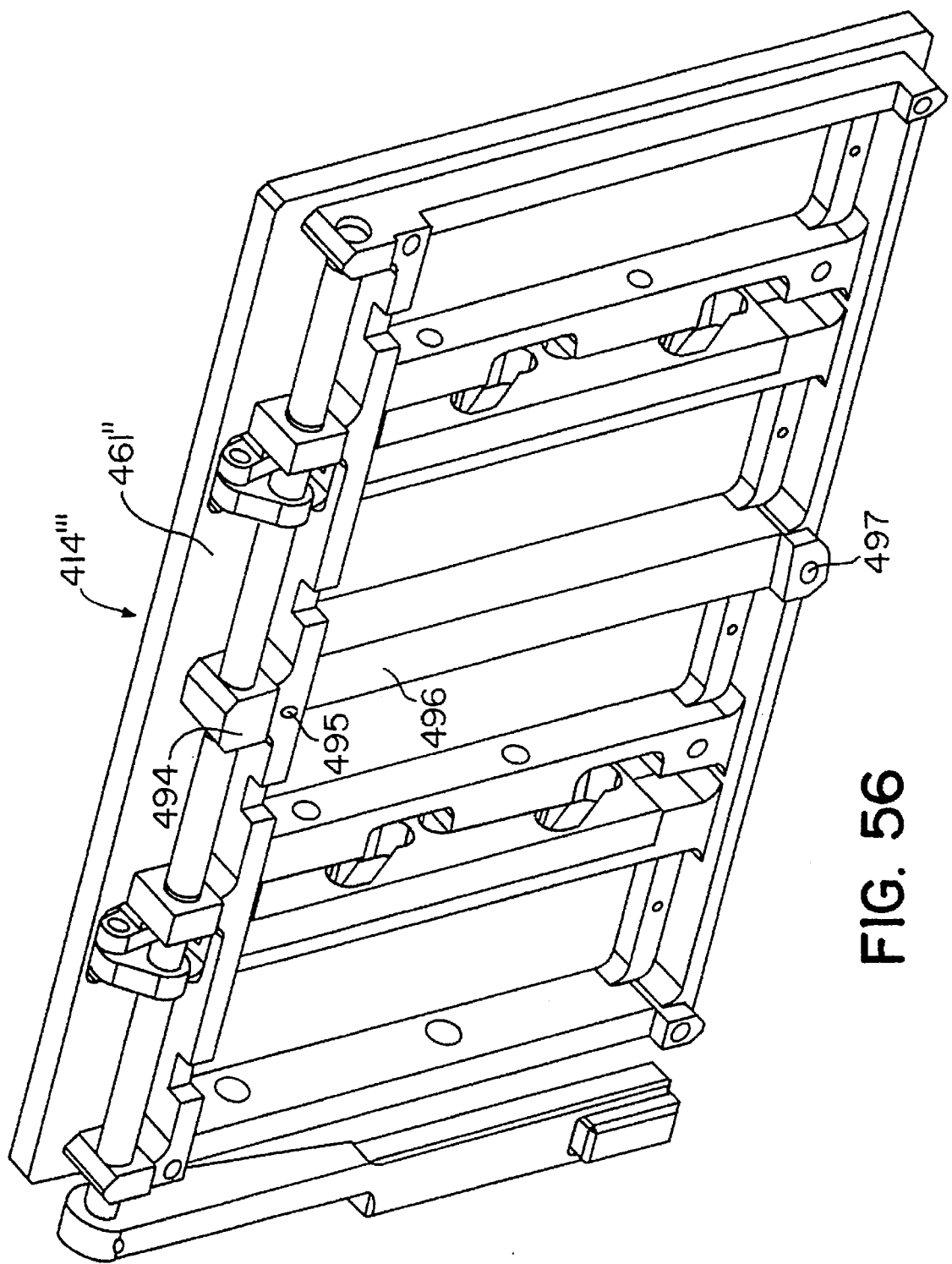
FIG. 56 is a top view of a second embodiment of the bottom frame of a double receiver module in the connector interface system.

FIG. 56 is a top view of a second embodiment of the bottom frame of the double receiver module in the connection interface system. As shown in FIG. 56, integrated bottom frame 414''' is similar to double bottom frame 488 discussed previously (see FIG. 55) with the following exceptions. Bottom frame 414''' includes an integrated main surface 461''. Integrated main surface 461'' includes integrated shaft stabilizer 494. In addition, a single integrated supporting member 496 is provided with connection screws 495, 497 which secure integrated shaft stabilizer 494 and supporting member 496 to the integrated main surface 461''. Of course, other minor variations of this structure may be utilized, and therefore, are considered to be within the scope of the present invention.

Figure 59:
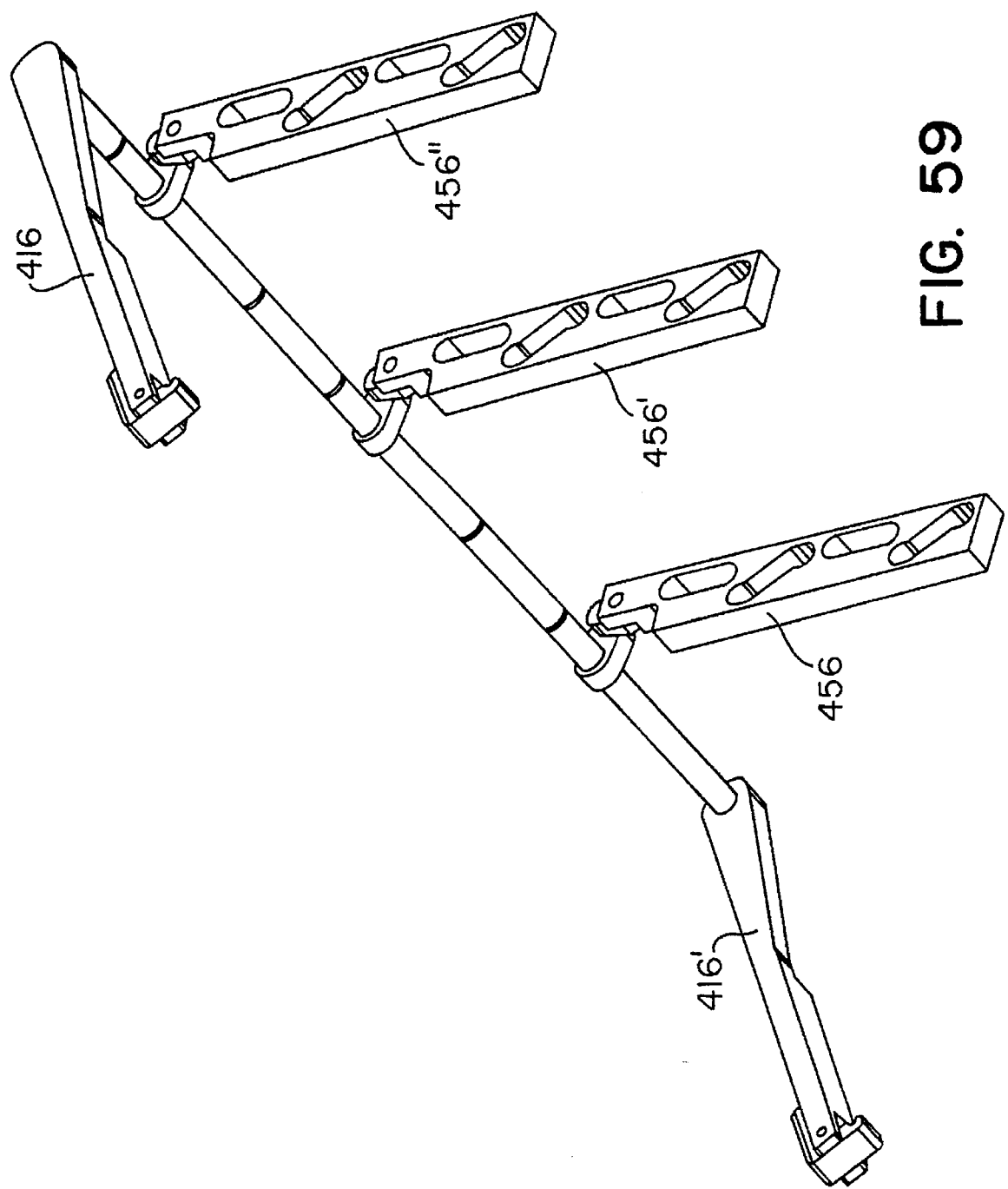
FIG. 59 is a detailed isometric view of the sliding mechanism for a triple receiver module in the connector interface system.

FIGS. 57 and 58 are respective top and side views of a triple receiver module in the connection interface system. As shown in FIGS. 57 and 58, triple receiver module 410''' includes a combination of three individual receiver modules 410. Individual receiver modules are connected together at junctions 486, 486' respectively. Triple receiver module 410''' preferably includes two handles, 416, 416' which are provided for engaging the triple receiver module with one or more interchangeable test adapters. Handles 416, 416' are used simultaneously. Remaining elements of triple receiver module 410''' have been previously discussed (see for example FIGS. 49–50). FIG. 59 is a detailed isometric view of the slide mechanism for triple receiver module 410'''. As shown in FIG. 59 two handles, 416, 416' are used to simultaneously actuate the three slides 456, 456' and 456''. Each of the slides are formed in a similar manner as discussed previously (see FIG. 39), and will not be discussed here in detail.

To fully appreciate the connection interface system, it must be realized that while each pair of contacts on the interchangeable test adaptor and receiver modules only require a few ounces of resistance for engagement, the multitude of contacts which must be engaged in the connection interface system creates a tremendous amount of resistance for opposing the interfacing of the two modules. Accordingly, one feature of the present invention is the slide mechanism described in the connection interface system. The slide mechanism affords a powerful, evenly applied distributed precision guided, engaging, locking and release mechanism which prevents damage to the delicate contacts. Since the slide mechanism provides precise engagement for the various electrical contacts, the electrical contacts have an increased life span, assuring optimum electrical continuity between the interchangeable test adaptor and receiver modules on a repetitive basis. Another feature in the connection interface system is the ability to couple the integrated test adaptor to the receiver in an easy and efficient manner. Further, another feature of the connection interface system is to maintain the relative positioning between the integrated test adaptor and the receiver while moving the receiver contacts to engage with the corresponding contacts on the integrated test adaptor. These above features, as well as additional features which have been previously described and need not be specified herein result from the specific structural and functional features and advantages of the connection interface system. For example, the following test results have been performed on connection interface system, illustrated in FIGS. 28–43:

| RESULTS | | |
| --- | --- | --- |
| CYCLES | HANDLE FORCE | MECHANICAL ENGAGMENT |
| 0 | 6½ TO 7 LBS. | .245/.250 |
| 1,956 | 6½ TO 7 LBS. | .245/.250 |
| 4,030 | 6 TO 6½ LBS. | .245/.250 |
| 6,000 | 6 TO 6½ LBS. | .245/.250 |
| 8,216 | 6 TO 6½ LBS. | .245/.250 |
| 10,015 | 6 TO 6½ LBS. | .245/.250 |
| 11,780 | 6 TO 6½ LBS. | .245/.250 |
| 14,188 | 6 TO 6½ LBS. | .245/.250 |
| 16,042 | 6 TO 6½ LBS. | .245/.250 |
| 18,100 | 6½ TO 7 LBS. | .245/.250 |
| 20,010 | 6½ TO 7 LBS. | .245/.250 |

CONCLUSION
THIS TEST COMPLETED THE ENGINEERING SPECIFICATION:
1) MECHANICAL TEST OF 20,000 CYCLES
2) HANDLE FORCE TO CLOSE ITA INTO RCVR. OF 7 LBS. MAXIMUM
3) FULL TRAVEL OF ITA ENGAGEMENT OF .230 MINIMUM

As clearly shown, the connection interface system firmly and evenly forces the electrical contacts of the interchangeable test adaptor into engagement with the contacts of the receiver module in a precisely guided, and repetitive manner.

Although the present invention has been described and illustrated in detail, it is clearly understood that the same is by way of illustration and example only and is not to be taken by way of limitation, the spirit and scope of the present invention being limited only by the terms of the appended claims.

While there have been described and illustrated several specific embodiments of the invention, it will be clear that variations in the details of the embodiments specifically illustrated and described may be made without departing from the true spirit and scope of the invention as defined in the appended claims.

We claim:

1. A receiver module in a connection interface system for positioning and engaging a receiver module assembly, said receiver module assembly having receiver electrical connectors therein, the receiver electrical connectors engagable with external electrical receiver connectors, said module comprising:

a top frame;

a bottom frame, movable with respect to said top frame and operatively connected thereto, said bottom frame including at least one of the receiver electrical connectors;

an engagement mechanism movably connected to said bottom frame and to said top frame and disposed therein, said engagement mechanism either slidably engaging or disengaging said bottom frame with said top frame in response to an external stimulus to one of engage and disengage said at least one of the receiver electrical connectors in said bottom frame to at least one of the external electrical connectors facing opposite thereto with respect to said top frame.

2. A receiver module in a connection interface system according to claim 1, wherein said bottom frame includes one of a first alignment pin and a first alignment hole, wherein said top frame includes one of a second alignment pin and a second alignment hole, and wherein when said bottom frame includes the first alignment pin and said top frame includes the second alignment hole, said engagement mechanism engages one of said first alignment pin in said second alignment hole, and when said bottom frame includes the first alignment hole and said top frame includes the second alignment pin, said engagement mechanism engages said second alignment pin in said first alignment hole.

3. A receiver module in a connection interface system according to claim 1, wherein said engagement mechanism comprises a slide traveling in a transverse direction in one of said top and bottom frames, said slide including a substantially rectangular guide member having transverse and diagonal cavities, said transverse cavity movably coupled to one of said top and bottom frames and said diagonal cavity movably coupled to another of said top and bottom frames.

4. A receiver module in a connection interface system according to claim 3, wherein said engagement mechanism coerces said another of said top and bottom frames to move closer to said one of said top and bottom frames when engaging said top and bottom frames.

5. A receiver module in a connection interface system according to claim 1, wherein said top frame includes a first slide support, and said bottom frame includes a second slide support, and wherein said first and second slide supports cooperate to reinforce said top and bottom frames and to guide said engagement mechanism.

6. A receiver module in a connection interface system according to claim 5, wherein said first slide support includes one of a slide projection and pocket, and said second slide support include another of a slide projection and pocket, and wherein said one of a slide projection and pocket and said another of a slide projection and pocket cooperate to reinforce said top and bottom frames and to guide said engagement mechanism.

7. A receiver module in a connection interface system according to claim 1, wherein one of said top and bottom frames includes a slide support, and wherein said slide support cooperates to reinforce the one of said top and bottom frames, and to guide said engagement mechanism when said top and bottom frames are engaged by said engagement mechanism.

8. A receiver module in a connection interface system according to claim 1, further comprising another receiver module coupled to the receiver module, said another receiver module including additional receiver electrical connectors engagable with additional external electrical connectors.

9. A receiver module in a connection interface system according to claim 1, wherein the at least one external electrical connector comprises a printed circuit board engagable with the receiver electrical connectors.

10. A receiver module in a connection interface system according to claim 9, wherein the printed circuit board comprises a device under test, and the receiver electrical connectors are connected to another printed circuit board.

11. A receiver module in a connection interface system according to claim 1, wherein the at least one external electrical connector comprises at least one of a printed circuit board and discrete electrical connectors engagable with the receiver electrical connectors.

12. A receiver module in a connection interface system according to claim 11, wherein the printed circuit board comprises a device under test, and the receiver electrical connectors are connected to at least one of another printed circuit board and other discrete electrical connectors.

13. A receiver module in a connection interface system for positioning and engaging a receiver module assembly, said receiver module assembly having receiver electrical connectors therein, the receiver electrical connectors engagable with external electrical connectors, said receiver module comprising:

a first frame;

a second frame, movable with respect to said first frame and operatively connected thereto, said second frame including at least one of the receiver electrical connectors; and engagement slide means, movably connected to said first frame and to said second frame, said engagement means for one of engaging and disengaging said first frame with said second frame in response to an external stimulus to either engage or disengage said at least one of the receiver electrical connectors in said bottom frame to at least one of the external electrical connectors facing opposite thereto with respect to said top frame.

14. A method of positioning and engaging first electrical connectors with second electrical connectors, said method comprising the steps of:

(a) mounting the first electrical connectors to a first frame;

(b) movably coupling a second frame to the first frame via an engagement slide mechanism;

(c) adjusting the second frame to be in proximity of the second electrical connectors not mounted to the second frame and facing opposite with respect to said second frame;

(d) slidably engaging the first and second frames via the engagement slide mechanism disposed between the first and second frames in response to an external stimulus to engage the first and second electrical connectors.

15. A connection interface system for positioning and electrically connecting a testing device to a device under test for the testing device to exercise and test the device under test, said connection interface system comprising:

a receiver module electrically connected to the testing device and including at least one receiver electrical connector, said receiver module including:

a top frame;

a bottom frame, movable with respect to said top frame and operatively connected thereto, said bottom frame including at least one receiver electrical connector;

an engagement mechanism movably connected to said bottom frame and to said top frame and disposed therein, said engagement mechanism either engaging or disengaging said bottom frame with said top frame in response to an external stimulus to one of engage and disengage said at least one receiver electrical connector in said bottom frame to at least one test electrical connector facing opposite thereto with respect to said top frame; and an integrated test adapter electrically connected to the device under test, coupled to said receiver module and including the at least one test electrical connector, wherein when said engagement mechanism engages said bottom frame to said top frame, the at least one test electrical connector electrically engages with the at least one receiver electrical connector permitting the testing device to at least one of exercise and test the device under test.

16. A receiver module in a connection interface system according to claim 15, further comprising another receiver module coupled to said receiver module, said another receiver module including additional receiver electrical connectors engagable with additional external electrical connectors.

17. A connection interface system according to claim 15, wherein said integrated test adapter includes a weight reducing pocket.

18. A connection interface system according to claim 15, wherein said integrated test adapter is coupled to said receiver module via bayonet mountings.

19. A connection interface system according to claim 15, wherein said bottom frame includes one of a first alignment pin and a first alignment hole, wherein said top frame includes one of a second alignment pin and a second alignment hole, and wherein when said bottom frame includes the first alignment pin and said top frame includes the second alignment hole, said engagement mechanism engages one of said first alignment pin in said second alignment hole, and when said bottom frame includes the first alignment hole and said top frame includes the second alignment pin, said engagement mechanism engages said second alignment pin in said first alignment hole.

20. A connection interface system according to claim 19, wherein said integrated test adapter includes a third alignment hole, and wherein said engagement mechanism engages one of said first alignment pin in said second and third alignment holes, and said second alignment pin in said first and third alignment holes when said bottom frame is engaged with said top frame.

21. In a connection interface system for positioning and electrically connecting a testing device to a device under test for the testing device to exercise and test the device under test, including a receiver module electrically connected to the device under test, the receiver module including a first frame, a second frame movable with respect to the first frame and an engagement mechanism movably connected to the first and second frames and engaging and disengaging the first frame with the second frame in response to an external stimulus and disposed between the first and second frames, and an integrated test adapter electrically connected to the testing device, a method of positioning and engaging first electrical connectors with second electrical connectors, comprising the steps of:

(a) mounting the first electrical connectors to the first frame;

(b) movably coupling the second frame to the first frame via the engagement mechanism;

(c) adjusting the second frame to be in proximity of the second electrical connectors mounted to the integrated test adapter and not mounted to the second frame, and the integrated test adapter facing opposite with respect to said second frame;

(d) engaging the first and second frames via the engagement mechanism in response to an external stimulus to engage the first and second electrical connectors; and (e) electrically engaging the testing device to the device under test by electrically engaging the first and second electrical connectors via the engagement of the first and second frames.

22. A receiver module in a connection interface system for positioning and engaging receiver electrical connectors with external electrical connectors, said receiver module comprising:

a top frame;

a bottom frame, movable with respect to said top frame and operatively connected thereto, said bottom frame including at least one of the receiver electrical connectors;

an engagement slide mechanism movably connected to said bottom frame and to said top frame, said engagement slide mechanism including first and second slots and first and second pins, the first and second pins respectively connected to said top and bottom frames and respectively camming in the first and second slots to either engage or disengage said engagement slide mechanism, said engagement slide mechanism either engaging or disengaging said bottom frame and said top frame in response to an external stimulus to one of engage and disengage said at least one of the receiver electrical connectors in said bottom frame to at least one of the external electrical connectors facing opposite thereto with respect to said top frame.

23. In a connection interface system for positioning and electrically connecting a testing device to a device under test for the testing device to exercise and test the device under test, including a receiver module electrically connected to the device under test and including at least one receiver electrical connector, the receiver module including a first connector, and an engagement mechanism engaging and disengaging the at least one receiver electrical connector in response to an external stimulus, an integrated test adapter comprising:

an outer frame;

at least one test adapter module assembly mounted to said outer frame, said at least one test adapter module assembly having at least one test adapter electrical connector mounted therein; and a second connector connected to said outer frame and engagable with the first connector on the receiver module prior to when the at least one receiver electrical connector is electrically engaged with the at least one test adapter electrical connector, wherein when said engagement mechanism engages the at least one receiver electrical connector, the at least one receiver electrical connector is electrically engaged with the at least one test adapter electrical connector, and wherein when said engagement mechanism disengages the at least one receiver electrical connector, the at least one receiver electrical connector is electrically disengaged with the at least one test adapter electrical connector.

24. An integrated test adapter according to claim 23, wherein said first and second connectors comprise bayonet connectors.

25. A receiver module in a connection interface system for positioning and engaging receiver electrical connectors with external electrical connectors, the external electrical connectors being in a stationary position with respect to the receiver electrical connectors immediately prior to engagement, said receiver module comprising:

a top frame;

a bottom frame, movable with respect to said top frame and operatively connected thereto, said bottom frame including at least one of the receiver electrical connectors;

an engagement slide mechanism movably connected to said bottom frame and to said top frame, said engagement slide mechanism either engaging or disengaging said bottom frame and said top frame in response to an external stimulus to move said at least one of the receiver electrical connectors in said bottom frame into engagement or disengagement with at least one of the external electrical connectors facing opposite thereto with respect to said top frame.

26. A receiver module in a connection interface system for positioning and engaging receiver electrical connectors with external electrical connectors, the external electrical connectors being in a stationary position with respect to the receiver electrical connectors immediately prior to engagement, said receiver module comprising:

a top frame;

a bottom frame, movable with respect to said top frame and operatively connected thereto, said bottom frame including at least one of the receiver electrical connectors;

an engagement slide mechanism movably connected to said bottom frame and to said top frame, said engagement slide mechanism either slidably engaging or slidably disengaging said bottom frame and said top frame in response to an external stimulus to move said at least one of the receiver electrical connectors in said bottom frame into engagement or disengagement with at least one of the external electrical connectors facing opposite thereto with respect to said top frame.

27. In a connection interface system for positioning and electrically connecting a testing device to a device under test for the testing device to exercise and test the device under test, including a receiver module electrically connected to the testing device and including at least one receiver electrical connector, the receiver module including a first connector, and an engagement slide mechanism engaging and disengaging the at least one receiver electrical connector in response to an external stimulus, an integrated test adapter comprising:

an outer frame;

at least one test adapter module assembly mounted to said outer frame, said at least one test adapter module assembly having at least one test adapter electrical connector mounted therein; and a second connector connected to said outer frame and engagable with the first connector on the receiver module prior to when the at least one receiver electrical connector is electrically engaged with the at least one test adapter electrical connector, wherein said engagement slide mechanism either engages or disengages the at least one receiver electrical connector, and the at least one receiver electrical connector being moved into engagement or disengagement with the at least one test adapter electrical connector facing opposite thereto and being substantially stationary therewith.

* * * * *

UNITED STATES PATENT AND TRADEMARK OFFICE
CERTIFICATE OF CORRECTION

PATENT NO. : 5,633,597
DATED : May 27, 1997
INVENTOR(S) : Jeffrey P. Stowers, et. al.

It is certified that error appears in the above-identified patent and that said Letters Patent is hereby corrected as shown below:

Title page, item [75], inventor's address should read--Waynesboro--.

Signed and Sealed this

Tenth Day of March, 1998

Attest:

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,633,597
DATED : May 27, 1997
INVENTOR(S) : Jeffery P. Stowers, Paul D. Blackard, Randall C. Garman It is certified that error appears in the above-identified patent and that said Letters Patent is hereby corrected as shown below:

ON THE TITLE PAGE:

Item [75] Inventors: Jeffrey P. Stowers, Stanton; Paul D. Blackard, Waynesboro; Randall C. Garman, Waynesboro, all of Va.

Signed and Sealed this

Twelfth Day of May, 1998

Attest:

BRUCE LEHMAN

Attesting Officer        Commissioner of Patents and Trademarks